(12) United States Patent
Los et al.

(10) Patent No.: US 11,310,934 B2
(45) Date of Patent: Apr. 19, 2022

(54) MULTI-CHANNEL COOLING FOR EXTENDED DISTANCE WIRELESS POWER TRANSMITTER

(71) Applicant: NuCurrent, Inc., Chicago, IL (US)

(72) Inventors: Oleg Los, Buffalo Grove, IL (US); Md Nazmul Alam, Lombard, IL (US)

(73) Assignee: NuCurrent, Inc., Chicago, IL (US)

( * ) Notice: Subject to any disclaimer, the term of this patent is extended or adjusted under 35 U.S.C. 154(b) by 0 days.

(21) Appl. No.: 16/863,710

(22) Filed: Apr. 30, 2020

(65) Prior Publication Data
US 2021/0345520 A1 Nov. 4, 2021

(51) Int. Cl.
| | | |
|---|---|---|
| H05K 7/20 | (2006.01) |
| H05K 5/02 | (2006.01) |
| H01F 27/24 | (2006.01) |
| H02J 50/70 | (2016.01) |
| H02J 50/00 | (2016.01) |
| H01F 38/14 | (2006.01) |
| H02J 50/40 | (2016.01) |
| H02J 50/12 | (2016.01) |

(52) U.S. Cl.
CPC ......... *H05K 7/20145* (2013.01); *H01F 27/24* (2013.01); *H01F 38/14* (2013.01); *H02J 50/005* (2020.01); *H02J 50/12* (2016.02); *H02J 50/402* (2020.01); *H02J 50/70* (2016.02); *H05K 5/0213* (2013.01); *H05K 7/20172* (2013.01); *H05K 7/20863* (2013.01); *H05K 7/20909* (2013.01)

(58) Field of Classification Search
None
See application file for complete search history.

(56) References Cited

U.S. PATENT DOCUMENTS

| | | | |
|---|---|---|---|
| 9,912,187 B2 | 3/2018 | Sultenfuss et al. |
| 10,410,789 B2 | 9/2019 | Kurs |
| 2004/0261422 A1* | 12/2004 | McEuen ............... G06F 1/1626 62/3.2 |
| 2005/0068019 A1 | 3/2005 | Nakamura et al. |

(Continued)

FOREIGN PATENT DOCUMENTS

| | | |
|---|---|---|
| WO | 2014092339 A1 | 6/2014 |
| WO | 2015064815 A1 | 5/2015 |
| WO | 2019148070 A2 | 8/2019 |

OTHER PUBLICATIONS

PCT/US2021/030315 International Search Report and Written Opinion, dated Aug. 20, 2021, 11 pages.

*Primary Examiner* — Daniel Kessie
(74) *Attorney, Agent, or Firm* — Lee Sullivan Shea & Smith LLP

(57) ABSTRACT

A power transmitter includes a transmitter antenna includes at least one coil configured to transmit the power signal to the power receiver, the at least one coil and a shielding comprising a ferrite core and defining a cavity, the cavity configured such that the ferrite core substantially surrounds all but the top face of the at least one coil. The power transmitter includes a housing configured for housing, at least, the transmitter antenna. The housing defines an airflow opening configured to provide an airflow to a first airflow channel and to a second airflow channel. The first and second airflow channels configured to provide the airflow to one or more of a top face of a mobile device thereon and a bottom face of the mobile device.

20 Claims, 31 Drawing Sheets

(56) References Cited

U.S. PATENT DOCUMENTS

| | | |
|---|---|---|
| 2005/0288743 A1 | 12/2005 | Ahn et al. |
| 2006/0209487 A1 | 9/2006 | Schmidt et al. |
| 2011/0018498 A1 | 1/2011 | Soar |
| 2011/0062793 A1 | 3/2011 | Azancot et al. |
| 2012/0217111 A1 | 8/2012 | Boys et al. |
| 2013/0058380 A1 | 3/2013 | Kim et al. |
| 2013/0069586 A1 | 3/2013 | Jung et al. |
| 2013/0082536 A1 | 4/2013 | Taylor et al. |
| 2013/0162201 A1 | 6/2013 | Yeh |
| 2013/0169062 A1 | 7/2013 | Maikawa et al. |
| 2013/0307468 A1* | 11/2013 | Lee ............ H02J 50/80 320/108 |
| 2014/0239732 A1 | 8/2014 | Mach et al. |
| 2014/0354223 A1 | 12/2014 | Lee et al. |
| 2015/0091389 A1 | 4/2015 | Byrne et al. |
| 2015/0214752 A1 | 7/2015 | Gluzman et al. |
| 2015/0222129 A1 | 8/2015 | McCauley et al. |
| 2015/0270776 A1 | 9/2015 | Mallik et al. |
| 2015/0333532 A1 | 11/2015 | Han et al. |
| 2016/0006289 A1 | 1/2016 | Sever et al. |
| 2016/0118179 A1 | 4/2016 | Park et al. |
| 2017/0090531 A1* | 3/2017 | Forbes ............ G06F 1/1632 |
| 2017/0129344 A1 | 5/2017 | Islinger et al. |
| 2017/0245679 A1 | 8/2017 | Watts |
| 2017/0288465 A1 | 10/2017 | Sugasawa et al. |
| 2017/0331335 A1 | 11/2017 | Brooks et al. |
| 2017/0368945 A1* | 12/2017 | Park ............ H02J 7/00308 |
| 2018/0277926 A1 | 9/2018 | Park et al. |
| 2019/0267845 A1 | 8/2019 | Maniktala |
| 2019/0384603 A1 | 12/2019 | Kim et al. |
| 2019/0394906 A1* | 12/2019 | Smith ............ H02J 50/10 |
| 2020/0094700 A1 | 3/2020 | Hui |
| 2020/0177028 A1 | 6/2020 | Esteban et al. |
| 2020/0373072 A1 | 11/2020 | Leem |
| 2021/0075255 A1* | 3/2021 | Nutting ............ H02J 50/005 |
| 2021/0159736 A1 | 5/2021 | Miyamoto et al. |
| 2021/0296999 A1 | 9/2021 | Taleb et al. |
| 2021/0354577 A1 | 11/2021 | Books et al. |

\* cited by examiner

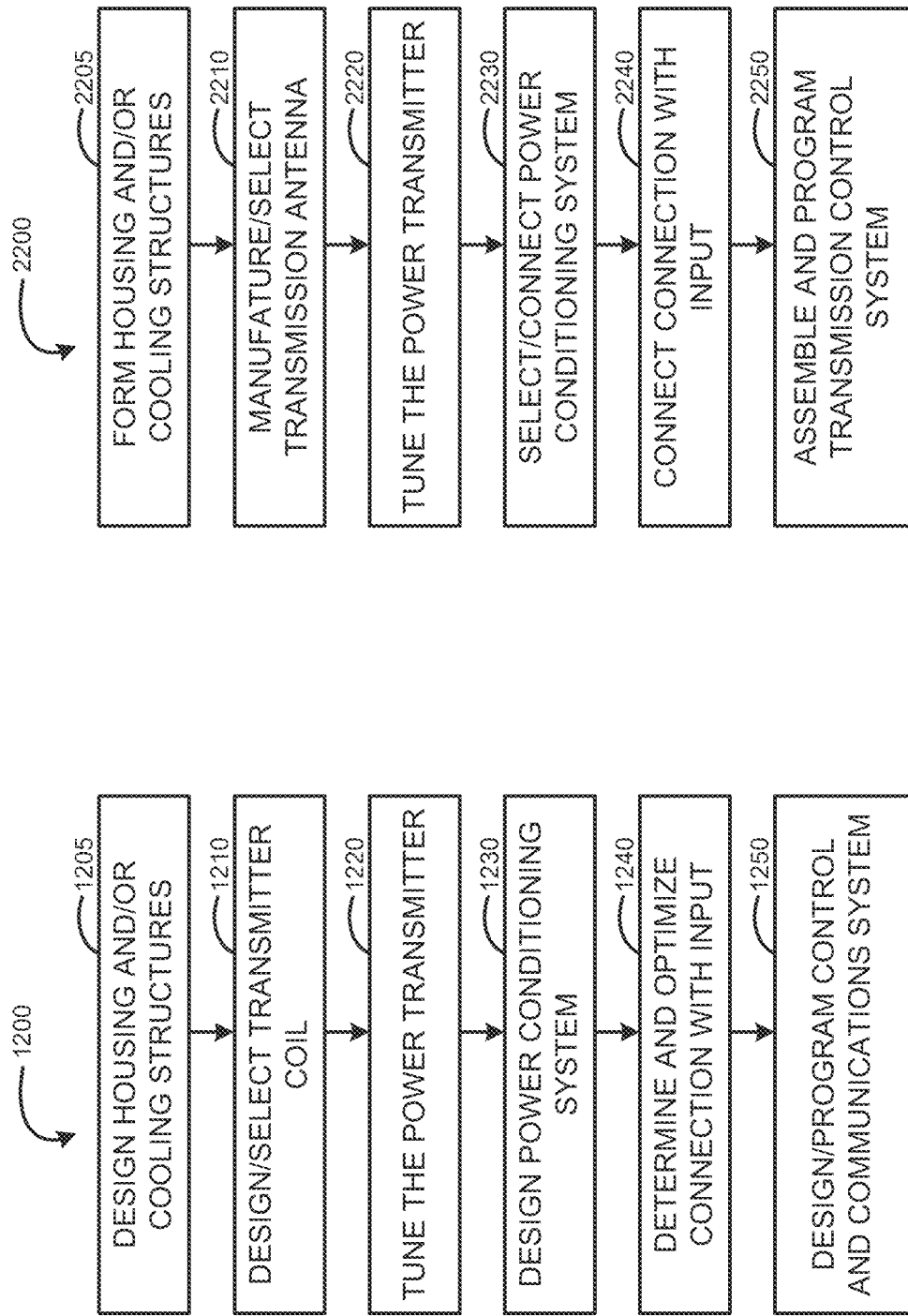

MULTI-CHANNEL COOLING FOR EXTENDED DISTANCE WIRELESS POWER TRANSMITTER

TECHNICAL FIELD

The present disclosure generally relates to systems and methods for wireless transfer of electrical power and, more particularly, to wireless power transmitters for transmitting power at extended separation distances with multi-channel cooling.

BACKGROUND

Wireless power transfer systems are used in a variety of applications for the wireless transfer of electrical energy, electrical power signals, electromagnetic energy, electrical data signals, among other known wirelessly transmittable signals. Such systems often use inductive wireless power transfer, which occurs when magnetic fields created by a transmitting element induce an electric field, and hence, an electric current, in a receiving element. These transmission and receiver elements will often take the form of coiled wires and/or antennas.

Because some wireless power transfer systems are operable and/or most efficient in the near-field, some transmitters may be limited to having operability only at restrictively small gaps between the transmitter coil and the receiver coil. To that end, typical wireless power transmitters under the Wireless Power Consortium's Qi™ standard may be limited to operability at a maximum coil-to-coil separation gap (which may be referred to herein as a "separation gap" or "gap") of about 3 millimeters (mm) to about 5 mm. The separation gap is sometimes known as the Z-height or Z-distance and is generally measured as the distance between the transmitter coil and receiver coil.

As the adoption of wireless power grows, commercial applications are requiring a power transmitter capable of transferring power to a power receiver with a gap greater than 3-5 mm. By way of example, cabinets and/or counter tops may be more than 3-5 mm thick and as a result, prevent wireless charging through such furniture. As another example, modern mobile devices may be used with cases, grip devices, and/or wallets, among other things, that can obstruct wireless power transmission to the mobile device and/or create a separation gap that disallows operability of wireless power transmission. Legacy wireless power transmitter designs further may be incapable of desired commercial applications (e.g., through object chargers, under table chargers, infrastructure chargers, ruggedized computing device charging, among other things), due to the limitations in separation gap inherent to legacy, near-field wireless power transfer systems. Increasing the separation gap, while keeping satisfactory performance (e.g., thermal performance, transfer/charging speed, efficiency, etc.) will increase the number of commercial applications that can utilize wireless power.

SUMMARY

New wireless power transmitters and/or associated base stations are desired that are capable of delivering wireless power signals to a power receiver at a separation gap larger than the about 3 mm to about 5 mm separation gaps of legacy transmitters. Further, to mitigate any heating issues that may occur due to an increased power and/or an associated increase in separation gap, new systems, methods, and apparatus for mitigating such potential heating issues are desired.

In an embodiment, the overall structure of the transmitter is configured in a way that allows the transmitter to transfer power at an operating frequency of about 87 kilohertz (kHz) to about 205 kHz and achieve the same and/or enhanced relative characteristics (e.g., rate of power transfer, speed of power transfer, power level, power level management, among other things) of power transfer as legacy transmitters that operated in that frequency range. As a result, the separation gap may be increased from about 3-5 mm to around 15 mm or greater, in comparison to legacy designs for power transmitters. In an embodiment, a transmitter assembly may be configured with a ferrite core that substantially surrounds the transmitter antenna on three sides. The only place that the ferrite core does not surround the transmitter antenna is on the top (e.g., in the direction of power transfer) and where the power lines connect to the transmitter antenna. This overall structure of the transmitter allows for the combination of power transfer characteristics, power level characteristics, self-resonant frequency restraints, design requirements, adherence to standards bodies' required characteristics, bill of materials (BOM) and/or form factor constraints, among other things, that allow for power transfer over larger separation gaps.

Transmission of one or more of electrical energy, electrical power, electromagnetic energy or electronic data signals from one of such coiled antennas to another, generally, operates at an operating frequency and/or an operating frequency range. The operating frequency may be selected for a variety of reasons, such as, but not limited to, power transfer characteristics, power level characteristics, self-resonant frequency restraints, design requirements, adherence to standards bodies' required characteristics, bill of materials (BOM) and/or form factor constraints, among other things. It is to be noted that, "self-resonating frequency," as known to those having skill in the art, generally refers to the resonant frequency of an inductor due to the parasitic characteristics of the component.

Additionally, in some embodiments of the present disclosure, a housing is provided that includes two or more airflow openings and/or channels configured for providing airflow to an electronic device when it is being powered and/or charged by the wireless power transmitters disclosed herein. By utilizing the housings disclosed herein, multiple cooling and/or airflow channels may be utilized in mitigating any thermal issues associated with wireless power transmission via the wireless power transmitter. Such thermal issues may include, but are not limited to including, heating of the wireless power transmitter, heating of components of the wireless power transmitter, heating of a housing operatively associated with the wireless power transmitter, heating of a mobile device caused from wireless power transmission, heating of a mobile device caused by the mobile device, heating of an enclosure of a mobile device, heating of materials proximate to the systems, or any combinations thereof. Such housings may allow for higher power wireless transmission, which may allow for faster wireless charging of a mobile device, when compared to legacy devices, while also maintaining a greater separation gap and/or Z-distance, in comparison to legacy wireless power transmitters.

A vehicle may be a machine that transports people and/or cargo. Exemplary vehicles include automobiles such as cars, trucks, buses, and other land vehicles. Other examples of vehicles may include airplanes, boats, golf carts, small industrial vehicles, farming equipment, construction equipment, nautical vehicles, mixed use vehicles, recreational vehicles, sport vehicles, public transportation vehicles, and trains. Vehicular power sources introduce challenges for designing wireless power transmitters, because the input power is susceptible to one or more of power surges, transients, and electrostatic discharge (ESD), among other things, which may cause damage and/or disfunction in one or both of a power transmitter and the power source system, itself. To that end, a single transient voltage spike has potential to damage and/or disrupt components of the power transmitter's electrical circuitry. Additionally or alternatively, electrical noise produced by a vehicular power source, even that of relatively low energy, can cause significant interruption to digital communications.

In an embodiment, a vehicle includes a vehicular power input regulator that is configured to receive input power and filter the input power to a filtered input power. The vehicular power input regulator includes an input protection circuit, and a DC/DC voltage converter. An inverter circuit receives the filtered input power and converting the filtered input power to a power signal. This power signal is provided to a high Z wireless charger. As such, because of the configuration of the vehicular power input regulator, the vehicular power sources are protected against power surges, transients, and electrostatic discharge.

In accordance with one aspect of the disclosure, a power transmitter for wireless power transfer to a mobile device having a power receiver couplable with the power transmitter, the mobile device defining, at least, a mobile device front surface and a mobile device rear surface. The power transmitter includes a control and communications unit, an inverter circuit configured to receive input power and convert the input power to a power signal, a transmitter antenna, and a housing. The transmitter antenna includes at least one coil configured to transmit the power signal to the power receiver, the at least one coil formed of wound Litz wire and including at least one layer and a shielding comprising a ferrite core and defining a cavity, the cavity configured such that the ferrite core substantially surrounds all but the top face of the at least one coil. The housing is configured for housing, at least, the transmitter antenna and defines a forward surface, configured for placement of the mobile device for wireless power transfer, an airflow opening configured to provide an airflow, a first airflow channel configured to provide at least some of the airflow, via fluid communication with the airflow opening, proximate to one or more of the forward surface or the mobile device rear surface, a protrusion extending outward, at least in part, from the forward surface, the protrusion having a protrusion top face, the protrusion top face forming an angle with the forward face, the angle being less than about 180 degrees and greater than about 0 degrees, and a second airflow channel configured to provide at least some of the airflow, via fluid communication with the airflow opening, proximate to one or more of the protrusion top face, the mobile device top surface, and any combinations thereof.

In a refinement, the power transmitter further includes a fan configured to provide at least some of the airflow to the airflow opening and the housing further defines a fan cavity configured to house, at least, the fan and the fan cavity is in fluid communication with, at least, the airflow opening, to provide the at least some of the airflow to the airflow opening.

In a refinement, the housing further defines a back surface, wherein a thickness for the housing is defined between the forward surface and the back surface and wherein the first airflow channel includes a first airflow channel cavity, the first airflow channel cavity being a cavity extending, at least in part, about the thickness.

In a further refinement, the first airflow channel further includes a first channel opening, the first channel opening in fluid communication with, at least, the airflow opening, the first channel opening configured to provide at least some of the airflow from the airflow opening to one or more of the first airflow channel cavity or the rear surface of the mobile device.

In yet a further refinement, the first channel opening is defined as a first protrusion opening in the protrusion top face, the first protrusion opening in fluid communication with, at least, the airflow opening.

In another further refinement, the first airflow channel further includes at least one vent in fluid communication with the first airflow channel cavity, the at least one vent configured to mitigate heat from the mobile device rear surface.

In yet a further refinement, the at least one vent opens to an environment external to the housing and is configured to facilitate one or more of entry or exit, for an external airflow, to the housing.

In another further refinement, the first airflow channel cavity is configured to mechanically receive a mechanical body associated with the mobile device, wherein receipt of the mechanical body, at least in part, aligns the transmitter antenna with a receiver antenna of the mobile device, for the purposes of wireless power transfer and the mechanical body is one or more of a mechanical feature of the mobile device, a peripheral associated with the mobile device, a removable feature associated with the mobile device, or any combinations thereof.

In a refinement, the second airflow channel includes a second channel opening, the second channel opening in fluid communication with, at least, the airflow opening, the second channel opening configured to provide at least some of the airflow from the airflow opening to the mobile device front surface.

In a refinement, the housing further defines a housing base structure and a housing stand structure, the housing stand structure includes the forward surface and a back surface, the forward surface and back surface being separated by a housing stand structure thickness, the housing base structure includes a top surface and a bottom surface, the top surface and the bottom surface being separated by a housing base structure thickness, the housing stand structure and the housing base structure are respectively positioned such that an angle is formed, at least in part, by a first portion of the back surface and a second portion of the top surface, and the angle is greater than about 0 degrees and less than about 180 degrees.

In a refinement, the angle is configured such that, when the mobile device is placed adjacent to the forward surface, the mobile device front surface is in a proper viewing angle with respect to a user of the mobile device.

In accordance with another aspect of the disclosure, a power transmitter for wireless power transfer to a mobile device having a power receiver couplable with the power transmitter, the mobile device defining, at least, a mobile device front surface and a mobile device rear surface. The power transmitter includes a control and communications unit, an inverter circuit configured to receive input power and convert the input power to a power signal, a transmitter antenna, and a housing. The transmitter antenna includes at least one coil configured to transmit the power signal to the power receiver, the at least one coil formed of wound Litz wire and including at least one layer and a shielding comprising a ferrite core and defining a cavity, the cavity configured such that the ferrite core substantially surrounds all but the top face of the at least one coil. The housing is configured for housing, at least, the transmitter antenna and defines a top surface, upon which the mobile device is placed for wireless power transfer, a bottom surface, wherein a housing thickness is, at least in part, defined between the top surface and the bottom surface. The housing further defines an airflow opening configured to provide an airflow, a first airflow channel configured to provide at least some of the airflow, via fluid communication with the airflow opening, proximate to one or more of the forward surface or the mobile device rear surface, a protrusion extending outward, at least in part, from the forward surface, the protrusion having a protrusion top face, the protrusion top face forming an angle with the forward face, the angle being less than about 180 degrees and greater than about 0 degrees, and a second airflow channel configured to provide at least some of the airflow, via fluid communication with the airflow opening, proximate to one or more of the protrusion top face, the mobile device top surface, and any combinations thereof.

In a refinement, the airflow opening is configured for fluid communication with an external airflow source, the external airflow source providing at least some of the airflow to the airflow opening.

In a further refinement, the external airflow source is an airflow source operatively associated with a vehicle.

In a refinement, the power transmitter further includes a fan configured for providing at least some of the airflow to the airflow opening and the housing is further defining a fan cavity for housing, at least, the fan and the fan cavity is in fluid communication with, at least, the airflow opening, for providing the at least some of the airflow to the airflow opening.

In a refinement, the first airflow channel includes a first airflow channel cavity, the first airflow cavity being a cavity extending, at least in part, along the housing thickness, from the top surface and towards the bottom surface.

In a further refinement, the first airflow channel further includes a first channel opening, the first channel opening in fluid communication with, at least, the airflow opening, the first channel opening providing at least some of the airflow from the airflow opening to one or more of the first airflow channel cavity, the rear surface of the mobile device, and combinations thereof.

In another further refinement, the first channel opening is defined as a first protrusion opening in the protrusion top face, the first protrusion opening in fluid communication with, at least, the airflow opening.

In accordance with yet another aspect of the disclosure, a power transmitter for wireless power transfer to a mobile device having a power receiver couplable with the power transmitter, the mobile device defining, at least, a mobile device front surface and a mobile device rear surface. The power transmitter includes a control and communications unit, an inverter circuit configured to receive input power and convert the input power to a power signal, a transmitter antenna, and a housing. The transmitter antenna includes a transmitter coil array including a top face and two or more transmitter coils, the two or more transmitter coils configured to transmit the power signal to the power receiver, the two or more transmitter coils formed of wound Litz wire and including at least one layer and a shielding comprising a ferrite core and defining a cavity, the cavity configured such that the ferrite core substantially surrounds all but the top face of the at least one coil. The housing is configured for housing, at least, the transmitter antenna and defines a top surface, upon which the mobile device is placed for wireless power transfer, a bottom surface, wherein a housing thickness is, at least in part, defined between the top surface and the bottom surface. The housing further defines an airflow opening configured to provide an airflow, a first airflow channel configured to provide at least some of the airflow, via fluid communication with the airflow opening, proximate to one or more of the forward surface or the mobile device rear surface, a protrusion extending outward, at least in part, from the forward surface, the protrusion having a protrusion top face, the protrusion top face forming an angle with the forward face, the angle being less than about 180 degrees and greater than about 0 degrees, and a second airflow channel configured to provide at least some of the airflow, via fluid communication with the airflow opening, proximate to one or more of the protrusion top face, the mobile device top surface, and any combinations thereof.

In a refinement, the ferrite core includes an exterior wall for surrounding the exterior diameters of each of the two or more transmitter coils and one or more ferrite inner cores occupying space in between Litz wire of the two or more coils within one or more interior diameters of each of the two or more transmitter coils.

These and other aspects and features of the present disclosure will be better understood when read in conjunction with the accompanying drawings.

BRIEF DESCRIPTION OF THE DRAWINGS

FIG. 25 is a flow chart for an exemplary method for designing a power transmitter, in accordance with FIGS. 1-24 and the present disclosure.

FIG. 26 is a flow chart for an exemplary method for manufacturing a power transmitter, in accordance with FIGS. 1-24 and the present disclosure.

While the following detailed description will be given with respect to certain illustrative embodiments, it should be understood that the drawings are not necessarily to scale and the disclosed embodiments are sometimes illustrated diagrammatically and in partial views. In addition, in certain instances, details which are not necessary for an understanding of the disclosed subject matter or which render other details too difficult to perceive may have been omitted. It should therefore be understood that this disclosure is not limited to the particular embodiments disclosed and illustrated herein, but rather to a fair reading of the entire disclosure and claims, as well as any equivalents thereto. Additional, different, or fewer components and methods may be included in the systems and methods.

DETAILED DESCRIPTION

In the following description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Figure 1:
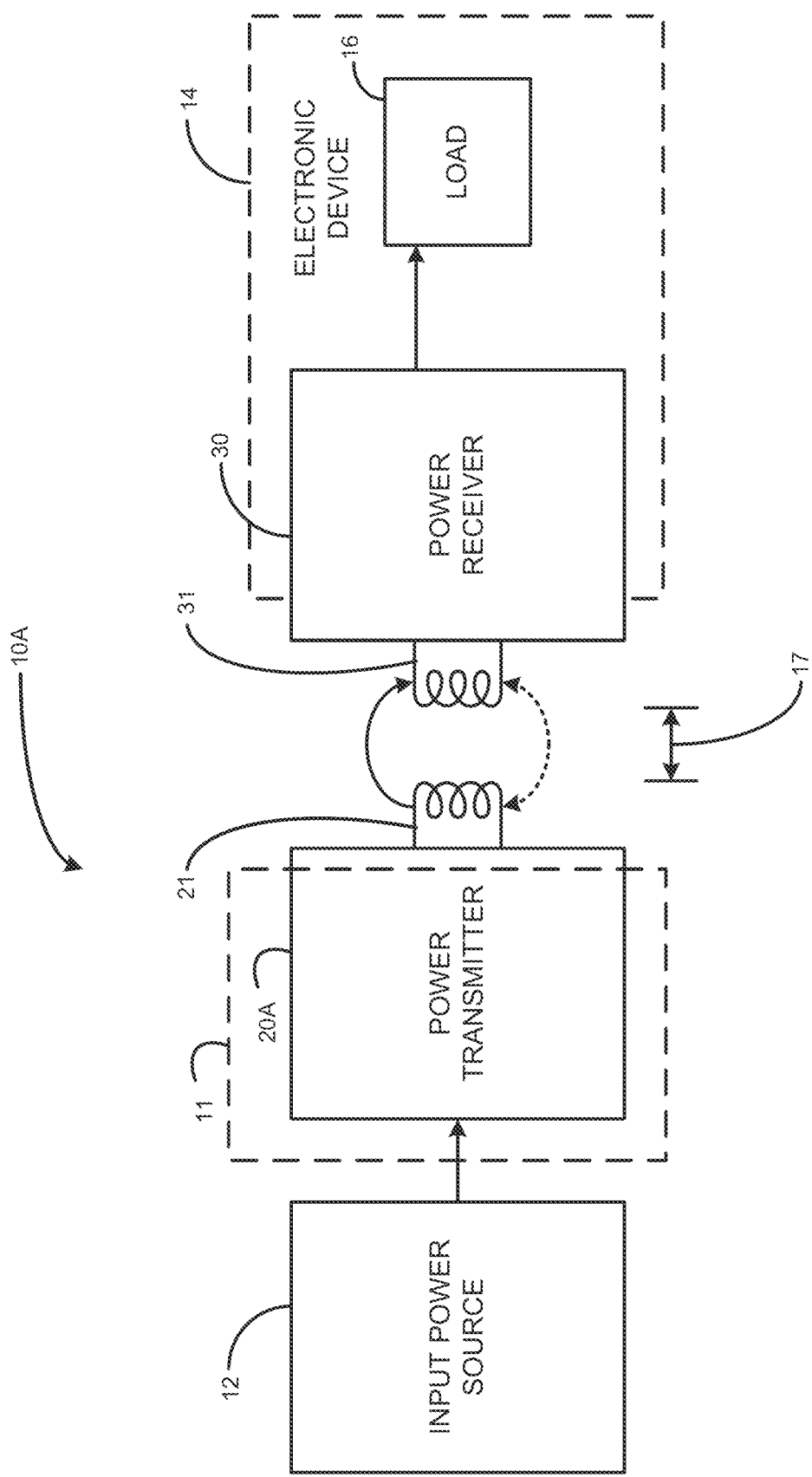
FIG. 1 is an exemplary block diagram of an embodiment of a wireless power transfer system, in accordance with an embodiment of the present disclosure.

Referring now to the drawings and with specific reference to FIG. 1, a wireless power transfer system 10A is illustrated. The wireless power transfer system 10A provides for the wireless transmission of electrical signals, such as, but not limited to, electrical energy, electrical power signals, and electromagnetic energy. Additionally, the wireless power transfer system 10A may provide for wireless transmission of electronically transmittable data ("electronic data") independent of and/or associated with the aforementioned electrical signals. Specifically, the wireless power transfer system 10A provides for the wireless transmission of electrical signals via near field magnetic coupling. As shown in the embodiment of FIG. 1, the wireless power transfer system 10 includes a power transmitter 20A and a power receiver 30. The power receiver 30 is configured to receive electrical energy, electrical power, electromagnetic energy, and/or electronic data from, at least, the power transmitter 20A.

As illustrated, the power transmitter 20A and power receiver 30 may be configured to transmit electrical energy, via transmitter antenna 21 and receiver antenna 31, electrical power, electromagnetic energy, and/or electronically transmittable data across, at least, a separation distance or gap 17. A separation distance or gap, such as the gap 17, in the context of a wireless power transfer system, such as the system 10, does not include a physical connection, such as a wired connection. There may be intermediary objects located in a separation distance or gap, such as the gap 17, such as, but not limited to, air, a counter top, a casing for an electronic device, a grip device for a mobile device, a plastic filament, an insulator, a mechanical wall, among other things; however, there is no physical, electrical connection at such a separation distance or gap.

The combination of the power transmitter 20A and the power receiver 30 create an electrical connection without the need for a physical connection. "Electrical connection," as defined herein, refers to any facilitation of a transfer of an electrical current, voltage, and/or power from a first location, device, component, and/or source to a second location, device, component, and/or destination. An "electrical connection" may be a physical connection, such as, but not limited to, a wire, a trace, a via, among other physical electrical connections, connecting a first location, device, component, and/or source to a second location, device, component, and/or destination. Additionally or alternatively, an "electrical connection" may be a wireless electrical connection, such as, but not limited to, magnetic, electromagnetic, resonant, and/or inductive field, among other wireless electrical connections, connecting a first location, device, component, and/or source to a second location, device, component, and/or destination.

Alternatively, the gap 17 may be referenced as a "Z-Distance," because, if one considers an antenna 21, 31 to be disposed substantially along a common X-Y plane, then the distance separating the antennas 21, 31 is the gap in a "Z" or "depth" direction. However, flexible and/or non-planar coils are certainly contemplated by embodiments of the present disclosure and, thus, it is contemplated that the gap 17 may not be uniform, across an envelope of connection distances between the antennas 21, 31. It is contemplated that various tunings, configurations, and/or other parameters may alter the possible maximum distance of the gap 17, such that electrical transmission from the power transmitter 20 to the power receiver 30 remains possible.

The wireless power transfer system 10A operates when the power transmitter 20 and the power receiver 30 are coupled. As defined herein, the terms "couples," "coupled," and "coupling" generally refers to magnetic field coupling, which occurs when the energy of a transmitter and/or any components thereof and the energy of a receiver and/or any components thereof are coupled to each other through a magnetic field. Coupling of the power transmitter 20 and the power receiver 30, in the system 10A, may be represented by a resonant coupling coefficient of the system 10A and, for the purposes of wireless power transfer, the coupling coefficient for the system 10A may be in the range of about 0.01 and 0.9.

The power transmitter 20A may be operatively associated with a base station 11. The base station 11 may be a device, such as a charger, that is able to provide near-field inductive power, via the power transmitter 20, to a power receiver. In some examples, the base station 11 may be configured to provide such near-field inductive power as specified in the Qi™ Wireless Power Transfer System, Power Class 0 Specification. In some such examples, the base station 11 may carry a logo to visually indicate to a user that the base station 11 complies with the Qi™ Wireless Power Transfer System, Power Class 0 Specification.

The power transmitter 20A may receive power from an input power source 12. The base station 11 may be any electrically operated device, circuit board, electronic assembly, dedicated charging device, or any other contemplated electronic device. Example base stations 11, with which the power transmitter 20A may be associated therewith, include, but are not limited to including, a device that includes an integrated circuit, cases for wearable electronic devices, receptacles for electronic devices, a portable computing device, clothing configured with electronics, storage medium for electronic devices, charging apparatus for one or multiple electronic devices, dedicated electrical charging devices, activity or sport related equipment, goods, and/or data collection devices, among other contemplated electronic devices.

The input power source 12 may be or may include one or more electrical storage devices, such as an electrochemical cell, a battery pack, and/or a capacitor, among other storage devices. Additionally or alternatively, the input power source 12 may be any electrical input source (e.g., any alternating current (AC) or direct current (DC) delivery port) and may include connection apparatus from said electrical input source to the wireless transmission system 20A (e.g., transformers, regulators, conductive conduits, traces, wires, or equipment, goods, computer, camera, mobile phone, and/or other electrical device connection ports and/or adaptors, such as but not limited to USB or lighting ports and/or adaptors, among other contemplated electrical components).

Electrical energy received by the power transmitter 20A is then used for at least two purposes: providing electrical power to internal components of the power transmitter 20 and providing electrical power to the transmitter coil 21. The transmitter coil 21 is configured to wirelessly transmit the electrical signals conditioned and modified for wireless transmission by the power transmitter 20 via near-field magnetic coupling (NFMC). Near-field magnetic coupling enables the transfer of electrical energy, electrical power, electromagnetic energy, and/or electronically transmissible data wirelessly through magnetic induction between the transmitter coil 21 and a receiving coil 31 of, or associated with, the power receiver 30. Near-field magnetic coupling may enable "inductive coupling," which, as defined herein, is a wireless power transmission technique that utilizes an alternating electromagnetic field to transfer electrical energy between two or more antennas/coils. Such inductive coupling is the near field wireless transmission of electrical energy between two magnetically coupled coils that are tuned to resonate at a similar frequency. Further, such near-field magnetic coupling may provide connection via "mutual inductance," which, as defined herein is the production of an electromotive force in a circuit by a change in current in at least one circuit magnetically coupled to the first.

In one or more embodiments, the inductor coils of either the transmitter coil 21 or the receiver coil 31 are strategically positioned to facilitate reception and/or transmission of wirelessly transferred electrical energy, power, electromagnetic energy and/or data through near field magnetic induction. Antenna operating frequencies may comprise all operating frequency ranges, examples of which may include, but are not limited to, about 87 kHz to about 205 kHz (Qi™ interface standard). The operating frequencies of the coils 21, 31 may be operating frequencies designated by the International Telecommunications Union (ITU) in the Industrial, Scientific, and Medical (ISM) frequency bands.

As known to those skilled in the art, a "resonant frequency" or "resonant frequency band" refers to a frequency or frequencies wherein amplitude response of the antenna is at a relative maximum, or, additionally or alternatively, the frequency or frequency band where the capacitive reactance has a magnitude substantially similar to the magnitude of the inductive reactance. In one or more embodiments the transmitting antenna resonant frequency band extends from about 87 kHz to about 205 kHz. In one or more embodiments the inductor coil of the receiver coil 31 is configured to resonate at a receiving antenna resonant frequency or within a receiving antenna resonant frequency band.

In some examples, the transmitting coil and the receiving coil of the present disclosure may be configured to transmit and/or receive electrical power at a baseline power profile having a magnitude up to about 5 watts (W). In some other examples, the transmitting coil and the receiving coil of the present disclosure may be configured to transmit and/or receive electrical power at an extended power profile, supporting transfer of up to 15 W of power.

The power receiver 30 is configured to acquire near-field inductive power from the power transmitter 20A. In some examples, the power receiver 30 is a subsystem of an electronic device 14. The electronic device 14 may be any device that is able to consume near field inductive power as specified in the Qi™ Wireless Power Transfer System, Power Class 0 Specification. In some such examples, the electronic device 14 may carry a logo to visually indicate to a user that the electronic device 14 complies with the Specification.

The electronic device 14 may be any device that requires electrical power for any function and/or for power storage (e.g., via a battery and/or capacitor). Additionally or alternatively, the electronic device 14 may be any device capable of receipt of electronically transmissible data. For example, the device may be, but is not limited to being, a handheld computing device, a mobile device, a portable appliance, an integrated circuit, an identifiable tag, a kitchen utility device, an automotive device, an electronic tool, an electric vehicle, a game console, a robotic device, a wearable electronic device (e.g., an electronic watch, electronically modified glasses, altered-reality (AR) glasses, virtual reality (VR) glasses, among other things), a portable scanning device, a portable identifying device, a sporting good, an embedded sensor, an Internet of Things (IoT) sensor, IoT enabled clothing, IoT enabled recreational equipment, industrial equipment, medical equipment, a medical device, a tablet computing device, a portable control device, a remote controller for an electronic device, a gaming controller, among other things.

For the purposes of illustrating the features and characteristics of the disclosed embodiments, arrow-ended lines are utilized to illustrate transferrable and/or communicative signals and various patterns are used to illustrate electrical signals that are intended for power transmission and electrical signals that are intended for the transmission of data and/or control instructions. Solid lines indicate signal transmission of electrical energy, electrical power signals, and/or electromagnetic energy over a physical and/or wireless electrical connection, in the form of power signals that are, ultimately, utilized in wireless power transmission from the power transmitter 20A to the power receiver 30. Further, dotted lines are utilized to illustrate electronically transmittable data signals, which ultimately may be wirelessly transmitted from the power transmitter 20A to the power receiver 30.

Figure 2:
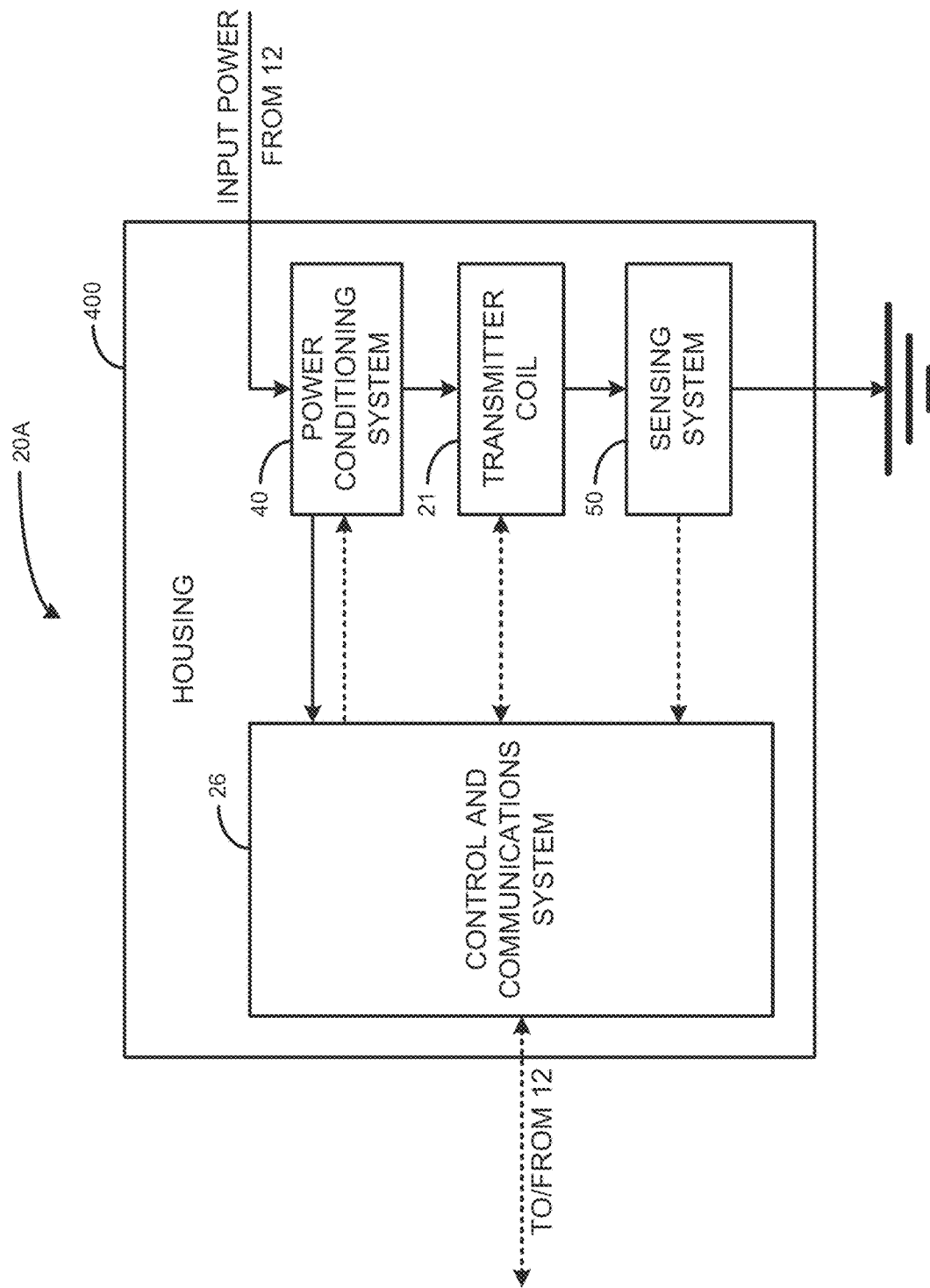
FIG. 2 is an exemplary block diagram for a power transmitter, which may be used in conjunction with the wireless power transfer system of FIG. 1, in accordance with FIG. 1 and an embodiment of the present disclosure.

Turning now to FIG. 2, the wireless power transfer system 10A is illustrated as a block diagram including example sub-systems of the power transmitter 20A. The power transmitter 20A may include, at least, a power conditioning system 40, a control and communications system 26, a sensing system 50, and the transmission coil 21. In some examples, the power transmitter 20 includes and/or is contained within a housing 100, examples of which are discussed in detail below, with reference to FIGS. 19-24.

A first portion of the electrical energy input from the input power source 12 is configured to electrically power components of the power transmitter 20A such as, but not limited to, the control and communications system 26. A second portion of the electrical energy input from the input power source 12 is conditioned and/or modified for wireless power transmission, to the power receiver 30, via the transmission coil 21. Accordingly, the second portion of the input energy is modified and/or conditioned by the power conditioning system 40. While not illustrated, it is certainly contemplated that one or both of the first and second portions of the input electrical energy may be modified, conditioned, altered, and/or otherwise changed prior to receipt by the power conditioning system 40 and/or transmission control system 26, by further contemplated subsystems (e.g., a voltage regulator, a current regulator, switching systems, fault systems, safety regulators, among other things).

The control and communications system 26, generally, comprises digital logic portions of the power transmitter 20A. The control and communications system 26 receives and decodes messages from the power receiver 30, executes the relevant power control algorithms and protocols, and drives the frequency of the AC waveform to control the power transfer. As discussed in greater detail below, the control and communications system 26 also interfaces with other subsystems of the power transmitter 20A. For example, the control and communications system 26 may interface with other elements of the power transmitter 20 for user interface purposes.

Figure 3:
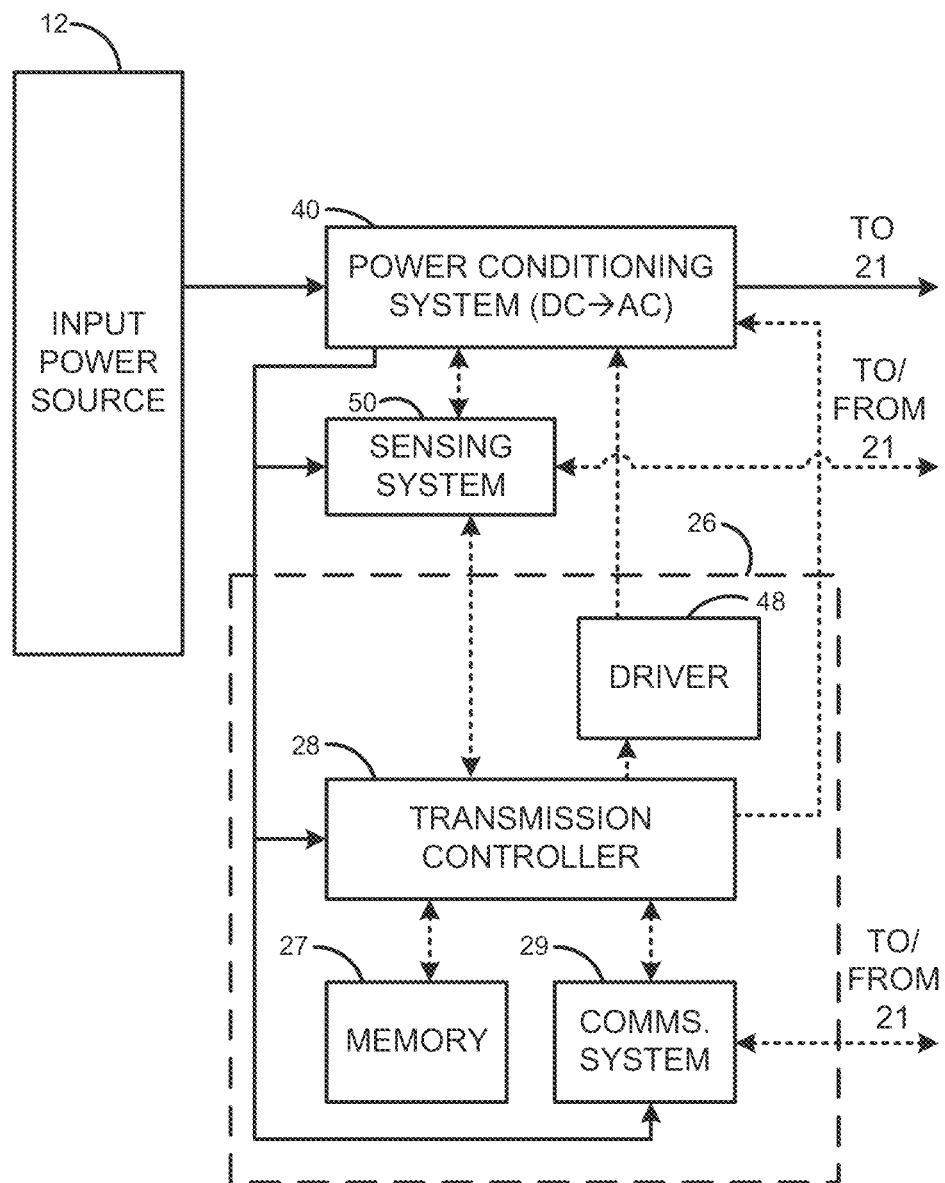
FIG. 3 is an exemplary block diagram for components of a control and communications system of the power transmitter of FIG. 2, in accordance with FIGS. 1-2 and an embodiment of the present disclosure.

Referring now to FIG. 3, with continued reference to FIGS. 1 and 2, subcomponents and/or systems of the control and communications system 26 are illustrated. The control and communications system 26 may include a transmission controller 28, a communications system 29, a driver 48, and a memory 27.

The transmission controller 28 may be any electronic controller or computing system that includes, at least, a processor which performs operations, executes control algorithms, stores data, retrieves data, gathers data, controls and/or provides communication with other components and/or subsystems associated with the power transmitter 20, and/or performs any other computing or controlling task desired. The transmission controller 28 may be a single controller or may include more than one controller disposed to control various functions and/or features of the power transmitter 20A. Functionality of the transmission controller 28 may be implemented in hardware and/or software and may rely on one or more data maps relating to the operation of the power transmitter 20A. To that end, the transmission controller 28 may be operatively associated with the memory 27. The memory may include one or more of internal memory, external memory, and/or remote memory (e.g., a database and/or server operatively connected to the transmission controller 28 via a network, such as, but not limited to, the Internet). The internal memory and/or external memory may include, but are not limited to including, one or more of a read only memory (ROM), including programmable read-only memory (PROM), erasable programmable read-only memory (EPROM or sometimes but rarely labelled EROM), electrically erasable programmable read-only memory (EEPROM), random access memory (RAM), including dynamic RAM (DRAM), static RAM (SRAM), synchronous dynamic RAM (SDRAM), single data rate synchronous dynamic RAM (SDR SDRAM), double data rate synchronous dynamic RAM (DDR SDRAM, DDR2, DDR3, DDR4), and graphics double data rate synchronous dynamic RAM (GDDR SDRAM, GDDR2, GDDR3, GDDR4, GDDR5, a flash memory, a portable memory, and the like. Such memory media are examples of nontransitory machine readable and/or computer readable memory media.

While particular elements of the control and communications system 26 are illustrated as independent components and/or circuits (e.g., the driver 48, the memory 27, the communications system 29, among other contemplated elements) of the control and communications system 26, such components may be integrated with the transmission controller 28. In some examples, the transmission controller 28 may be an integrated circuit configured to include functional elements of one or both of the transmission controller 28 and the power transmitter 20A, generally.

As illustrated, the transmission controller 28 is in operative association, for the purposes of data transmission, receipt, and/or communication, with, at least, the memory 27, the communications system 29, the power conditioning system 40, the driver 48, and the sensing system 50. The driver 48 may be implemented to control, at least in part, the operation of the power conditioning system 40. In some examples, the driver 48 may receive instructions from the transmission controller 28 to generate and/or output a generated pulse width modulation (PWM) signal to the power conditioning system 40. In some such examples, the PWM signal may be configured to drive the power conditioning system 40 to output electrical power as an alternating current signal, having an operating frequency defined by the PWM signal.

The sensing system 50 may include one or more sensors, wherein each sensor may be operatively associated with one or more components of the power transmitter 20A and configured to provide information and/or data. The term "sensor" is used in its broadest interpretation to define one or more components operatively associated with the power transmitter 20A that operate to sense functions, conditions, electrical characteristics, operations, and/or operating characteristics of one or more of the power transmitter 20A, the power receiver 30, the input power source 12, the base station 11, the transmission coil 21, the receiver coil 31, along with any other components and/or subcomponents thereof.

Figure 4:
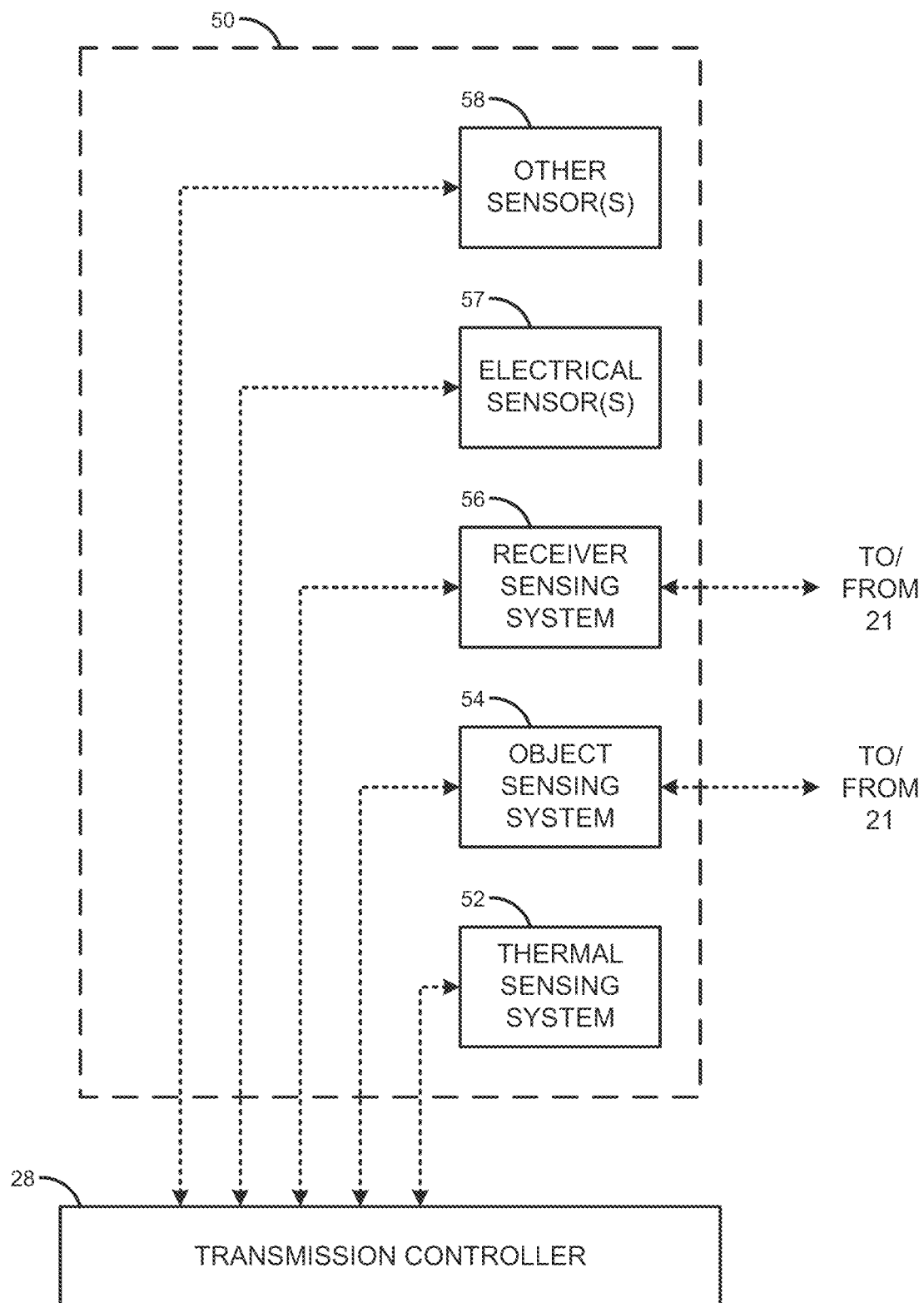
FIG. 4 is an exemplary block diagram for components of a sensing system of the control and communications system of FIG. 3, in accordance with FIGS. 1-3 and an embodiment of the present disclosure.

As illustrated in the embodiment of FIG. 4, the sensing system 50 may include, but is not limited to including, a thermal sensing system 52, an object sensing system 54, a receiver sensing system 56, electrical sensor(s) 57 and/or any other sensor(s) 58. Within these systems, there may exist even more specific optional additional or alternative sensing systems addressing particular sensing aspects required by an application, such as, but not limited to: a condition-based maintenance sensing system, a performance optimization sensing system, a state-of-charge sensing system, a temperature management sensing system, a component heating sensing system, an IoT sensing system, an energy and/or power management sensing system, an impact detection sensing system, an electrical status sensing system, a speed detection sensing system, a device health sensing system, among others. The object sensing system 54, may be a foreign object detection (FOD) system.

Each of the thermal sensing system 52, the object sensing system 54, the receiver sensing system 56 and/or the other sensor(s) 58, including the optional additional or alternative systems, are operatively and/or communicatively connected to the transmission controller 28. The thermal sensing system 52 is configured to monitor ambient and/or component temperatures within the power transmitter 20A or other elements nearby the power transmitter 20A. The thermal sensing system 52 may be configured to detect a temperature within the power transmitter 20A and, if the detected temperature exceeds a threshold temperature, the transmission controller 28 prevents the power transmitter 20A from operating. Such a threshold temperature may be configured for safety considerations, operational considerations, efficiency considerations, and/or any combinations thereof. In a non-limiting example, if, via input from the thermal sensing system 52, the transmission controller 28 determines that the temperature within the power transmitter 20A has increased from an acceptable operating temperature to an undesired operating temperature (e.g., in a non-limiting example, the internal temperature increasing from about 20° Celsius (C) to about 50° C., the transmission controller 28 prevents the operation of the power transmitter 20A and/or reduces levels of power output from the power transmitter 20A. In some non-limiting examples, the thermal sensing system 52 may include one or more of a thermocouple, a thermistor, a negative temperature coefficient (NTC) resistor, a resistance temperature detector (RTD), and/or any combinations thereof.

As depicted in FIG. 4, the transmission sensing system 50 may include the object sensing system 54. The object sensing system 54 may be configured to detect presence of unwanted objects in contact with or proximate to the power transmitter 20A. In some examples, the object sensing system 54 is configured to detect the presence of an undesired object. In some such examples, if the transmission controller 28, via information provided by the object sensing system 54, detects the presence of an undesired object, then the transmission controller 28 prevents or otherwise modifies operation of the power transmitter 20A. In some examples, the object sensing system 54 utilizes an impedance change detection scheme, in which the transmission controller 28 analyzes a change in electrical impedance observed by the transmission coil 21 against a known, acceptable electrical impedance value or range of electrical impedance values. Additionally or alternatively, in some examples the object sensing system 54 may determine if a foreign object is present by measuring power output associated with the power transmitter 20A and determining power input associated with a receiver associated with the power transmitter 20A. In such examples, the object sensing system 54 may calculate a difference between the power associated with the power transmitter 20A and the power associated with the receiver and determine if the difference indicates a loss, consistent with a foreign object not designated for wireless power transmission.

Additionally or alternatively, the object sensing system 54 may utilize a quality factor (Q) change detection scheme, in which the transmission controller 28 analyzes a change from a known quality factor value or range of quality factor values of the object being detected, such as the receiver coil 31. The "quality factor" or "Q" of an inductor can be defined as (frequency (Hz)×inductance (H))/resistance (ohms), where frequency is the operational frequency of the circuit, inductance is the inductance output of the inductor and resistance is the combination of the radiative and reactive resistances that are internal to the inductor. "Quality factor," as defined herein, is generally accepted as an index (figure of measure) that measures the efficiency of an apparatus like an antenna, a circuit, or a resonator. In some examples, the object sensing system 54 may include one or more of an optical sensor, an electro-optical sensor, a Hall effect sensor, a proximity sensor, and/or any combinations thereof.

The receiver sensing system 56 is any sensor, circuit, and/or combinations thereof configured to detect presence of any wireless receiving system that may be couplable with the power transmitter 20A. In some examples, if the presence of any such wireless receiving system is detected, wireless transmission of electrical energy, electrical power, electromagnetic energy, and/or data by the power transmitter to said wireless receiving system is enabled. In some examples, if the presence of a wireless receiver system is not detected, wireless transmission of electrical energy, electrical power, electromagnetic energy, and/or data is prevented from occurring. Accordingly, the receiver sensing system 56 may include one or more sensors and/or may be operatively associated with one or more sensors that are configured to analyze electrical characteristics within an environment of or proximate to the power transmitter 20A and, based on the electrical characteristics, determine presence of a power receiver 30.

The electrical sensor(s) 57 may include any sensors configured for detecting and/or measuring any current, voltage, and/or power within the power transmitter 20A. Information provided by the electrical sensor(s) 57, to the transmission controller 28, may be utilized independently and/or in conjunction with any information provided to the transmission controller 28 by one or more of the thermal sensing system 52, the object sensing system 54, the receiver sensing system 56, the other sensor(s) 58, and any combinations thereof.

Figure 5:
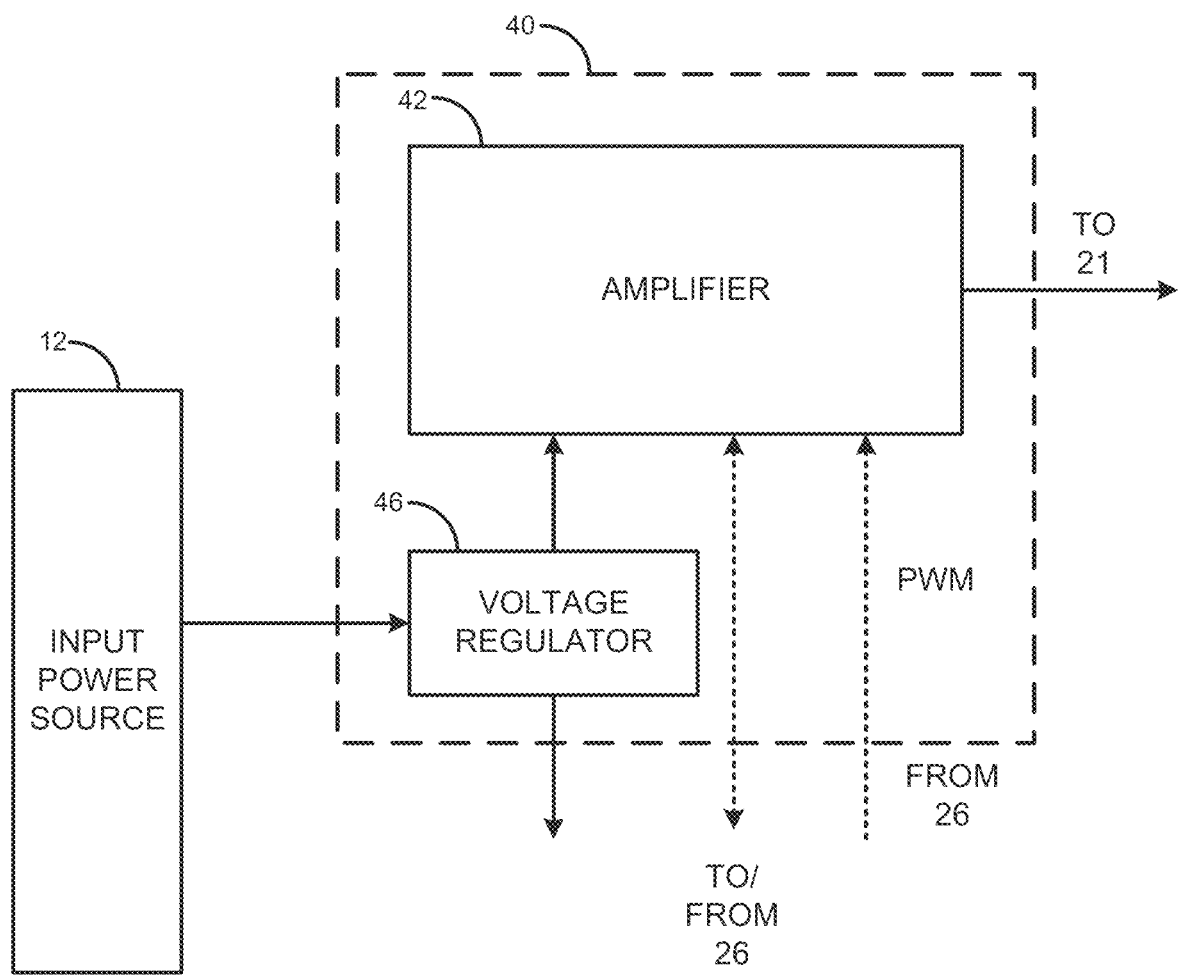
FIG. 5 is an exemplary block diagram for components of a power conditioning system of the power transmitter of FIGS. 1-2, in accordance with FIGS. 1-2 and an embodiment of the present disclosure.

Referring now to FIG. 5, and with continued reference to FIGS. 1-4, a block diagram illustrating an embodiment of the power conditioning system 40 is illustrated. At the power conditioning system 40, electrical power is received, generally, as a DC power source, via the input power source 12 itself or an intervening power converter, converting an AC source to a DC source (not shown). A voltage regulator 46 receives the electrical power from the input power source 12 and is configured to provide electrical power for transmission by the coil 21 and provide electrical power for powering components of the power transmitter 20A. Accordingly, the voltage regulator 46 is configured to convert the received electrical power into at least two electrical power signals, each at a proper voltage for operation of the respective downstream components: a first electrical power signal to electrically power any components of the power transmitter 20A and a second portion conditioned and modified for wireless transmission to the wireless receiver system 30. As illustrated in FIG. 3, such a first portion is transmitted to, at least, the sensing system 50, the transmission controller 28, and the communications system 29; however, the first portion is not limited to transmission to just these components and can be transmitted to any electrical components of the power transmitter 20A.

The second portion of the electrical power is provided to an amplifier 42 of the power conditioning system 40, which is configured to condition the electrical power for wireless transmission by the coil 21. The amplifier may function as an inverter, which receives an input DC power signal from the voltage regulator 46 and generates an AC as output, based, at least in part, on PWM input from the transmission control system 26. The amplifier 42 may be or include, for example, a power stage inverter. The use of the amplifier 42 within the power conditioning system 40 and, in turn, the power transmitter 20 enables wireless transmission of electrical signals having much greater amplitudes than if transmitted without such an amplifier. For example, the addition of the amplifier 42 may enable the wireless transmission system 20A to transmit electrical energy as an electrical power signal having electrical power from about 10 milliwatts (mW) to about 60 W.

Figure 6:
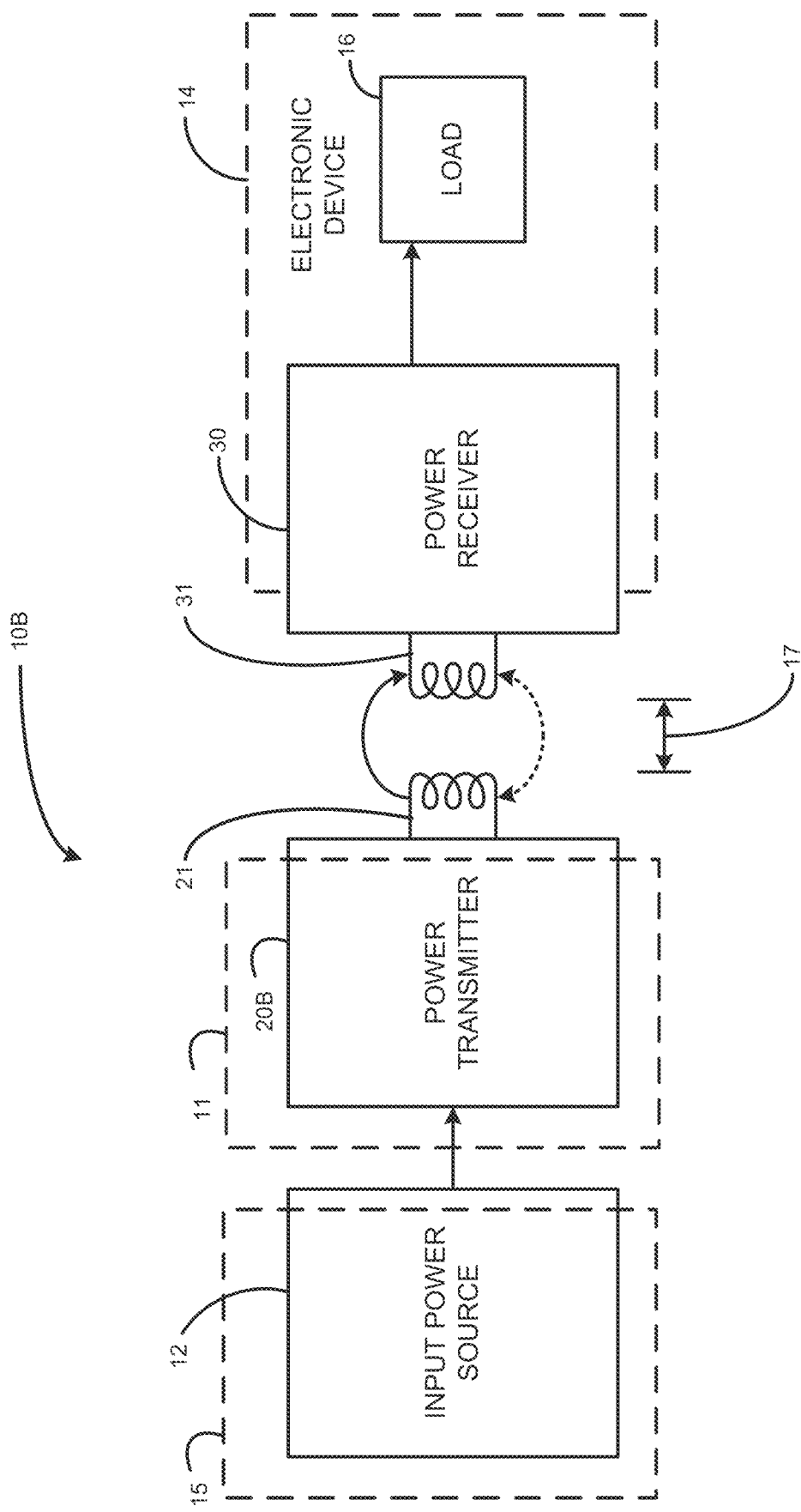
FIG. 6 is an exemplary block diagram of another embodiment of a wireless power transfer system, in accordance with an embodiment of the present disclosure.

Turning now to FIG. 6, another wireless power transfer system 10B is illustrated. The wireless power transfer system 10B includes most of the same elements as the wireless power transfer system 10A and, thus, the base station transmission antenna 21, the receiver antenna 31, the power receiver 30, the load 16, the electronic device 14, and the input power source 12 are functionally equivalent to those of FIG. 1 and share the same written description as those above, with reference to FIGS. 1-5. In contrast with the wireless power transfer system 10A, the input power source 12 in the wireless power transfer system 10B is operatively associated with a vehicle 15. While it certainly is possible that the system 10A of FIG. 1 and/or components thereof may be operatively associated with a vehicle, it is particularly illustrated in FIG. 5 for the purposes of this exemplary embodiment of the disclosure. Additionally, the system 10B includes a power transmitter 20B, which shares many like elements to the power transmitter 20A, as discussed below. The power transmitter 20B may comprise or be operatively associated with a base station 11B.

The vehicle 15 may be a machine that transports people and/or cargo. Exemplary vehicles include automobiles such as cars, trucks, buses, and other land vehicles. Other examples of vehicles may include airplanes, boats, golf carts, small industrial vehicles, farming equipment, construction equipment, nautical vehicles, mixed use vehicles, recreational vehicles, sport vehicles, public transportation vehicles, and trains. Thus, the input power source 12 may be or may include one or more vehicular electrical inputs, vehicular batteries, vehicular power rails, electrical storage devices, such as an electrochemical cell, a battery pack, and/or a capacitor, among other storage devices. Additionally or alternatively, the input power source 12 may be any electrical input source (e.g., any alternating current (AC) or direct current (DC) delivery port) and may include connection apparatus from said electrical input source to the wireless transmission system 20B (e.g., transformers, regulators, rectifiers, conductive conduits, traces, wires, or equipment, goods, computer, camera, mobile phone, and/or other electrical device connection ports and/or adaptors, such as but not limited to USB or lighting ports and/or adaptors, among other contemplated electrical components).

Figure 7:
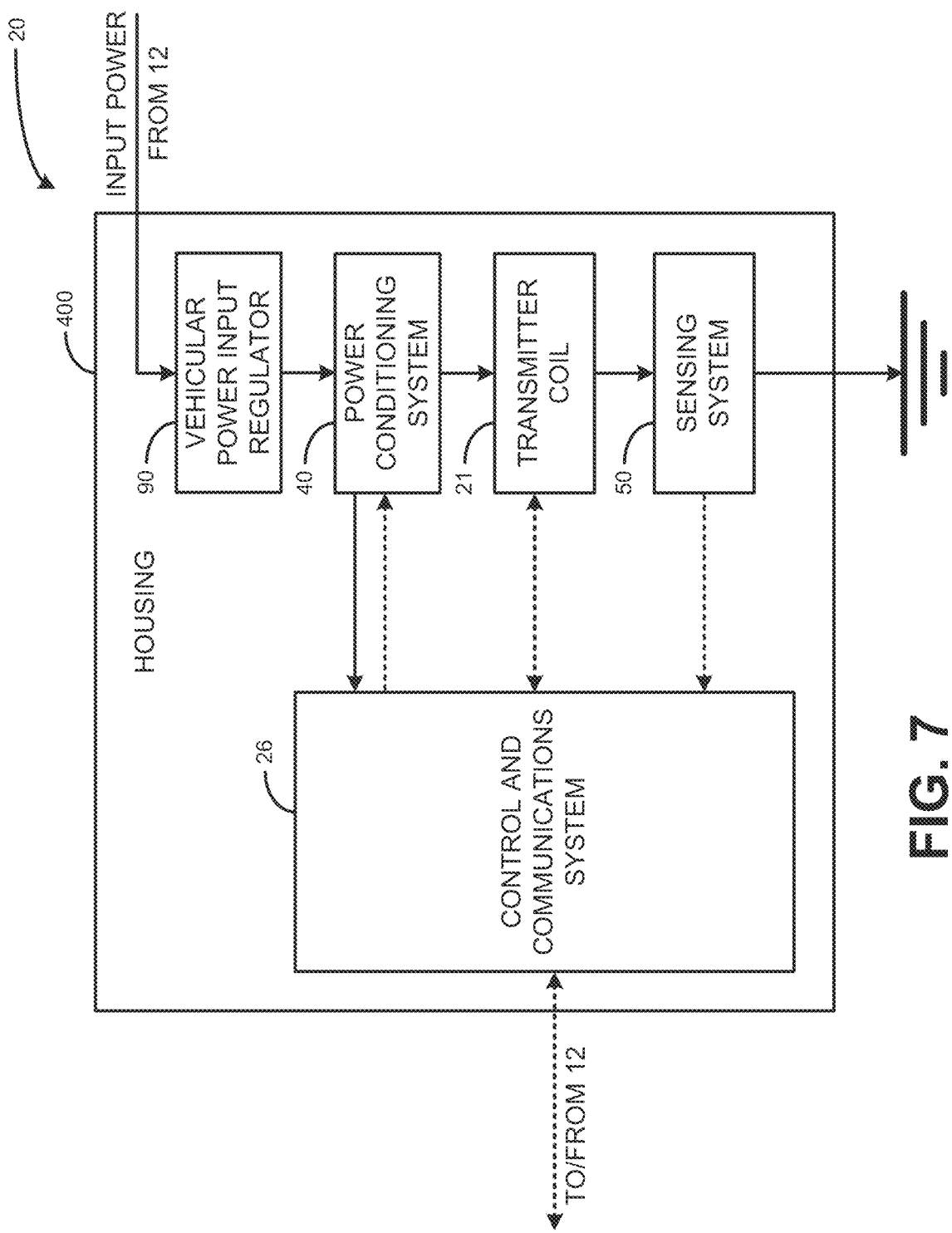
FIG. 7 is an exemplary block diagram for another wireless power transmitter, which may be used in conjunction with the wireless power transfer system of FIG. 6, in accordance with FIGS. 1-6 and an embodiment of the present disclosure.

FIG. 7 illustrates the power transmitter 20B. The power transmitter 20B includes most of the same elements as the power transmitter 20A and, thus, the control and communications system 26, the power conditioning system 40, the transmitter coil 21, the sensing system 50, and the housing 100 share the same written description as those above, with reference to FIGS. 1-5. In contrast with the wireless power transfer system 20A, the power transmitter 20B includes a vehicular power input regulator 90. The vehicular power input regulator 90 is configured to receive and regulate the power input from the input power source 12 to generate a filtered input power to transmit to the power conditioning system 40.

When the input power source 12 is a vehicular power source, the input power received by the vehicular power input regulator 90 is susceptible to one or more of power surges, transients, and electrostatic discharge (ESD), among other things. To that end, a single transient voltage spike has potential to damage and/or disrupt components of the power transmitter's electrical circuitry. Additionally or alternatively, electrical noise produced by a vehicular power source, even that of relatively low energy, can cause significant interruption to digital communications. The vehicular power input regulator 90 may be configured for transient voltage suppression, among other things, to protect downstream components of the power transmitter 20B.

Figure 8:
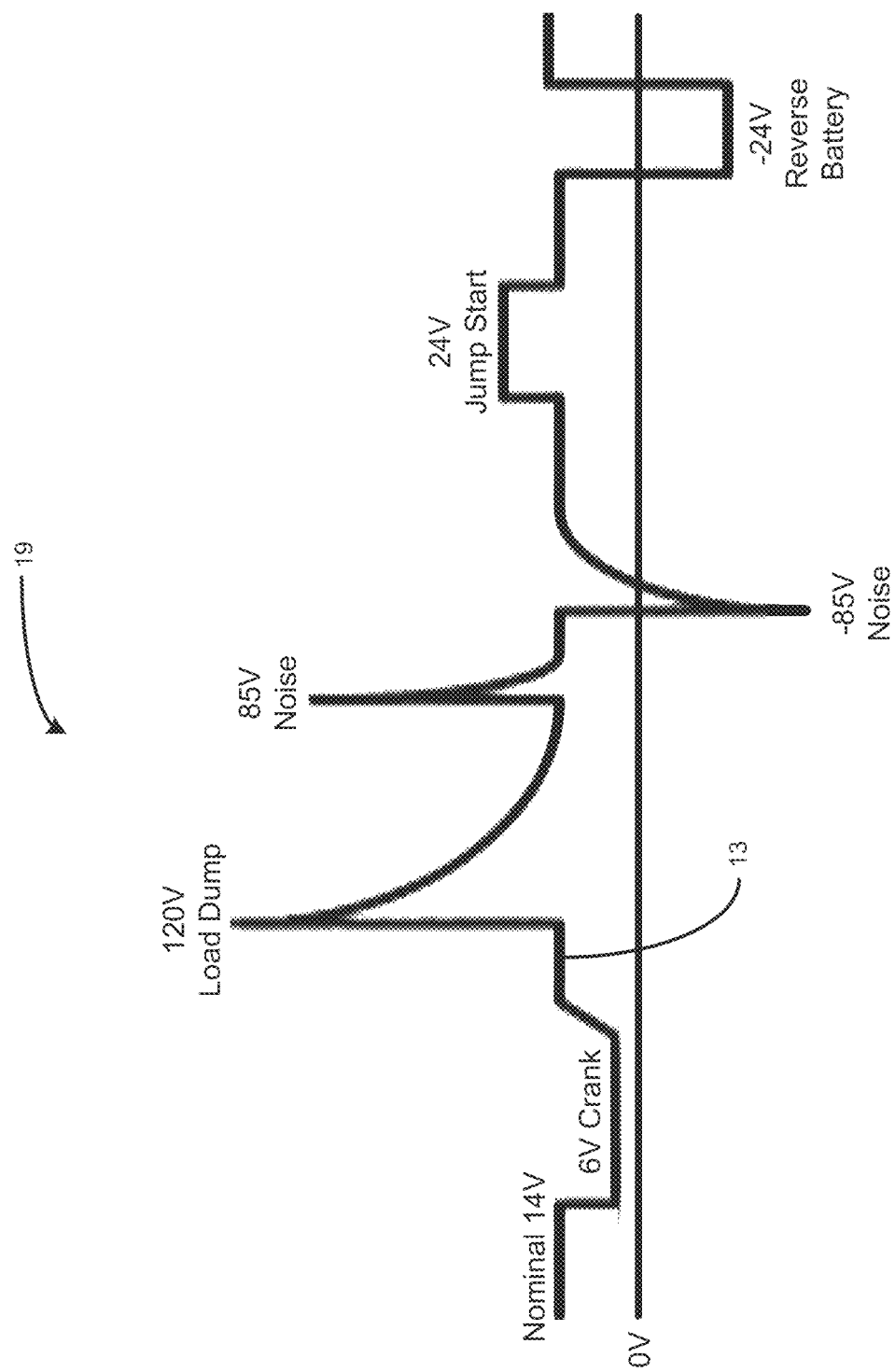
FIG. 8 is an exemplary voltage plot illustrating transient voltage surges, in accordance with the present disclosure.

FIG. 8 is an exemplary plot 19 illustrating an example voltage embodiment of an input power signal 13, communicated from the input power source 11 to the vehicular power input regulator. It is noted that the plot 19 is not to scale and the voltage values are merely exemplary. The input power signal 13 is generated from a vehicular power source like, for example, an alternator and/or battery of a vehicle. Due to the nature of vehicles and the various affects that components of said vehicle may have on the voltage of the power signal 13, a plurality of transient voltages may be applied to the connection and/or rail upon which the input power signal 13 propagates. As illustrated, and viewed in reference to the baseline 0 V level, the voltage of power in a vehicular power connection and/or rail may have transient spikes and dips that could affect components attached to said connection and/or rail. As illustrated, such transients may be alterations to a nominal voltage and include, but are not limited to including, voltage drops due to a crank, load dumps drastically increasing voltage, signal noise, overvoltages from various sources, such as jump starts, reverse battery connections, among other things.

The vehicular power input regulator 90 is utilized by the power transmitter 20B to substantially "flatten" the exemplary plot 19, thus providing a constant, safe voltage in the filtered power signal provided to downstream components of the power transmitter 20. As illustrated in FIGS. 9A-E, the vehicular power input regulator 90 includes an input protection circuit 91, which is utilized in removing transients from the input power signal and/or flattening the voltage of the input power signal to a common, sustained voltage.

Figure 9A:
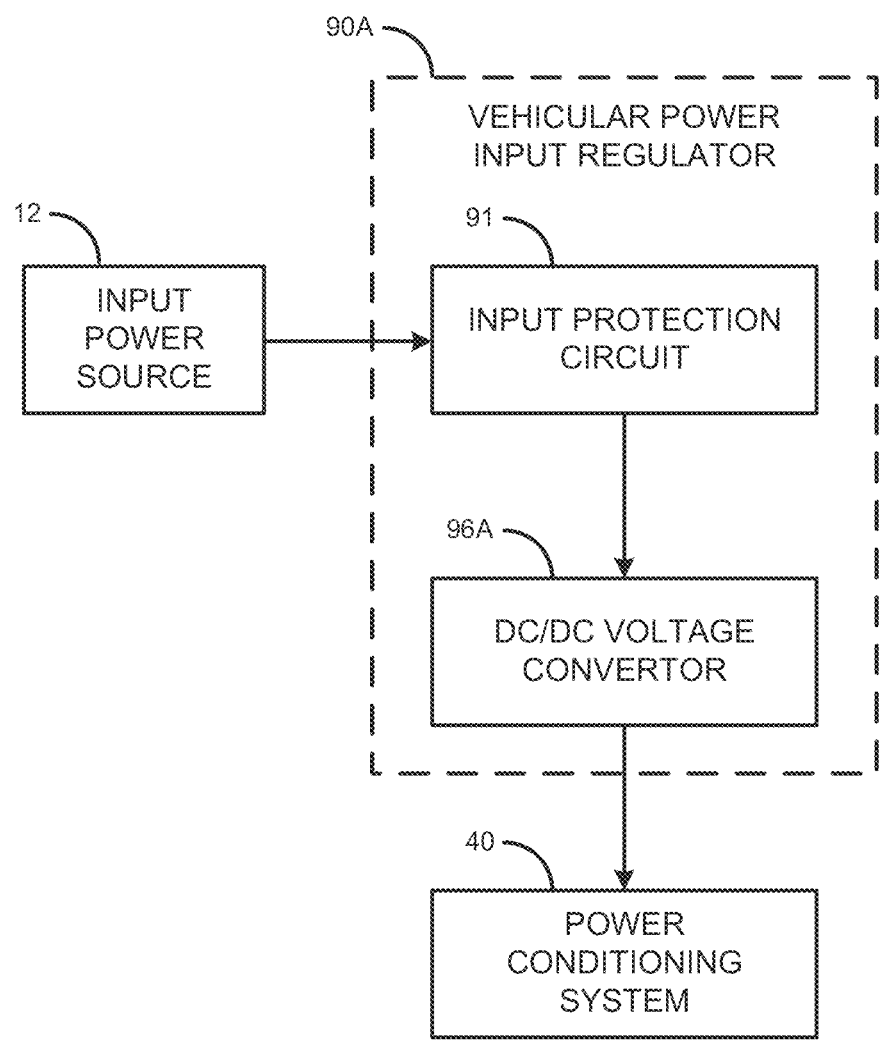
FIG. 9A is an exemplary block diagram for a configuration of a vehicular power input regulator of the power transmitter of FIGS. 1-5, in accordance with FIGS. 1-5 and the present disclosure.
Figure 9B:
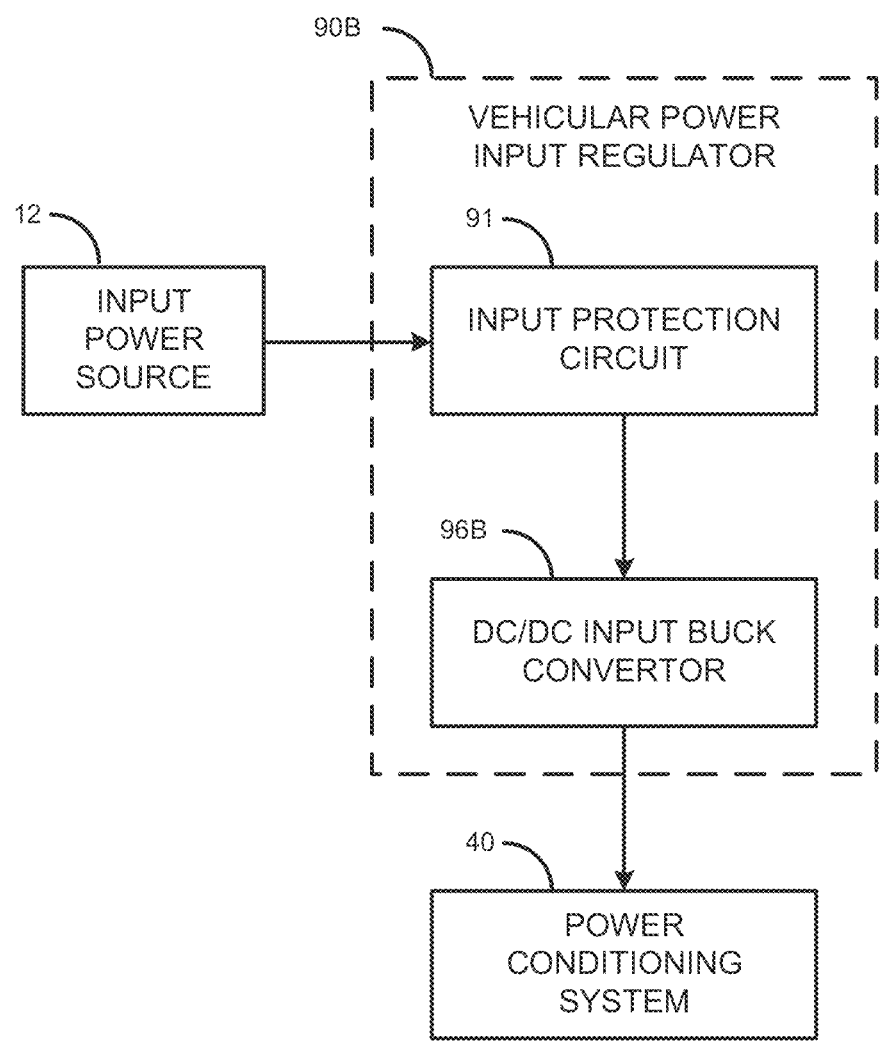
FIG. 9B is an exemplary block diagram for another configuration of a vehicular power input regulator of the power transmitter of FIGS. 1-5, in accordance with FIGS. 1-5 and the present disclosure.
Figure 9C:
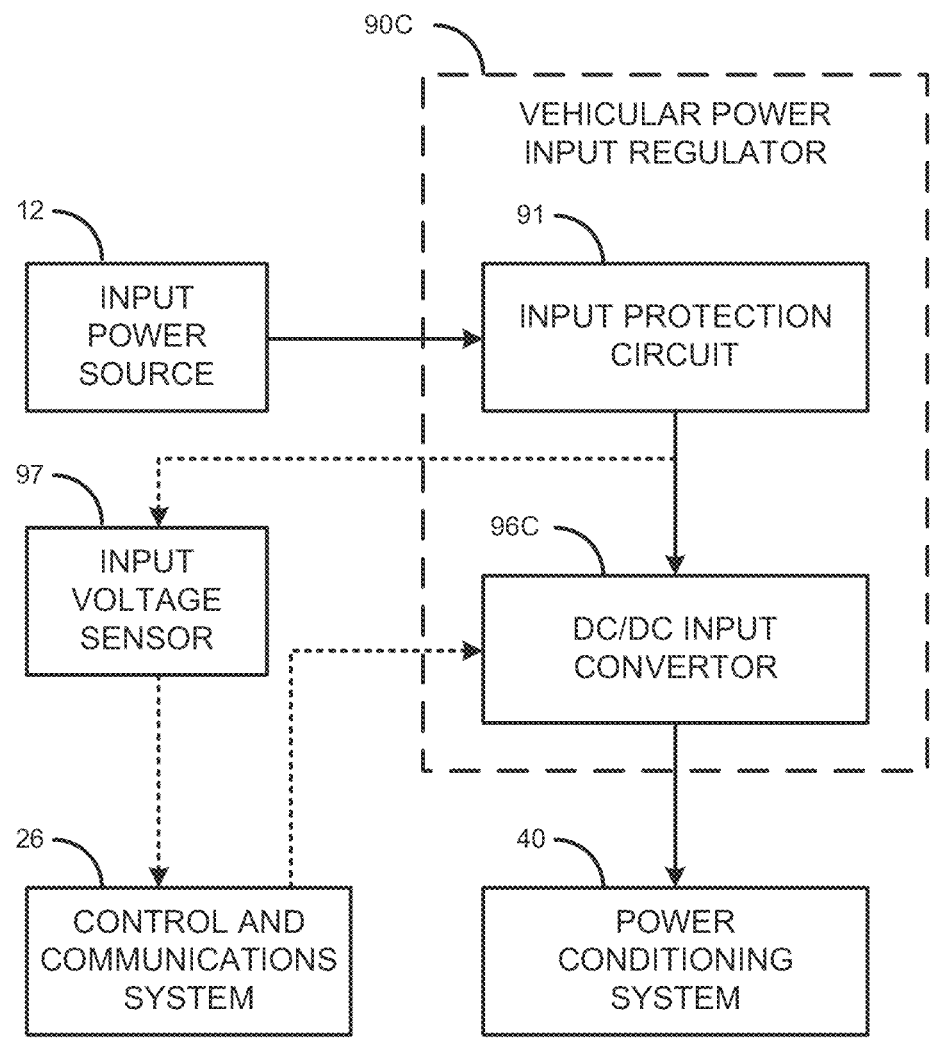
FIG. 9C is an exemplary block diagram for another configuration of a vehicular power input regulator of the power transmitter of FIGS. 1-5, in accordance with FIGS. 1-5 and the present disclosure.
Figure 9D:
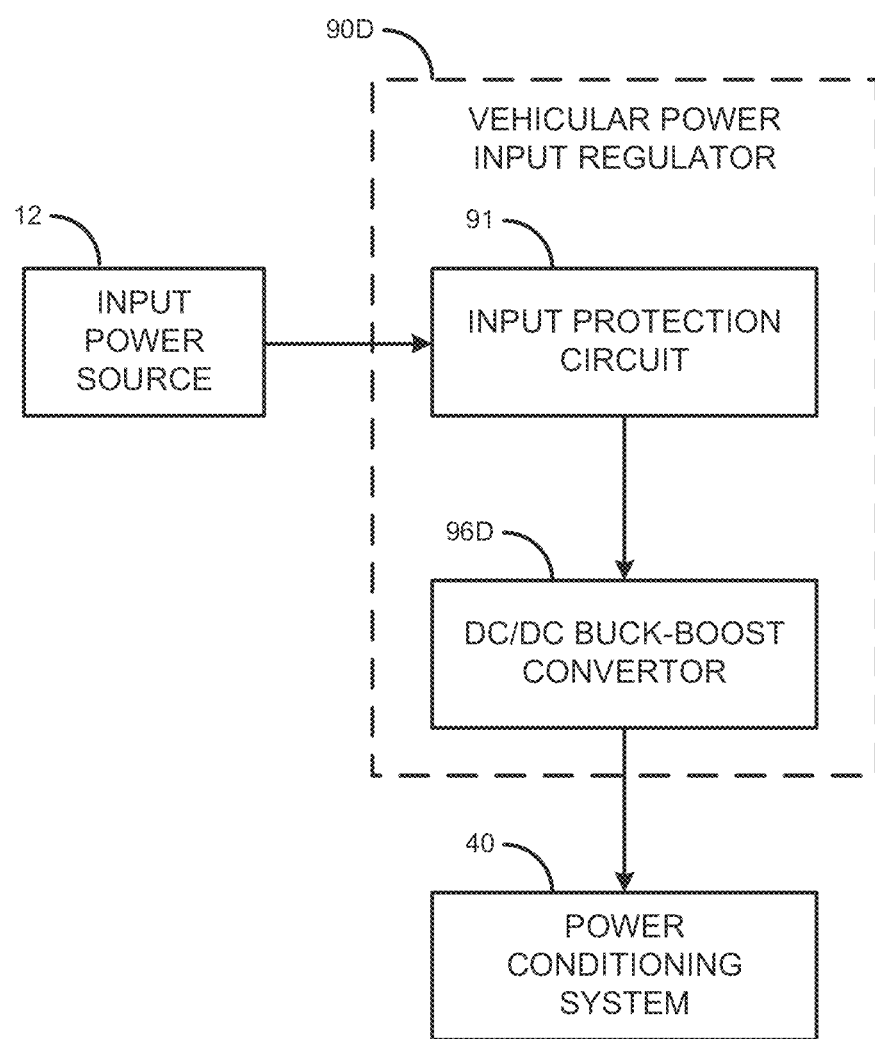
FIG. 9D is an exemplary block diagram for another configuration of a vehicular power input regulator of the power transmitter of FIGS. 1-5, in accordance with FIGS. 1-5 and the present disclosure.
Figure 9E:
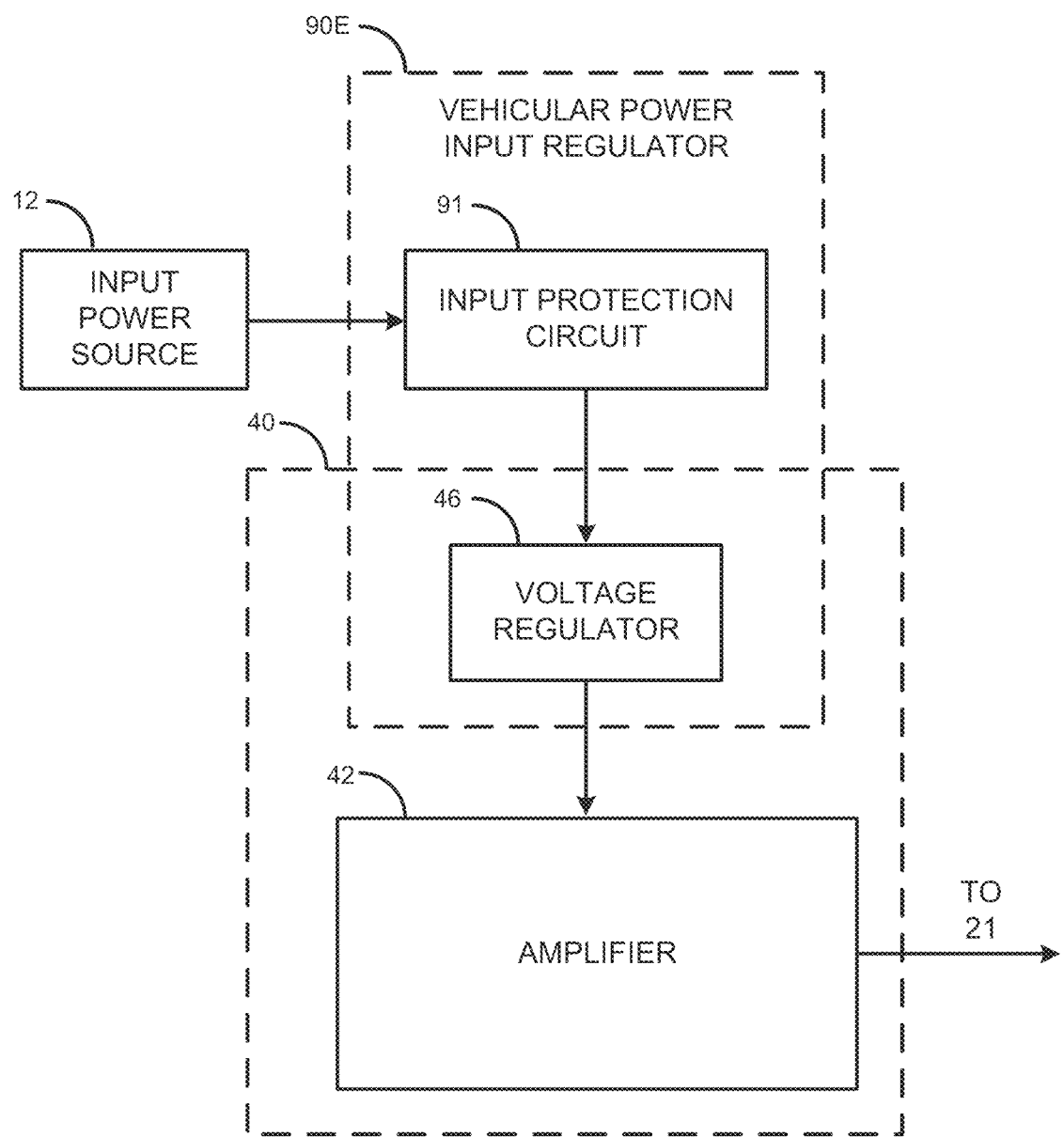
FIG. 9E is an exemplary block diagram for another configuration of a vehicular power input regulator of the power transmitter of FIGS. 1-5, in accordance with FIGS. 1-5 and the present disclosure.
Figure 10:
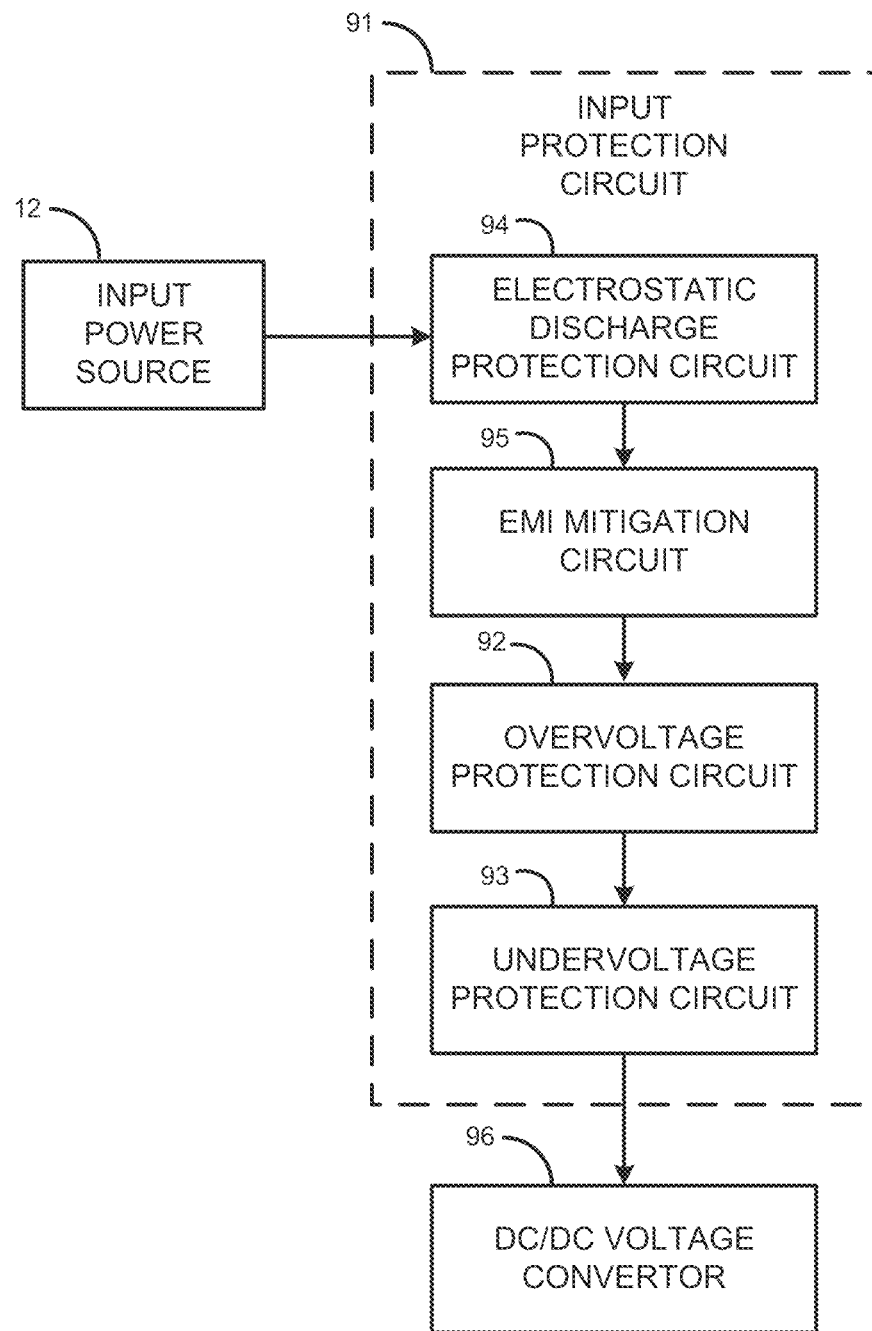
FIG. 10 is an exemplary block diagram illustrating exemplary components of an input protection circuit for any of the vehicular power input regulators of FIGS. 9A-E, in accordance with FIGS. 1-7, 9A-E, and the present disclosure.

Turning now to FIG. 10 and with continued reference to FIGS. 9A-E, components of the input protection circuit 91 are illustrated. The input protection circuit 91 may include an electrostatic discharge (ESD) protection circuit 94, which is configured to prevent ESD and/or mitigate ESD entering or occurring within the power transmitter 20. "Electrostatic Discharge (ESD)," as defined herein, is the sudden flow of electricity between two electrically charged objects caused by one or more of contact, an electrical short, and/or dielectric breakdown. ESD may occur when differently-charged objects are brought close together or when the dielectric between them breaks down. Exemplary ESD protection circuits 94 may embody or include diodes, Transient Voltage Suppressors (TVS), Zener diodes, among other things.

The input protection circuit 91 may further include an electromagnetic interference (EMI) mitigation circuit 95. EMI, which may, alternatively, be referred to as "radio-frequency interference," refers to disturbances, which may be, generally, unwantedly generated by components of the power transmitter 20B, which may affect an electrical circuit, and are generated by electromagnetic induction, electrostatic coupling, and/or conduction, among other sources for EMI. Such disturbances may degrade the performance of the circuit, stop the circuit from functioning and/or may violate EMI limits for commercial products, as provided via regulation. Both man-made and natural sources can generate changing electrical currents and voltages, which may cause EMI. Accordingly, the EMI mitigation circuit 95 may be included to mitigate the ill effects of EMI on components of the power transmitter 20B and/or limit transmission of EMI by the power transmitter 20B. The EMI mitigation circuit 95 may embody or include filters, RF filters, common mode chokes, ferrite beads, inductors, tuning networks, among other things.

The input protection circuit 91 may include an overvoltage protection circuit 92, which is configured for protecting components and/or subcomponents of the power transmitter 20 from overvoltages in the input power signal. "Overvoltage," as defined herein, refers to when a voltage in the power transmitter 20 is raised above the upper design limit of any component of the power transmitter 20B. Overvoltages may cause damage and/or failure in components of the power transmitter 20B. Depending on the duration of an overvoltage, an overvoltage event can be a transient, such as a spike, or may be a substantial constant and/or permanent overvoltage, thus resulting in power surge. Exemplary overvoltage protection circuits 92 may embody or include a crowbar protection circuit, a Zener voltage regulator circuit, Zener diodes, bipolar transistors, voltage regulators, relays, among other known overvoltage protection circuits.

The input protection circuit 91 may further include an undervoltage protection circuit 93, which is configured to prevent undervoltages from being passed to the power conditioning system 40. "Undervoltage," as defined herein, occurs when the voltage of the input electrical power drops below intended voltage levels for operation of the power transmitter 20B. Undervoltages may result in components failing, due to a lack of power transmitted, and/or undervoltages may cause components of the power transmitter 20B to draw excess current, which could result in component failure or damage. Undervoltages may be harmful to digital logic elements of the power transmitter 20B, as an undervoltage can put a digital logic circuit into an unknown and/or unpredictable state, may corrupt volatile memory, such as Random Access Memory (RAM), cause a microcontroller to perform unforeseen actions, cause unsafe conditions within logic circuitry, among other things. Such occurrences, when caused by undervoltage, may cause component damage, create unsafe conditions, and/or may cause the power transmitter to stop functioning.

The undervoltage protection circuit 93 may be configured in any proper manner to prevent undervoltage, such as, but not limited to, including extra capacitance to a circuit to provide power during a brownout, including a CPU halt mechanism, and/or switching/detecting elements to shut down the power transmitter 20B until a voltage reaches acceptable limits. Exemplary undervoltage protection circuits 93 may embody or include a comparator circuit, high capacitance circuits, fail-safe circuits, timers, among other things.

Returning now to FIG. 9A, a DC/DC voltage converter 96A is included for receiving filtered power, converting the input voltage of the filtered power, and outputting the filtered power signal at the operating input voltage for the power transmitter 20B. The DC/DC voltage converter 96A may be any element, component, and/or component configured for altering a DC voltage of a DC power signal, which may include, but is not limited to including one or more of a buck converter, a step-down converter, a boost converter, a transformer, an amplifier, a split-pi converter, a boost-buck converter, a push-pull converter, a full bridge converter, among other things. In some examples, the input power from the input power source may be about 12 V and the operating voltage for the power transmitter 20 is about 19 V. In such examples, the DC/DC voltage converter 96A is configured to boost or step up the voltage of the power signal for the filtered power signal from 12 V to 19 V. In some other examples, the DC/DC voltage converter 96A is configured to buck or step down the voltage of the power signal for the filtered power signal from 24 V to 19 V.

In another embodiment of the vehicular power input regulator 90B illustrated in FIG. 9B, a DC/DC input buck converter 96B is included for receiving filtered power, bucking and/or stepping down the input voltage of the filtered power, and outputting the filtered power signal at the operating input voltage for the power transmitter 20B. The DC/DC voltage converter may be any element, component, and/or component configured for bucking, stepping down, and/or lowering a DC voltage of a DC power signal, which may include, but is not limited to including one or more of a buck converter, a step-down converter, a transformer, an amplifier, a split-pi converter, a push-pull converter, a full bridge converter, among other things. In some examples, the input power from the input power source may be about 12 V and the operating voltage for the power transmitter 20B is about 12 V. In such examples, the DC/DC voltage converter 96B is configured to maintain and/or stabilize the voltage of the input power signal at about 12 V. In some other examples, the DC/DC voltage converter 96B is configured to buck or step down the voltage of the power signal for the filtered power signal from about 24 V to about 12 V.

FIG. 9C illustrates another embodiment of a vehicular power input regulator 90C, which is included for receiving filtered power, converting the input voltage of the filtered power, and outputting the filtered power signal at the operating input voltage for the power transmitter 20B. The vehicular power input regulator 90C may include a DC/DC voltage converter 96C, which may be any element, component, and/or component configured for altering a DC voltage of a DC power signal, which may include, but is not limited to including one or more of a buck converter, a step-down converter, a boost converter, a transformer, an amplifier, a split-pi converter, a boost-buck converter, a push-pull converter, a full bridge converter, among other things. In the exemplary embodiment of FIG. 7C, the power transmitter 20B may include an input voltage sensor 97 which is configured to detect and/or measure the input voltage of the power received from the input power source 11. The input voltage sensor 97 then provides such voltage information to the control and communications system 26, which may then control voltage of the DC/DC input converter 96C, based on the detected input voltage. For example, if the input voltage is about 12 V and the operating voltage of the power transmitter 20B is about 19 V, the control and communication system 26 may instruct the DC/DC input converter 96C to boost and/or step up the voltage to about 19 V. In some alternative examples, if the input voltage is about 24 V and the operating voltage of the power transmitter 20B is about 19 V, then the control and communications system 26 may be configured to buck or step down the voltage to about 19 V.

FIG. 9D illustrates another embodiment of a vehicular power input regulator 90D, which is included for receiving filtered power, converting the input voltage of the filtered power, and outputting the filtered power signal at the operating input voltage for the power transmitter 20B. The vehicular power input regulator 90D may include a DC/DC buck-boost converter 96D, which may be any element, component, and/or component configured for altering a DC voltage of a DC power signal, which may include, but is not limited to including one or more of a buck converter, a step-down converter, a boost converter, a transformer, an amplifier, a split-pi converter, a push-pull converter, a full bridge converter, among other things. In the exemplary embodiment of FIG. 7D, the buck-boost converter 96D may be configured to detect and/or measure the input voltage of the power received from the input power source 11 and then buck or boost the voltage, based on the desired operating conditions for the power transmitter 20B. For example, if the input voltage is about 12 V and the operating voltage of the power transmitter 20B is about 19 V, the buck-boost converter 96D may boost and/or step up the voltage to about 19 V. In some alternative examples, if the input voltage is about 24 V and the operating voltage of the power transmitter 20 is about 19 V, then the buck-boost converter 96D may be configured to buck or step down the voltage to about 19 V.

In an exemplary embodiment of a vehicular power input regulator 90E, as illustrated in FIG. 9E, elements of the vehicular power input regulator 90E may be integrated with the power conditioning system 40 of the power transmitter 20B. In such examples, the voltage regulator 46 may be implemented to embody similar functions of any of the DC/DC voltage converters 90A-D of FIGS. 9A-D. To that end, the voltage regulator 46 may be configured to convert the input voltage from the input power source 11 to a proper operating voltage for the power transmitter 20B.

Figure 11:
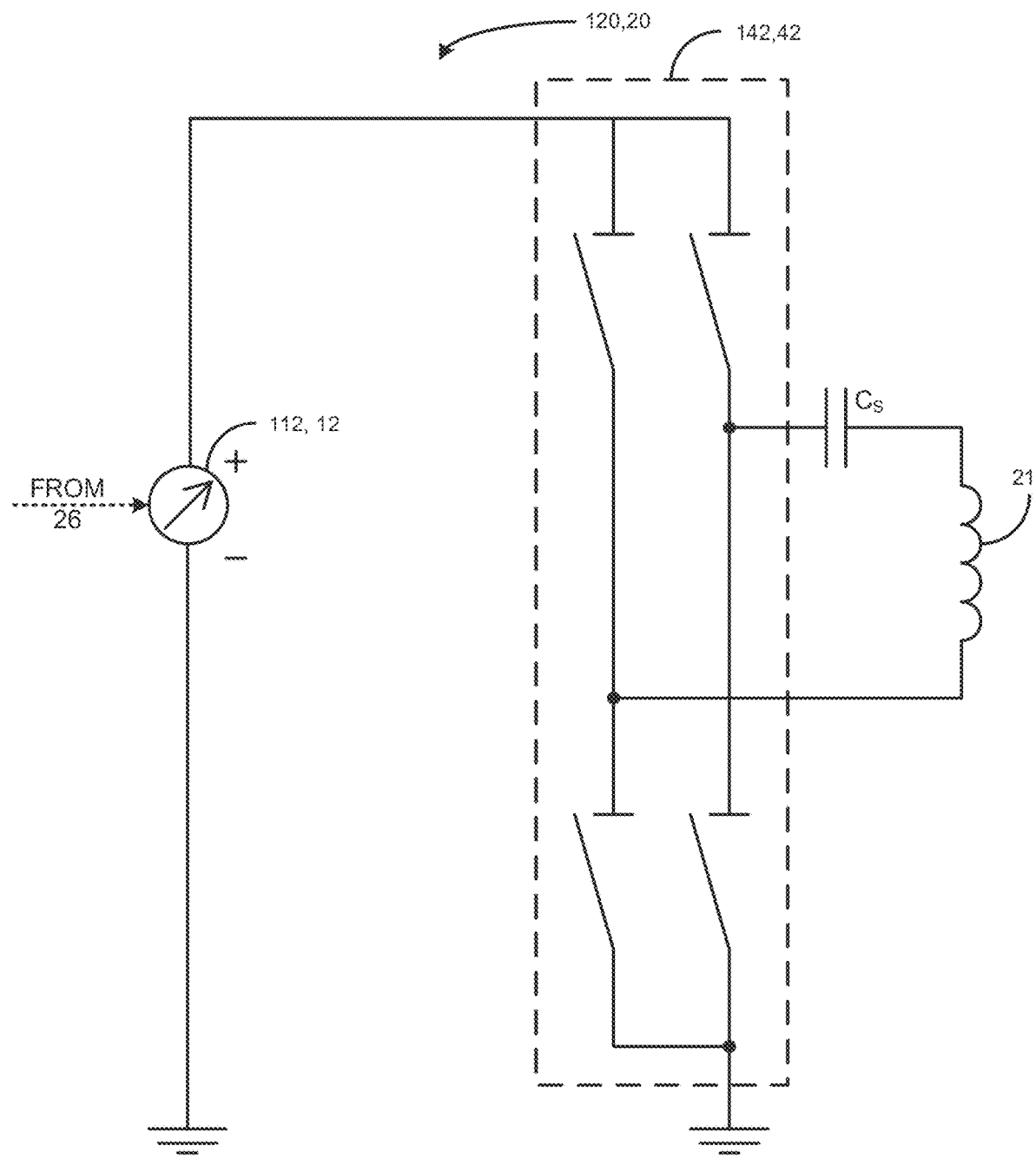
FIG. 11 is an exemplary electrical schematic diagram of components of a power transmitter of FIGS. 1-7, 9-10, in accordance with FIGS. 1-7, 9-10 and the present disclosure.

FIG. 11 is an exemplary schematic diagram 120 for an embodiment of the power transmitters 20. In the schematic, the amplifier 42 is a full-bridge inverter 142 which drives the transmitter coil 21 and a series capacitor Cs. In some examples, wherein the operating frequency of the power transmitter 20 is in the range of about 87 kHz and about 205 kHz, the transmitter coil 21 has a self-inductance in a range of about 5 μH to about 7 μH. In some such examples, Cs has a capacitance in a range of about 400 nF to about 450 nF.

Based on controls configured by the control and communications system 26, an input power source 112, embodying the input power source 12, is altered to control the amount of power transferred to the power receiver 30. The input voltage of the input power source 112 to the full-bridge inverter 142 may be altered within a range of about 1 volt (V) to about 19 V, to control power output. In such examples, the resolution of the voltage of the input power source 112 may be 10 millivolts (mV) or less. In some examples, when the power transmitter 20, 120 first applies a power signal for transfer to the power receiver 30, the power signal of the input power source 112 has an initial input power voltage in a range of about 4.5 V to about 5.5 V.

The transmitter coil 21 may be of a wire-wound type, wound of, for example, Litz wire. As defined herein, Litz wire refers to a type of multistrand wire or cable utilized in electronics to carry an alternating current at a frequency. Litz wire is designed to reduce skin effect and proximity effect losses in conductors at frequencies up to about 1 MHz and consists of many thin wire strands, individually insulated and twisted or woven together, following a pattern. In some examples, the Litz wire may be no. 17 American Wire Gauge (AWG) (1.15 mm) type 2 Litz wire, having 105 strands of no. 40 AWG (0.08 mm diameter), or equivalent wire. In some examples, the Litz wire used for the transmitter coil 21 may be a bifilar Litz wire. To that end, utilizing thicker Litz wire, such as the no. 17 AWG type 2 Litz wire, utilizing bifilar Litz wire, and combinations thereof, may result in an increased Quality Factor (Q) for the transmitter coil 21 and higher Q may be directly related to increases in gap 17 height and/or Z-Distance. As Q is directly related to the magnitude of the magnetic field produced by the transmitter antenna 21 and, thus, with a greater magnitude magnetic field produced, the field emanating from the transmission antenna 21 can reach greater Z-distances and/or charge volumes, in comparison to legacy transmission coils, having lower Q designs. While Litz wire is described and illustrated, other equivalents and/or functionally similar wires may be used. Furthermore, other sizes and thicknesses of Litz wire may be used.

Figure 12:
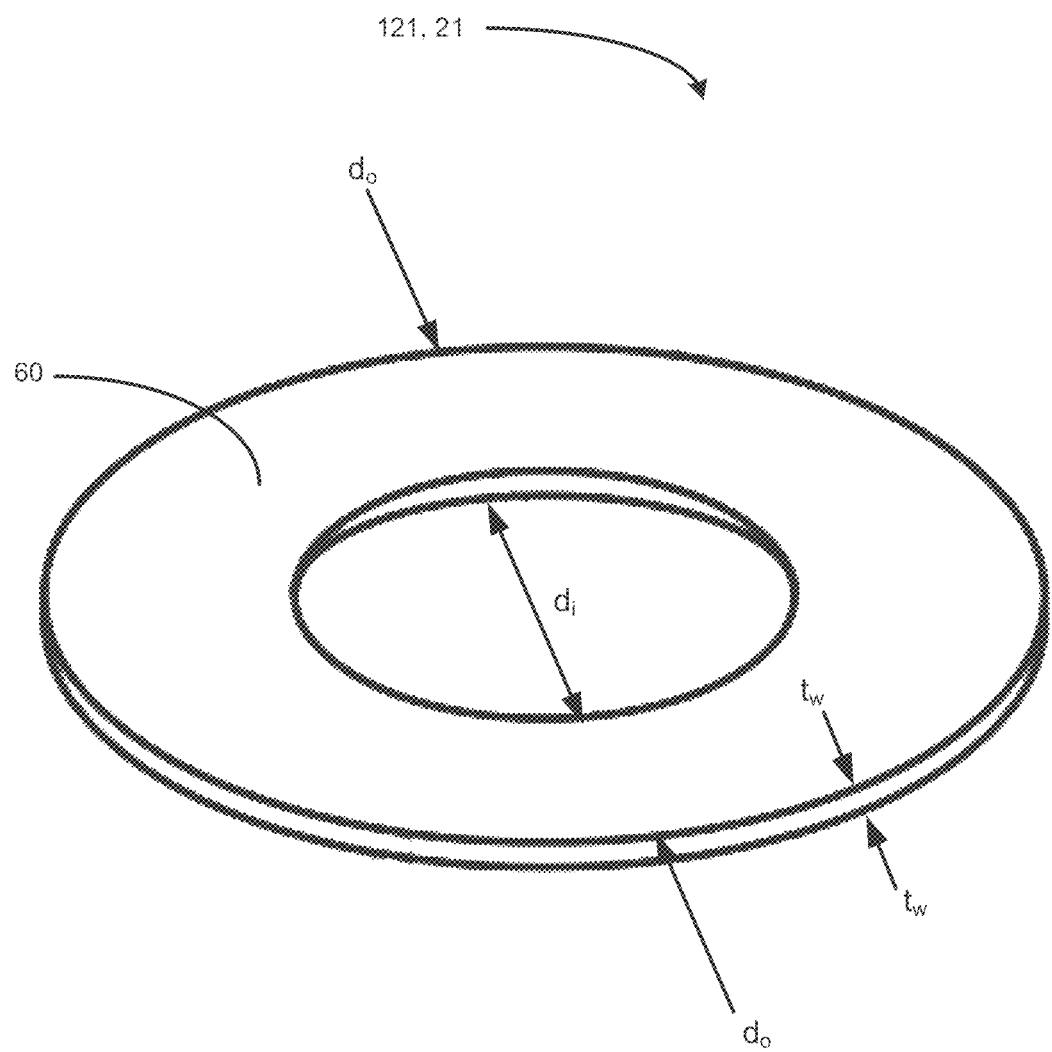
FIG. 12 is a perspective view of a shape of a transmitter coil of the power transmitter of FIGS. 1-7, 9-11, in accordance with FIGS. 1-7, 9-11 and an embodiment of the present disclosure.

Turning to FIG. 12, an exemplary diagram 121, for portraying dimensions of the transmitter antenna 21, is illustrated. The diagram 121 is a top perspective view of the transmitter antenna 21 and shows a top face 60 of the transmitter antenna 21. Note that the diagram 121 is not necessarily to scale and is for illustrative purposes. The top face 60 and the transmitter antenna 21, generally, are relatively circular in shape. As illustrated, an outer diameter $d_o$ is defined as an exterior diameter of the transmitter antenna 21. In some examples, the outer diameter $d_o$ has an outer diameter length in a range of about 40 mm to about 50 mm. An inner diameter $d_i$ is defined as the diameter of the void space in the interior of the transmitter antenna 21. The inner diameter $d_i$ may have an inner diameter length in a range of about 15 mm to about 25 mm. The outer diameter $d_o$ and the inner diameter $d_i$ may be relatively concentric, with respect to one another. The transmitter coil 21 has a thickness $t_w$, which is defined as the thickness of the wire of the coil. The thickness $t_w$ may be in a range of about 2 mm to about 3 mm. In such examples, the transmitter coil 21 may be made of Litz wire and include at least two layers, the at least two layers stacked upon each other. Utilization of one or more of an increased inner diameter an increased outer diameter $d_o$, multiple Litz wire layers for the antenna 21, specific dimensions disclosed herein, and/or combinations thereof, may be beneficial in achieving greater gap 17 heights and/or Z-distances. Other shapes and sizes of the transmitter antenna 21 may be selected based on the configuration with the selection of the shape and size of the shielding of the transmitter coil. In the event that a desired shielding in required, the transmitter antenna 21 may be shaped and sized such that the shielding surrounds the transmitter antenna 21 in accordance with an embodiment.

Figure 13:
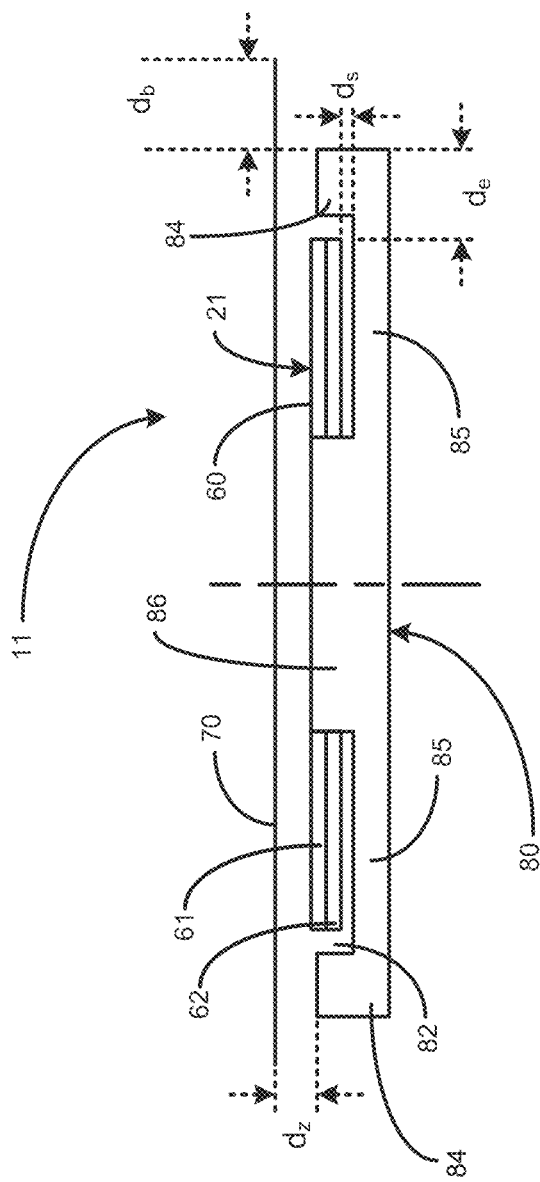
FIG. 13 is a cross-section of components of a base station, with which the power transmitter 20 is associated, in accordance with FIGS. 1-7, 9-12 and the present disclosure.

Turning now to FIG. 13, a cross-sectional view of the transmitter coil 21, within the base station 11 and partially surrounded by a shielding 80 of the transmitter coil 21, is illustrated. The shielding 80 comprises a ferrite core and defines a cavity 82, the cavity configured such that the ferrite core substantially surrounds all but the top face 60 of the transmitter antenna 21 when the transmitter antenna 21 is placed in the cavity. As used herein, "surrounds" is intended to include covers, encircles, enclose, extend around, or otherwise provide a shielding for. "Substantially surrounds," in this context, may take into account small sections of the coil that are not covered. For example, power lines may connect the transmitter coil 21 to a power source. The power lines may come in via an opening in the side wall of the shielding 80. The transmitter coil 21 at or near this connection may not be covered. In another example, the transmitter coil 21 may rise slightly out of the cavity and thus the top section of the side walls may not be covered. By way of example, substantially surrounds would include coverage of at least 50+% of that section of the transmitter antenna. However, in other examples, the shielding may provide a greater or lesser extent of coverage for one or more sides of the transmitter antenna 21.

Figure 14:
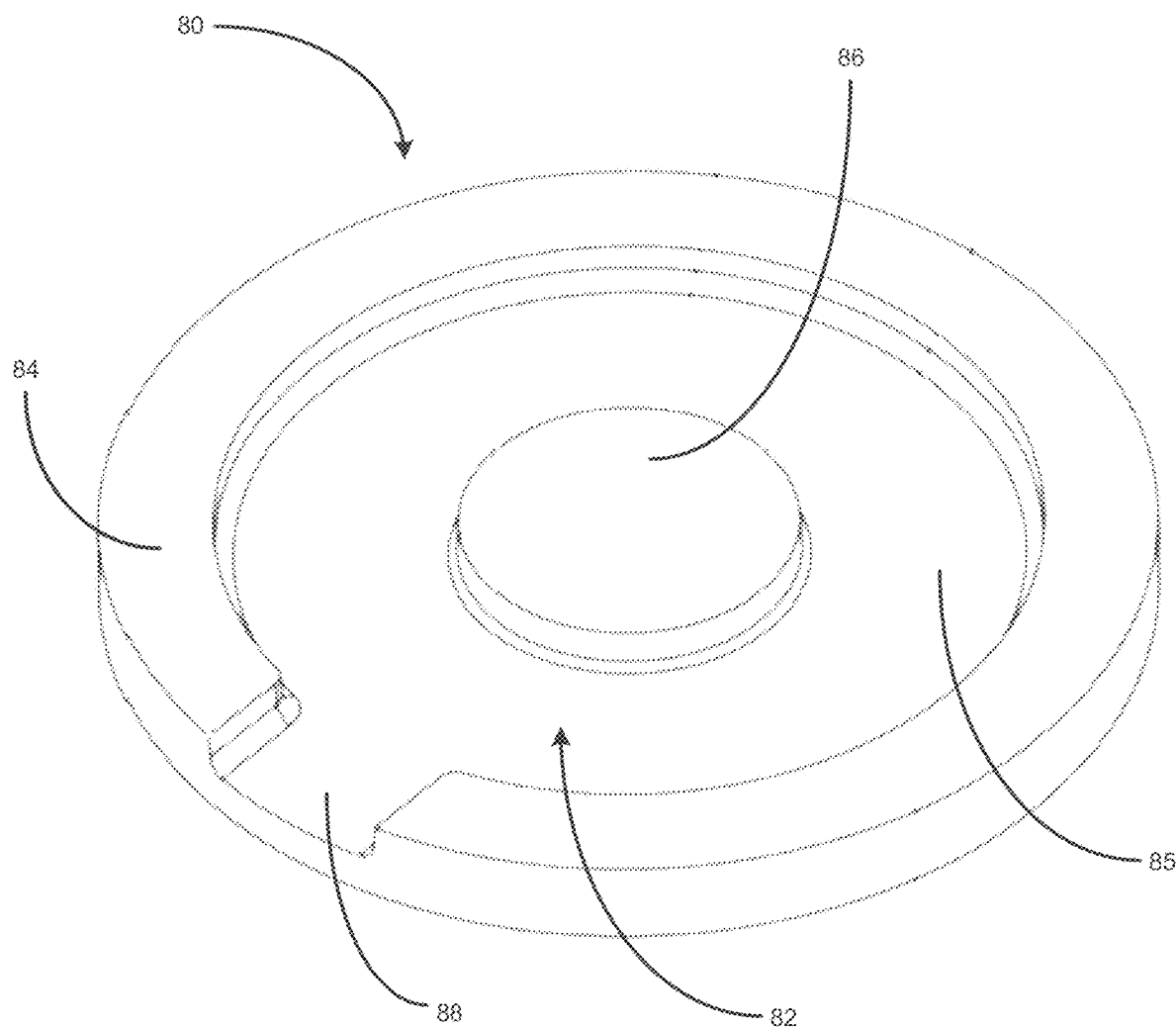
FIG. 14 is a perspective view of a shielding associated with the transmitter coil of FIGS. 1-7, 9-13, in accordance with FIGS. 1-7, 9-13 and an embodiment of the present disclosure.

In an embodiment, as shown in FIG. 14, the shielding 80 surrounds at least the entire bottom section of the transmitter antenna 21 and almost all of the side sections of the transmitter antenna 21. As used herein, the entire bottom section of the transmitter antenna 21 may include, for example, the entire surface area of the transmitter antenna 21 or all of the turns of the Litz wire of the transmitter antenna 21. With respect to the side walls, as shown in FIG. 14, the magnetic ring 84 does not extend all the way up the side wall of the transmitter antenna 61. However, as shown in other illustrations, the side wall may extend all the way up the side wall.

Figure 15A:
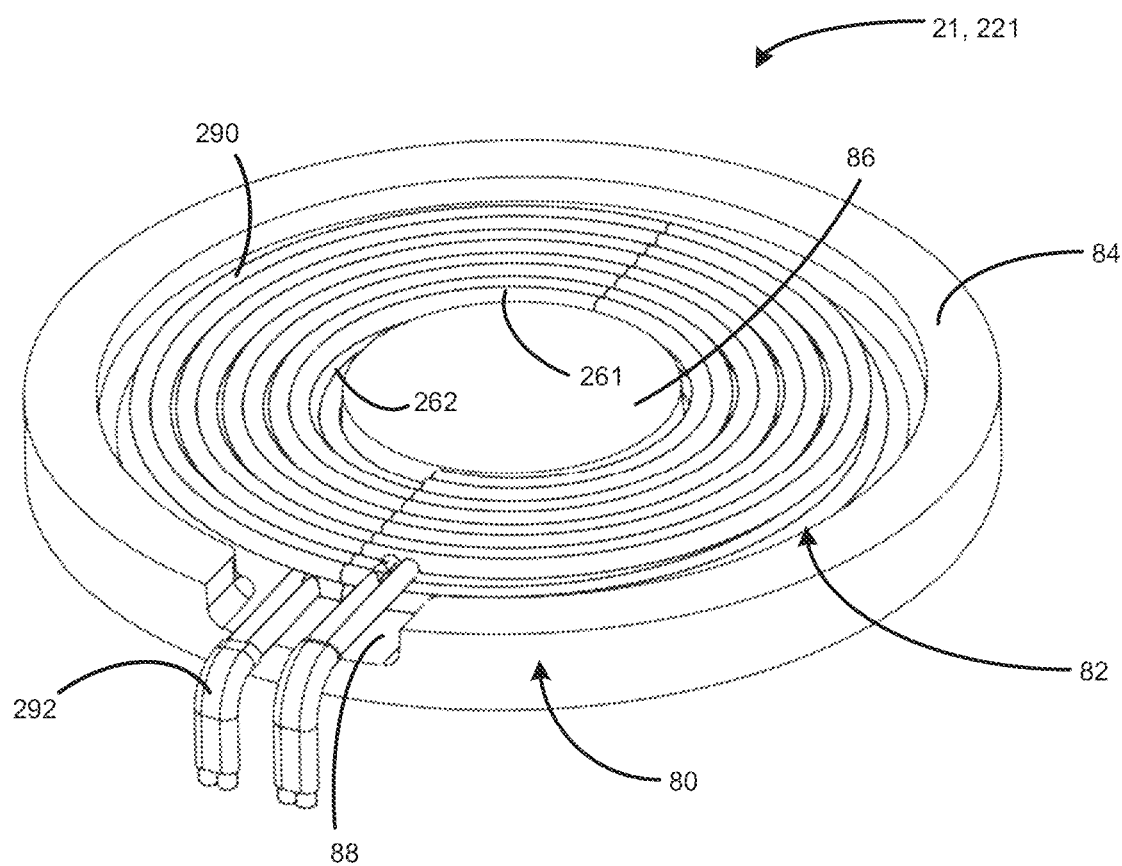
FIG. 15A is a perspective view of the transmitter coil of FIGS. 1-7, 9-13 and the shielding of FIGS. 13 and 14, in accordance with FIGS. 1-7, 9-14 and the present disclosure.
Figure 15B:
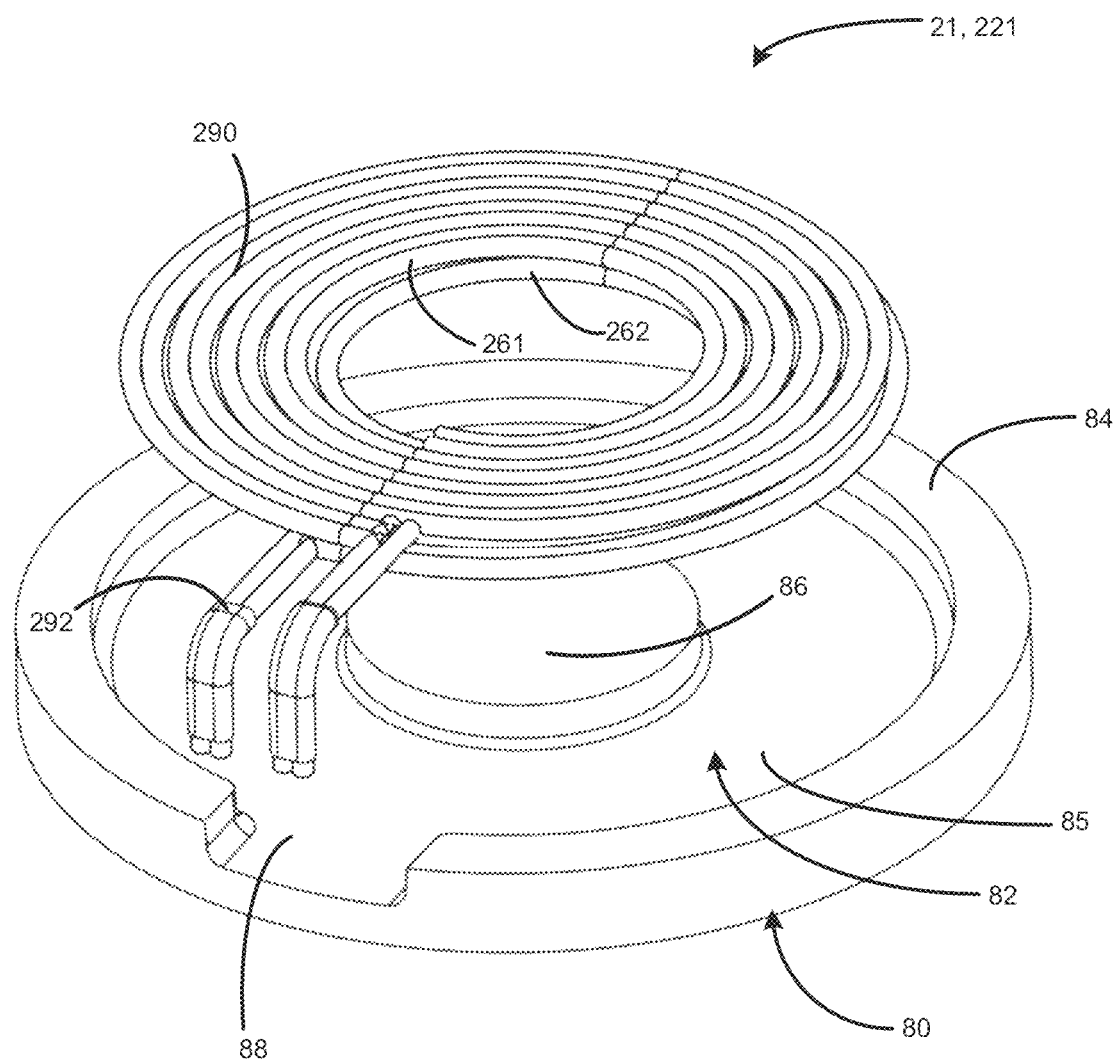
FIG. 15B is an exploded perspective view of the transmitter coil of FIGS. 1-7, 9-13 and the shielding of FIGS. 13 and 14, in accordance with FIGS. 1-7, 9-14, 15A and the present disclosure.

In another embodiment, the shielding 80 may surround less than the entire bottom section of the transmitter antenna 61. For example, connecting wires (e.g., connecting wires 292, as best illustrated in FIGS. 15A, 15B and discussed below) may be run through an opening in the bottom of the shielding 80.

In an embodiment, as shown in FIG. 14, the shielding 80 is an "E-Core" type shielding, wherein the cavity 82 and structural elements of the shielding 80 are configured in an E-shape configuration, when the shielding is viewed, cross-sectionally, in a side view. The E-Core configuration is further illustrated in FIG. 15, which is a perspective view of the shielding 80. The shielding 80 may include a magnetic core 86, a magnetic backing 85, and a magnetic ring 84. The magnetic core 86 is spaced inwardly from the outer edge of the magnetic backing 85 and projects in an upward direction from the top surface of the magnetic backing 85. The magnetic core 86 and the magnetic ring 84 function to surround the transmitter coil 21 and to direct and focus magnetic fields, hence improving coupling with the receiver coil 31 of the power receiver 30.

In addition to covering the entire outer diameter of the transmitter coil 21, the shielding 80 may also cover the inner diameter $d_i$ of the transmitter coil 21. That is, as shown, the inner section of the E-Core configuration may protrude upward through the middle of the transmitter coil 21.

In an embodiment, the cavity 82 is configured such that the shielding 80 covers the entire bottom section of the transmitter coil 21 and the entire side sections of the transmitter coil 21. The top section of the transmitter coil 21 is not covered. The bottom section of the transmitter coil 21 is the side of the transmitter coil 21 that is opposite of the direction of the primary power transfer to the receiver coil.

With a wire wound transmitter coil 21, the side section of the transmitter coil 21 includes the side section of the outer most winding of the coil 21.

FIG. 15A is a perspective view of the transmitter coil 21 and the embodiment of the E-core shielding of FIG. 14 and FIG. 15B is an exploded perspective view of the transmitter coil 21 and the embodiment of the E-core shielding of FIG. 14. The transmitter coil 21 is positioned above the shielding 80, whose combination of structural bodies, as discussed above, may include the combination of the magnetic core 86, the magnetic backing 85, and magnetic ring 84. This magnetic shielding combination functions to help direct and concentrate magnetic fields created by transmitter coil 21 and can also limit side effects that would otherwise be caused by magnetic flux passing through nearby metal objects. In some examples, the magnetic ring defines an opening 88, in which a connecting wire 292 of the transmitter coil 21 can exit the shielding 80.

As defined herein, a "shielding material," from which the shielding 80 is formed, is a material that captures a magnetic field. An example of which is a ferrite material. The ferrite shield material selected for the shielding 80 also depends on the operating frequency, as the complex magnetic permeability ($\mu=\mu'-j*\mu''$) is frequency dependent. The material may be a sintered flexible ferrite sheet or a rigid shield and be composed of varying material compositions. In some examples, the ferrite material for the shielding 80 may include a Ni—Zn ferrite, a Mn—Zn ferrite, and any combinations thereof.

Returning now to FIG. 13 and with continued reference to FIGS. 14 and 15, the shielding 80 is aligned with the transmitter antenna 21 such that the shielding 80 substantially surrounds the transmitter antenna 21 on all sides, aside from the top face 60. In other words, the transmitter antenna 21 may be wound around the magnetic core 86 and be surrounded, on the bottom and sides, respectively, by the magnetic backing 85 and the magnetic ring 84. As illustrated, the shielding 80, in the form of one or both of the magnetic backing and the magnetic core, may extend beyond the outer diameter $d_o$ of the transmitter antenna 21 by a shielding extending distance $d_e$. In some examples, the shielding extending distance $d_e$ may be in a range of about 5 mm to about 6 mm. The shielding 80, at the magnetic backing 85, and the transmitter coil 21 are separated from one another by a separation distance $d_s$, as illustrated. In some examples, the separation distance $d_s$ may be in a range of about 0.1 mm and 0.5 mm.

An interface surface 70 of the base station 11 is located at an interface gap distance $d_{int}$ from the transmitter coil 21 and the shielding 80. The interface surface 70 is a surface on the base station 11 that is configured such that when a power receiver 30 is proximate to the interface surface 70, the power receiver 30 is capable of coupling with the power transmitter 20, via near-field magnetic induction between the transmitter antenna 21 and the receiver antenna 31, for the purposes of wireless power transfer. In some examples, the interface gap distance $d_{int}$ maybe in a range of about 8 mm to about 10 mm. In such examples, the $d_{int}$ is greater than the standard required Z-distance for Qi™ certified wireless power transmission (3-5 mm). Accordingly, by having a greater $d_{int}$, empty space and/or an insulator can be positioned between the transmission coil 21 and the interface surface 70 to mitigate heat transfer to the interface surface 70, the power receiver 30, and/or the electronic device 14 during operation. Further, such a greater $d_{int}$ allows for interface design structures in which objects on or attached to the electronic device 14 may remain attached to the electronic device during operation. As described in greater detail below, design features of the interface surface 70 may be included for interaction with such objects for aligning the power transmitter 20 and the power receiver 30 for operation.

Returning now to FIG. 15B, an exemplary coil 221 for use as the transmitter antenna 21 is illustrated in the exploded view of the transmitter antenna 21 and shielding 80. The coil 221 includes one or more bifilar Litz wires 290 for the first bifilar coil layer 261 and the second bifilar coil layer 262. "Bifilar," as defined herein, refers to a wire having two closely spaced, parallel threads and/or wires. Each of the first and second bifilar coil layers 261, 262 include N number of turns. In some examples, each of the first and second bifilar coil layers 261, 262 include about 4.5 turns and/or the bifilar coil layers 261, 262 may include a number of turns in a range of about 4 to about 5. In some examples, the one or more bifilar Litz wire 290 may be no. 17 AWG (1.15 mm) type 2 Litz wire, having 105 strands of no. 40 AWG (0.08 mm diameter), or equivalent wire. Utilization of multiple layers, thick Litz wire, bifilar Litz wire, and any combinations thereof, may result in the coil 21 achieving greater Q and/or may result in increases in gap 17 height and/or Z-distance between the coil 21 and a receiver coil.

Figure 16A:
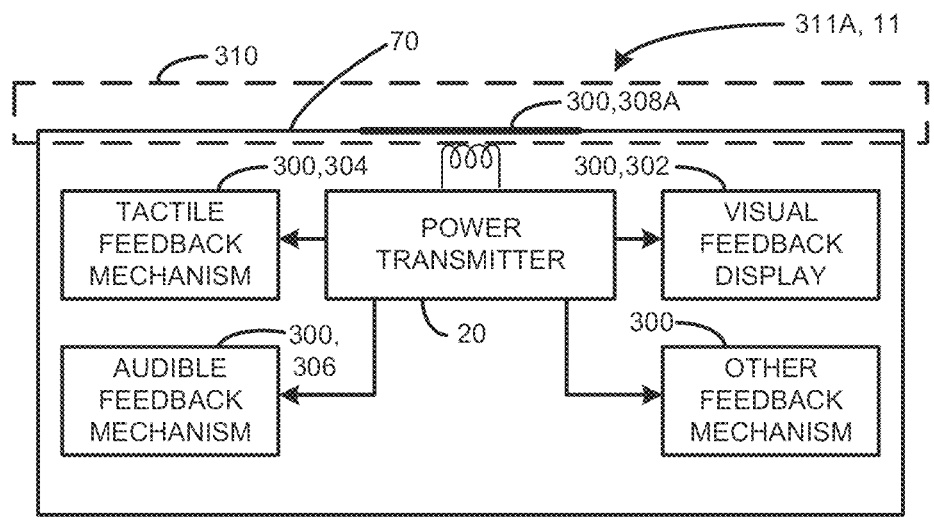
FIG. 16A is an exemplary block diagram for an embodiment of the base station of FIGS. 1-7, 9-15 in accordance with FIGS. 1-7, 9-15 and the present disclosure.

FIG. 16A is a first block diagram 311A for an implementation of the base station 11. As illustrated, the power transmitter 20 is contained within the base station 11. In some examples, the base station 11 includes one or more user feedback mechanisms 300, wherein each of the one or more user feedback mechanisms 300 are configured for aiding a user in aligning a power receiver 30 and/or its associated electronic device 14 with an active area 310 for wireless power transmission via the transmitter coil 21, wherein the power receiver 30 is configured to acquire near field inductive power from the transmitter coil 21. The "active area" 310, as defined herein, refers to any area, volume, and/or space proximate to the interface surface 70 wherein the power transmitter 20 is capable of transmitting near field inductive power to a power receiver 30.

The one or more user feedback mechanisms 300 may include one or more of a visual feedback display 302, a tactile feedback mechanism 304, an audible feedback mechanism 306, a marking 308 on the interface surface 70, any other feedback mechanisms 300, and any combinations thereof. The visual feedback display 302 is configured for visually indicating proper alignment of the power receiver 30 with the active area 310. The visual feedback display 302 may include, but is not limited to including, a visual screen, a light, a light emitting diode (LED), a liquid crystal display (LCD) display, other visual displays, and/or any combinations thereof. The tactile feedback mechanism 304 is configured for tactilely indicating if the power receiver 30 is in proper alignment with the active area 310. The tactile feedback mechanism 304 may include, but is not limited to including, a haptic feedback device, a vibrating device, other tactile feedback mechanisms, and any combinations thereof. The audible feedback device 306 is configured for audibly indicating if the power receiver 30 is in proper alignment with the active area 310. The audio feedback mechanism 306 may include, but is not limited to including, a speaker, a sound generator, a voice generator, an audio circuit, an amplifier, other audible feedback devices, and any combinations thereof.

The marking 308 may be any visual and/or mechanical signifier, indicating where a user of the electronic device 14 should place his/her/their electronic device 14 on the interface surface 70, such that the power transmitter 20 will be in proper alignment with the power receiver 30 of the electronic device 14. Additionally or alternatively, the marking 308 may indicate a location of the active area 310 and/or a proper location within the active area 70. In the exemplary embodiment of the diagram 311A, the marking 308A may be a substantially two-dimensional visual indicator marked on the interface surface 70. The substantially two-dimensional marking 308A may include, but is not limited to including, a printed indicator, a logo, a message indicating a user should place the electronic device 14 upon the marking 308A, any other substantially two-dimensional markings, and any combinations thereof.

Figure 16B:
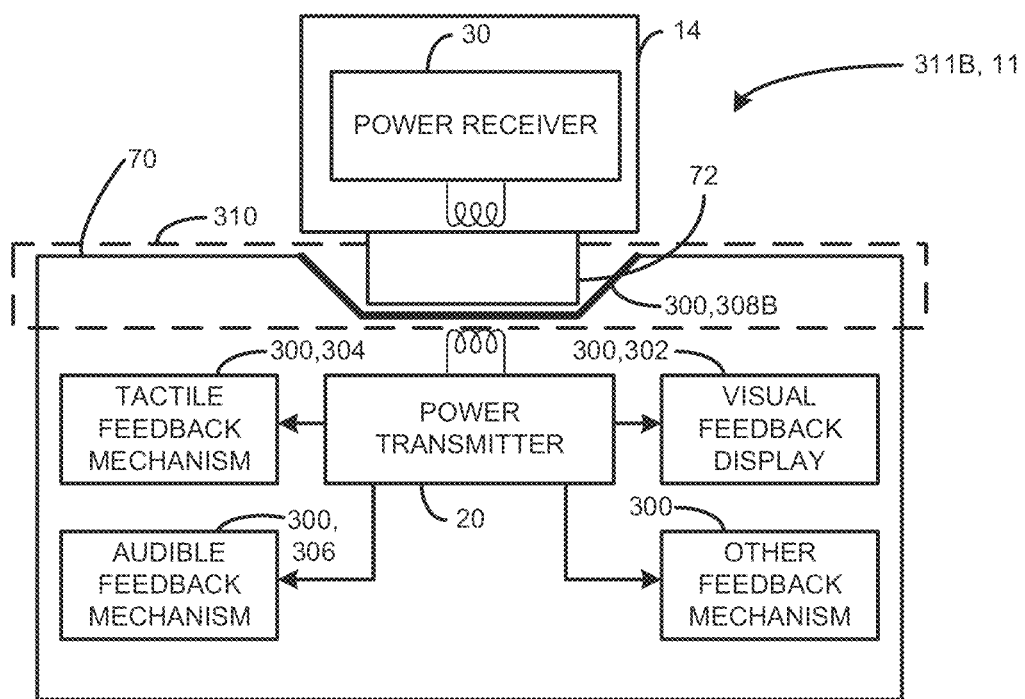
FIG. 16B is an exemplary block diagram for another embodiment of the base station of FIGS. 1-10 in accordance with FIGS. 1-10 and the present disclosure.

In an alternative embodiment in a second schematic block diagram 311B illustrated in FIG. 16B, the marking 308B is a substantially three-dimensional and/or mechanical marking 308B, such as, but not limited to, an indentation and/or notch in the interface surface 70. The three-dimensional marking 308B may be configured to interact with mechanical feature 72 of the electronic device 14. The mechanical feature 72 may be any mechanical feature of the electronic device 14 and/or another connected mechanical feature and/or device associated with the electronic device 14. Accordingly, interaction between the mechanical feature 72 and the three-dimensional marking 308B may be configured to align the power transmitter 20 with the power receiver 30 of the electronic device 14. For example, the mechanical feature 72 may be an external protrusion located relatively proximate to the power receiver 30 of electronic device 14 and the marking 308B is configured to receive the mechanical feature and, by the nature of such receipt, the power transmitter 20 and the power receiver 30 are properly aligned for near-field inductive wireless power transfer. In some such examples, the electronic device 14 is a mobile device, such as a smart phone and/or tablet computing device, and the mechanical feature 72 may be an externally attached grip device configured for gripping the electronic device 14 when in use. In such examples, the marking 308B is configured to receive the grip device mechanical feature 72 and enable proper alignment of the power transmitter 20 and the power receiver 30 for near-field inductive wireless power transfer while the removable mechanical feature 72 remains attached to the electronic device 14.

Figure 17:
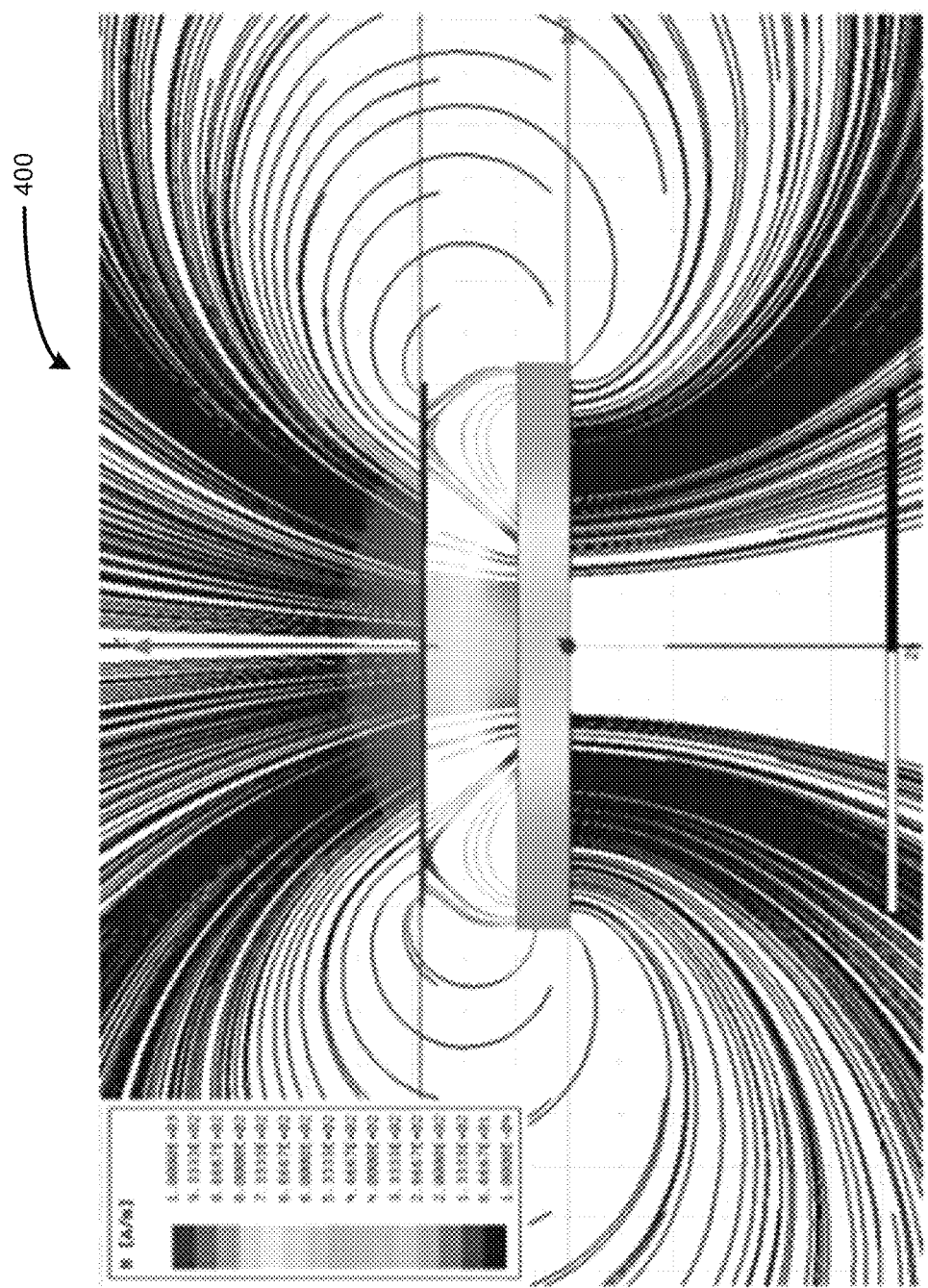
FIG. 17 is a readout of an actual simulation of magnetic fields generated by the coils and/or transmitters illustrated in FIGS. 1-7, 9-16 and disclosed herein.

FIG. 17 is an exemplary, actual, simulation 400 of a magnetic field generated by a transmitter coil 21 and/or its associated power transmitter 20 and captured by an exemplary receiver coil 31 and/or its associated power receiver 30, when the transmitter coil 21 and/or power transmitter 20 are designed, manufactured, and/or implemented according to the teachings of this disclosure. The receiver coil 30 was as a standard Qi™ receiver coil utilized by commercial electronic devices, such as mobile phones, and the receiver coil 30 was modelled with a metal piece behind the coil, wherein the metal piece was used to simulate a battery. The simulation shows that the magnetic field generated by the transmitter coil 20 was captured by the receiver coil 30 at an extended Z-distance of 9 mm. As discussed previously, Qi™ wireless transmitter coils typically operate between coil-to-coil distances of about 3 mm to about 5 mm. The shaped-magnetics of the transmitter coil 21 have shown to favorably reshape a magnetic field so that coil-to-coil coupling can occur at extended Z-distances, wherein the Z-distances are extended about 2 times to about 5 times the distance of standard Qi™ wireless power transmitters. Furthermore, the shaped-magnetics of the present application can extend coupling of present day a Qi™ wireless power transmitter at a Z-distance ranging about 5 mm to about 25 mm. Any of the E-core and/or additional or alternative custom shapes for the shielding 80, may successfully be used to reshape the magnetic field for extended Z-distance coupling by a minimum of a 5% compared to standard present-day power transmitters. In addition, any of the E-core and custom shapes previously discussed, each in conjunction with its relation to a coil to the magnetic has also may further increase z-direction coupling by at least another 5%. An embodiment comprising a structure, the structure comprising a coil and a magnetic material, wherein a gap between the coil and the magnetic material residing at the inner diameter of the coil comprises 2 mm, reshapes the magnetic field so that coupling increases by 5%.

Figure 18A:
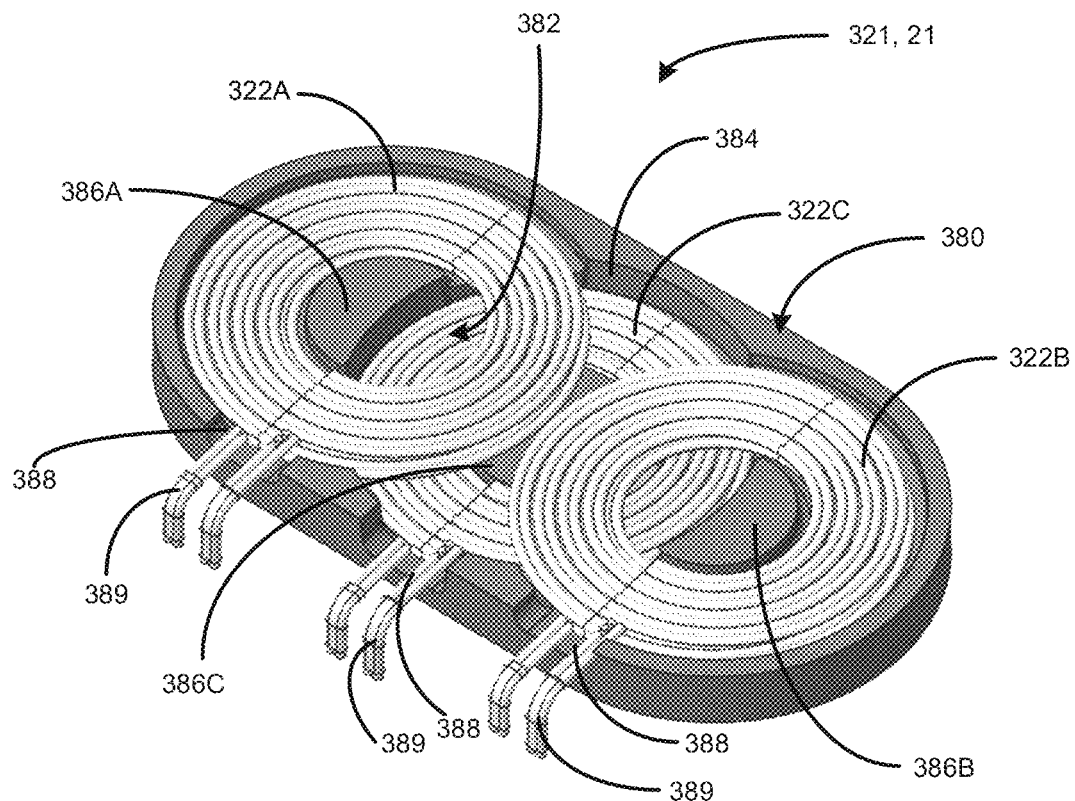
FIG. 18A is a perspective view of an exemplary array of transmitter coils for use with the systems, methods, and apparatus of FIGS. 1-7, 9-16, each of the array of transmitter coils constructed, at least in part, in accordance with coils and/or antennas of FIGS. 1-7, 9-16, in accordance with FIGS. 1-7, 9-16 and the present disclosure.
Figure 18B:
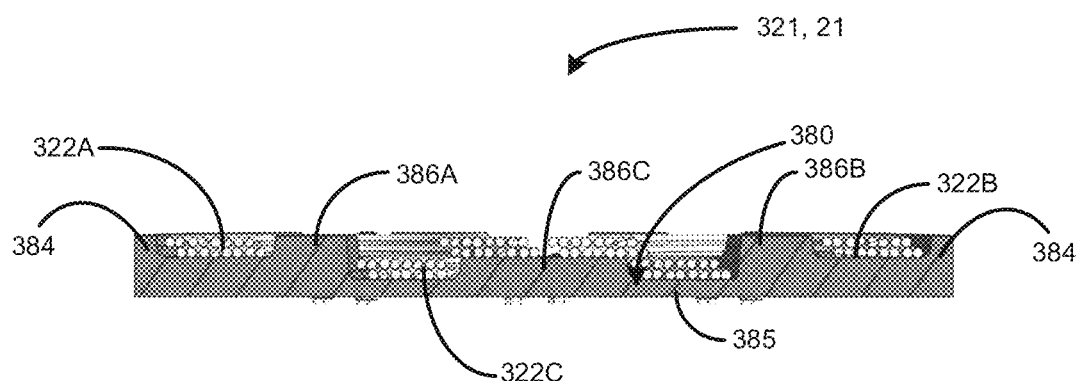
FIG. 18B is a cross sectional side view of the array of transmitter coils of FIG. 18A, in accordance with FIGS. 1-7, 9-16, 18A, and the present disclosure.

FIGS. 18A and 18B illustrate a coil array 321, which may be utilized as the transmitter antenna 21 of one or more of the power transmitters 21, the base station 11, or combinations thereof. As illustrated, the coil array 321 may include two or more transmitter coils 322, which may be constructed in accordance with the specifications of the transmitter antenna 21, as discussed above, regarding dimensions, materials, and combinations thereof, as discussed with reference to FIGS. 12-15. While the exemplary coil array 321 of FIG. 18 shows three transmitter coils 322, the coil array 321 is certainly not limited to having only three transmitter coils 322. Further, as the transmitter coils 322 are illustrated in a substantially linear and/or rectangular layout, they certainly are not limited to being in a substantially linear and/or rectangular layout; examples of other layouts include, but are not limited to including, a substantially square layout, a substantially triangular layout, an asymmetric layout, among other contemplated layouts. Further, while the transmitter coils 322 are illustrated as layered and/or stacked with respect to at least one coil (e.g., first and second transmitter coils 322A, 322B are positioned or stacked above a third transmitter coil 322C); however, it is certainly contemplated that the transmitter coils 322 may have other stacking or layered arrangements or the transmitter coils 322 may be not stacked and substantially co-planar. Further, while the transmitter coils 322 are illustrated as substantially circular and/or ovular in shape, it is contemplated that the transmitter coils 322 may be of any acceptable shape for wireless power transfer including, but not limited to, substantially square in shape, substantially rectangular in shape, substantially elliptically shaped, substantially polygonal in shape, among other contemplated shapes.

As shown in FIG. 18A, the transmitter coils 322A, 322B are adjacent to each other on a first plane. In some embodiments, the outer edge of the transmitter coils 322A, 322B may be touching or almost touching. Almost touching may take into account a small gap. The transmitter coil 322C is in a second plane that is beneath the first plane. The center of the transmitter coil 322C, as shown in FIG. 18A, is positioned between the adjacent transmitter coils 322A, 322B in the second plane. The first plane is different than the second plane. The first plane is above the second plane in the direction of wireless power transmission. It is possible that the first and second plane may be reversed and the second plane is above the second plane in the direction of wireless power transmission. In some embodiments, the center of the transmitter coil 322C may be offset from the position between the adjacent transmitter coils 322A, 322B. For example, in an embodiment, the center of the transmitter coil 322C may be shifted to align with the center of the transmitter coil 322B or 322A.

As illustrated, the coil array 321 includes a shielding 380. The shielding 380 comprises a ferrite core and defines a cavity 382, the cavity 382 configured such that the ferrite core substantially surrounds all but the top faces of each of the transmitter coils 322, similar to the shielding 80 discussed above. As illustrated, the shielding 380 surrounds at least the entire bottom section of the transmitter coils 322 and almost all of the side sections of the transmitter coils 322.

Figure 18C:
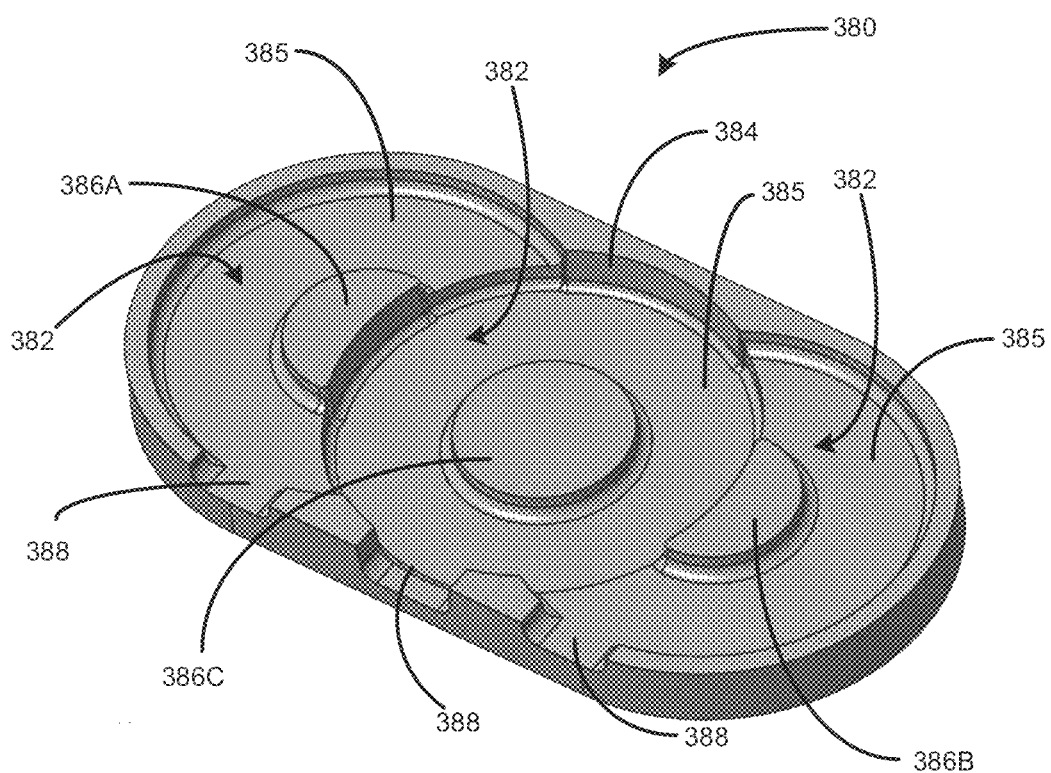
FIG. 18C is a perspective view of a shielding for the exemplary array of transmitter coils of FIGS. 18A and 18B, in accordance with FIGS. 1-7, 9-16, 18A-B, and the present disclosure.

While not necessarily an "E-Core" shielding, the shielding 380, which is illustrated absent the transmitter coils 322 in FIG. 18C, is configured to functionally replicate the shielding 80, but for multiple coils. Thus, while not maintaining the substantially E-shaped cross section, the configuration and location of structural members of the shielding 380 are configured to substantially surround the transmitter coils 322, similarly to how the E-Core shielding 80 substantially surrounds a single transmitter antenna 21. The shielding 380 may include a magnetic cores 386, a magnetic backing 385, and a magnetic wall 384. The magnetic cores 386 are spaced inwardly from the outer edge of the magnetic backing 385 and projects in an upward direction from the top surface of the magnetic backing 385. The magnetic cores 386 and the magnetic ring 384 function to surround the transmitter coils 322 and to direct and focus magnetic fields, hence improving coupling with the receiver coil 31 of the power receiver 30.

As viewed in FIG. 18C, the cavity 382 is configured such that the shielding 380 covers the entire bottom section of the transmitter coils 322 (with, for example, the magnetic backing 385) and the entire side sections of the transmitter coils 322 (with, for example, the magnetic wall 384). The top section of the transmitter coils 322 are not covered. The bottom section of the transmitter coils 322 is the side of the transmitter coils 322 that is opposite of the direction of the primary power transfer to the receiver antenna 31 (e.g., an opposite side to a top face of the coil 322). With a wire wound transmitter coils 322, the side section of the transmitter coils 322 includes the side section of the outer most windings of the transmitter coils 322.

The transmitter coils 322 are positioned above the shielding 380, whose combination of structural bodies, as discussed above, may include the combination of the magnetic cores 386, the magnetic backing 385, and magnetic ring 384. This magnetic shielding combination functions to help direct and concentrate magnetic fields created by transmitter coils 322 and can also limit side effects that would otherwise be caused by magnetic flux passing through nearby metal objects. In some examples, the magnetic ring defines one or more opening(s) 388, in which a connecting wire 389 of each transmitter coils 322 can exit the shielding 380.

In addition to substantially surrounding the outer diameter of the transmitter coils 322, the shielding 380 may also cover portions of the inner areas associated with the transmitter coils 322. That is, as shown, the inner section of the shielding 380 configuration may protrude upward through the middle of each of the transmitter coils 322. In the instant example, the three magnetic cores 386A, 386B, and 386C may have differing shapes based on the layout/configuration of the coil array 321. Accordingly, such differing shapes are each configured to fill a gap between open space between elements of each of the transmitter coils 322, such that an area on the interior of the innermost turn of a transmitter coil 322 is substantially filled with one or more of some of another transmitter coil 322 and a magnetic core 386. Note, that the shape of the magnetic cores 386A-C are merely exemplary and the magnetic cores 386 can be any shape such that they substantially fill a void in the interior of a transmitter coil 322.

Figure 19A:
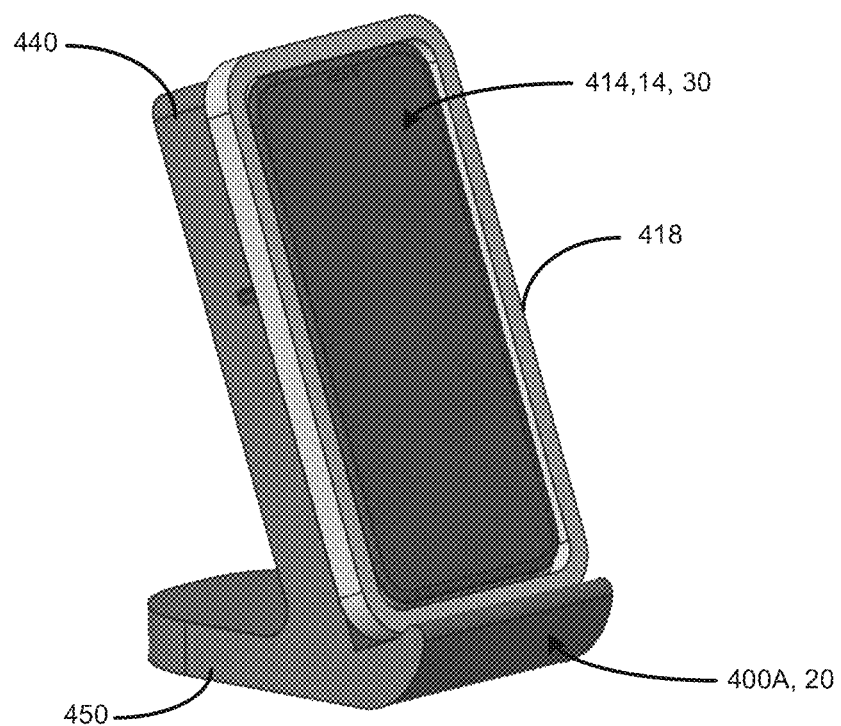
FIG. 19A is a perspective view of an exemplary housing of the systems, methods, and apparatus of FIGS. 1-7, 9-16 and/or operatively associated with the systems, methods, and apparatus of FIGS. 1-7, 9-16, and a mobile device powered and/or charged by the systems, methods, and apparatus of FIGS. 1-7, 9-16, in accordance with FIGS. 1-7, 9-16 and the present disclosure.
Figure 19B:
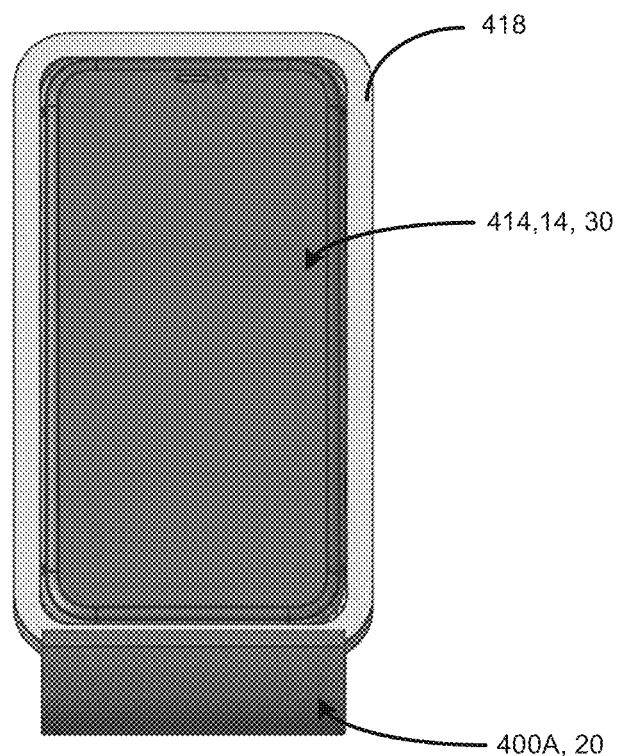
FIG. 19B is a front view of the housing and mobile device of FIG. 19A, in accordance with FIGS. 1-7, 9-16, 18, 19A, and the present disclosure.
Figure 20A:
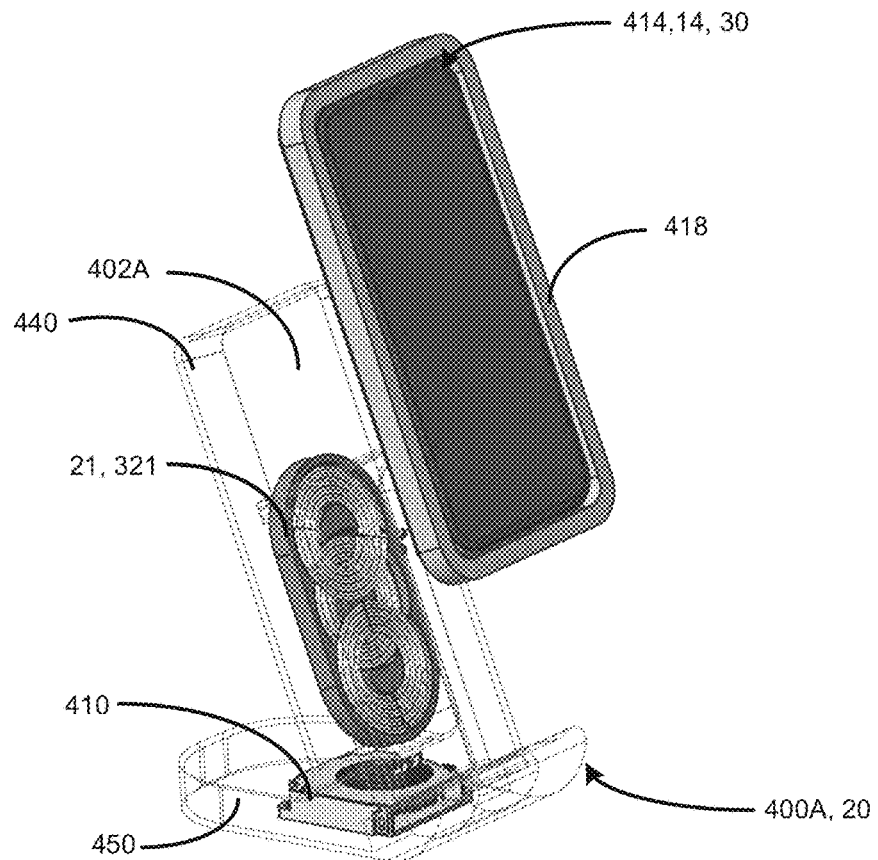
FIG. 20A is a perspective view of the housing and mobile device of FIG. 19, with the housing illustrated as transparent, as to show components located there, in accordance with FIGS. 1-7, 9-16, 18-19, and the present disclosure.
Figure 20B:
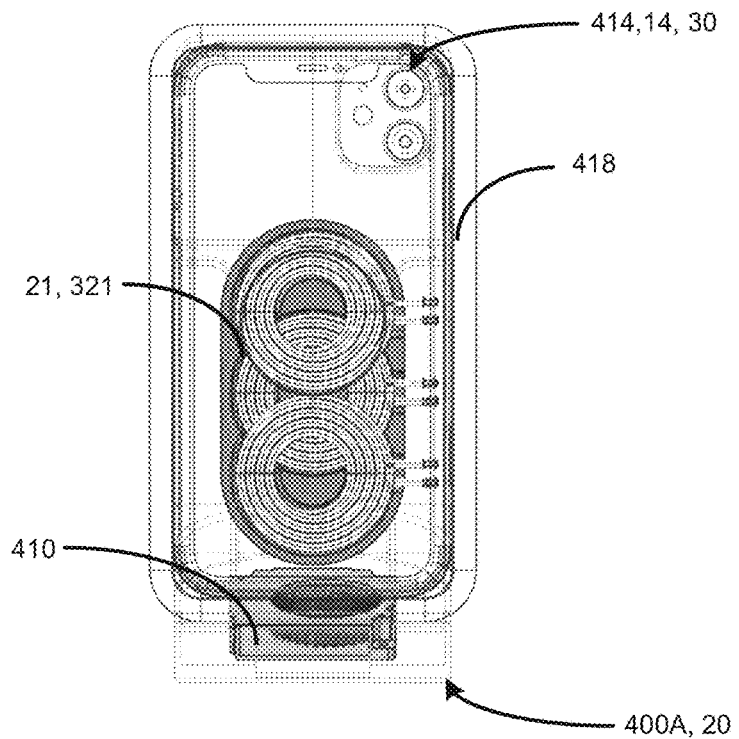
FIG. 20B is a front view of the housing and mobile device of FIGS. 19 and 20A, with the housing and mobile device illustrated as transparent, as to show components located within the housing, in accordance with FIGS. 1-7, 9-16, 18-19, 20A, and the present disclosure.
Figure 21:
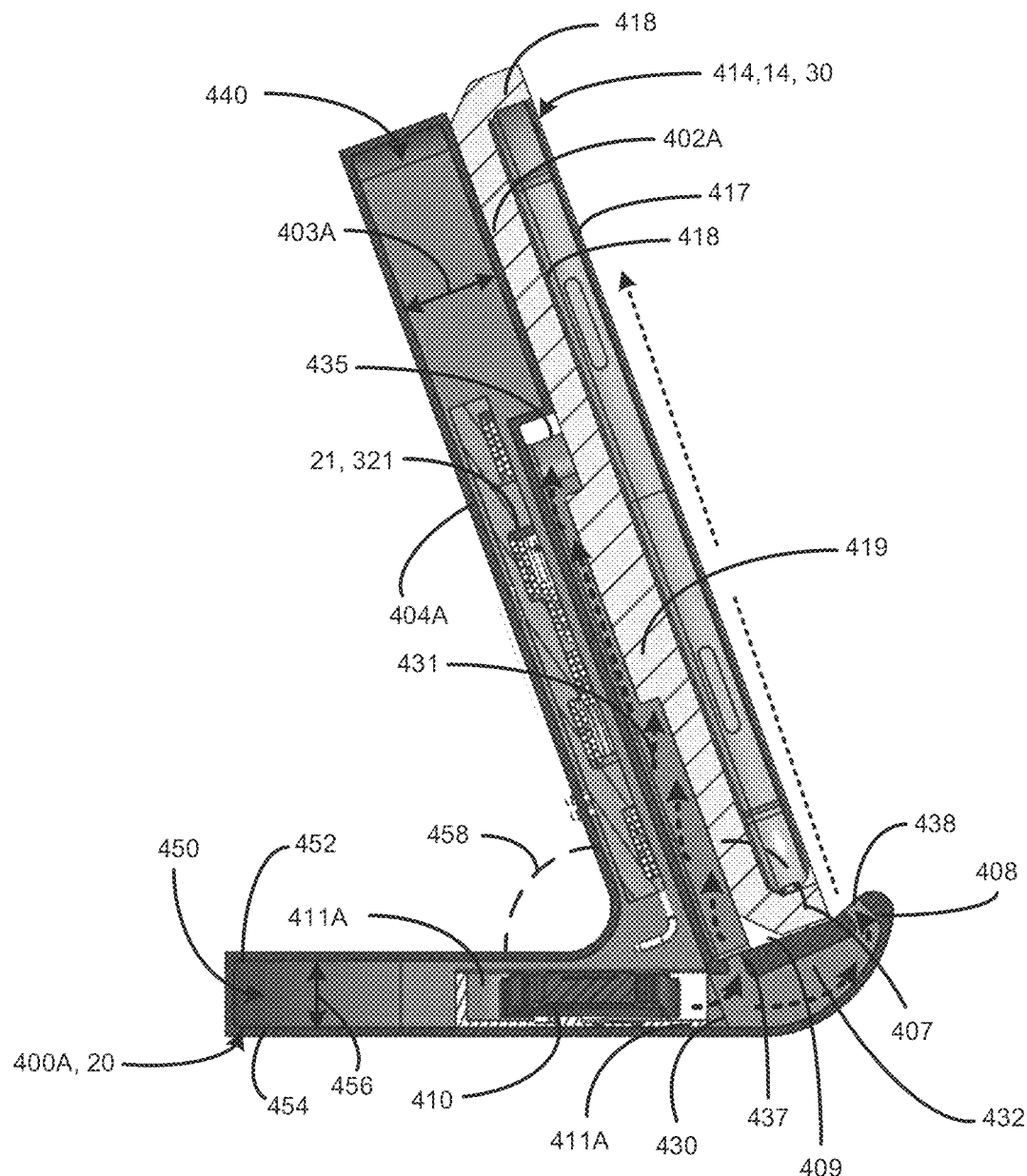
FIG. 21 is a side, cross-sectional view of the housing and mobile device of FIGS. 19-20, in accordance with FIGS. 1-7, 9-16, 18-20, and the present disclosure.

Turning now to FIGS. 19-21, an exemplary housing 400A is illustrated. The power transmitter 20 is housed within the housing 400A and an exemplary mobile device 414 is shown, which may be configured to receive wireless power from the power transmitter 20. Thus, the power receiver 30 may be part of or operatively associated with the mobile device and the mobile device 414 may be the electronic device 14 operatively associated with the power receiver 30. FIG. 19A illustrates a perspective view of the exemplary housing 400A and mobile device 414, while FIG. 19B illustrates the housing 400A and mobile device 414 in a front view, when the mobile device 414 is positioned, relative to the housing 400A, such that the power receiver 30 can receive wireless power signals from the power transmitter 20. In some examples, the mobile device 414 may have a peripheral 418 associated therewith, wherein the peripheral is a physical device attachable to the mobile device 414. Examples of peripherals include, but are not limited to including, cases, grip devices, specialty grip devices, wallets, among other things. In some examples, the power transmitter 20 may be configured to be couplable with the power transmitter 30, for the purposes of wireless power transfer, through both the housing 400 and the peripheral 418, when the mobile device 414 is placed in proper position relative to the housing 400.

FIGS. 20A and 20B present similar perspective and top views, respectively, to those of FIGS. 19A and 19B, but with the housing 440 illustrated as transparent, such that certain inner components of the system 20 may be illustrated. The transmitter antenna 21 and/or the coil array 321 are housed within the housing 440 and the transmitter antenna 21 is not limited to being implemented with the coil array 321 but, rather, may be any transmitter antenna 21 capable of providing wireless power to a receiver system 30 of the mobile device 414 when the mobile device is positioned, relative to the housing 400, for wireless power transfer. As will be discussed in more detail below, the housing may house a fan 410 that is a part of the power transmission system 20, which may be utilized to generate an air flow used for cooling one or more of power transmitter 20 components, the antenna 21, the mobile device 414, the housing 400, and combinations thereof.

As best illustrated in the cross section of the housing 400A in FIG. 21, the fan 410 and/or any other source of airflow may be positioned to communicate with an airflow opening 430 of the housing 400. The airflow opening 430 may be any cavity, cut out, and/or void within the housing 400 that allows airflow to fluidly communicate between a source for airflow (e.g., the fan 410) and one or more airflow channels of the housing, configured for providing airflow for cooling one or more of the housing 400, the mobile device 414, the power transmitter 20, the transmitter antenna 21, or power transmitter 20 components. "Airflow," as defined herein, refers to, at least, any movement of air, including materials, gases, and/or particles mixed therewith, into or out of the housing 400 in a fluid manner. In some examples, airflow may refer to particles, fluids, and/or gaseous bodies flowing from areas of higher pressure to those where pressure is lower. Airflow can be caused by mechanical inducement (e.g., operating a fan and/or an external airflow source) or airflow can be caused by natural sources (e.g., opening an opening to an external, non-vacuum atmosphere). "Fluid communication," as defined herein, refers to a relationship between two or more structures, voids, and/or regions of a mechanical body, in which a fluid (e.g., a gas, a liquid, a plasma, airflow, etc.) can flow into or out of one another, when subject to some force.

In FIG. 21, an exemplary airflow is illustrated as thick dotted lines with arrows illustrating the direction of the airflow. While illustrated as pushing air outward of the airflow opening 430 of the housing 400, it is certainly contemplated that instead of pushing airflow from the airflow opening 430 to the exterior of the housing 400 for cooling one or more of power transmitter 20 components, the antenna 21, the mobile device 414, the housing 400, or combinations thereof, it is certainly contemplated that the airflow may be reversed and pull airflow through the airflow opening 430, to an external source, to pull heat away from the mobile device 414, for cooling one or more of power transmitter 20 components, the antenna 21, the mobile device 414, the housing 400, and combinations thereof.

To allow for such cooling, the housing 400 defines, at least, a forward surface 402A, the airflow opening 430, a first airflow channel 431, a second airflow channel 432 and a protrusion 408. Such structural elements of the housing 400A may be best illustrated in the perspective views of the housing 400A, with the mobile device 414 removed, of FIGS. 22A and 22B. The forward surface 402A is configured for placement of the mobile device 414 for wireless power transfer from the power transmitter 20 to a power receiver 30 of the mobile device 414. For example, the mobile device 414 may rest against the forward surface 402A when positioned, relative to the housing 400, for wireless power transfer. The airflow opening 430 is configured for providing the airflow, as discussed above. As discussed above, the airflow may be provided to the airflow opening via a mechanical device, such as the fan 410. In some such examples, the housing 400 further defines a fan cavity 411A for housing, at least, the fan and the fan cavity 411A is in fluid communication with, at least, the airflow opening 430, for providing at least some of the airflow to the airflow opening.

Figure 22A:
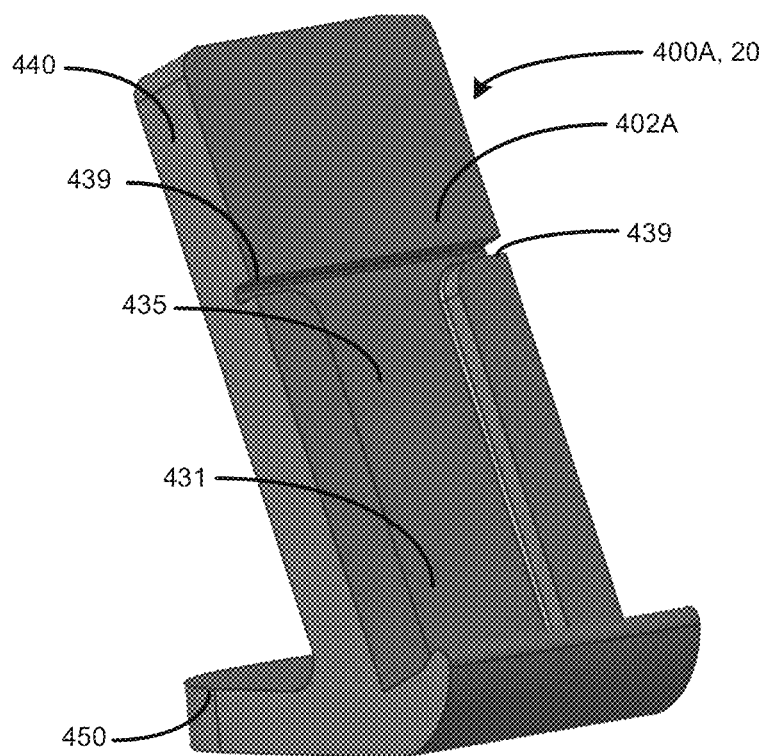
FIG. 22A is a side perspective view of the housing of FIGS. 19-21, without the mobile device, in accordance with FIGS. 1-7, 9-16, 18-20, and the present disclosure.
Figure 22B:
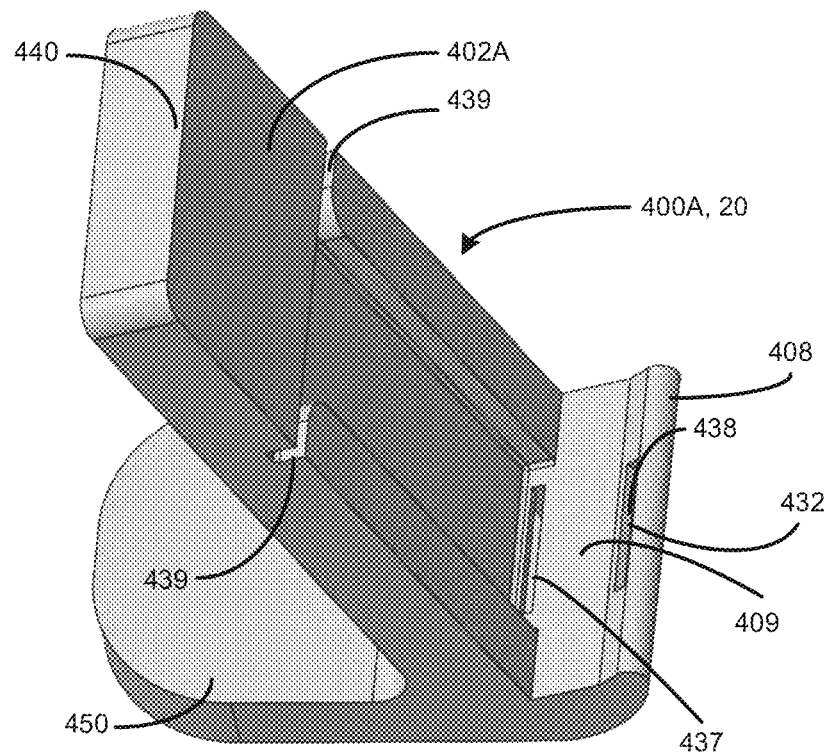
FIG. 22B is another side perspective view of the housing of FIGS. 19-21A, without the mobile device and further illustrating air channel openings, in accordance with FIGS. 1-7, 9-16, 18-22A, and the present disclosure.

The first airflow channel 431 is configured to provide at least some of the airflow, via fluid communication with the airflow opening 430, proximate to one or more of the forward surface 402A and a rear surface 416 of the mobile device 414. In some examples and as best illustrated in the perspective view of the housing 400A of FIGS. 22A and 22B, the first airflow channel 431 may include a first airflow channel cavity 435. The first airflow channel cavity 435 extends, at least in part, about a first thickness 403A, which is defined as a thickness between the forward surface 402A and a back surface 404A of the housing. The first airflow channel cavity 435 allows for airflow provided to/from the first airflow channel 431 to direct heat away from one or more of the mobile device rear surface 416, the antenna 21, the mobile device 414, the housing 400, and combinations thereof. In some examples and as best illustrated in FIG. 22B, the first airflow channel 431 further includes a first channel opening 437, which is in fluid communication with, at least, the airflow opening 430. The first channel opening 437 is configured for providing at least some of the airflow from the airflow opening 430 to one or more of the first airflow channel cavity 435 or the mobile device rear surface 416. In some such examples, the first channel opening 437 is defined as a first opening in a top face 409 of the protrusion 408 and, thus, the protrusion 408 and the opening thereof that defines the first channel opening 437 is in fluid communication with the airflow opening 430.

In some examples, the first airflow channel further includes at least one vent 439 in fluid communication with the first airflow channel cavity 435. As illustrated, the at least one vent 439 is configured to direct airflow to an exterior of the housing 400 and/or the first airflow channel 431 at one or more side of the housing 400; however, the vent(s) 439 are not limited to such placement, so long as the vent(s) 439 remain in fluid communication with the first airflow channel 431 and an environment exterior to the housing 400. Thus, the at least one vent 439 opens to an environment external to the housing 400 and allows one or more of entry or exit, for an external airflow, to the housing 400.

The protrusion 408 extends outward, at least in part, from the forward surface 402A and includes the protrusion top face 409, wherein the protrusion top face 409 forms an angle with the forward face 402A. The angle 407 is less than about 180 degrees and greater than about 0 degrees. In some examples, the angle 407 is configured such that, when the mobile device 414 is placed adjacent to the forward surface 402A, a mobile device front surface 417 is in a proper viewing angle with respect to a user of the mobile device 414.

The second airflow channel 432 is configured to provide at least some of the airflow, via fluid communication with the airflow opening 430, proximate to one or more of the protrusion top face 409, the mobile device front surface 417, or any combinations thereof. In some examples, the second airflow channel 432 includes a second channel opening 438, the second channel opening 438 being in fluid communication with (e.g., not blocking or restricting), at least, the airflow opening 430. The second channel opening 438 is configured to provide at least some of the airflow from the airflow opening 430 to the mobile device front surface 417. In some examples, the second channel opening 437 is defined as an opening in the protrusion top face 409 that is in fluid communication with, at least, the airflow opening 430. In some such examples, the airflow opening 430 may be angled inward towards the forward surface 402A, with respect to another surface of the protrusion top face 409. In such examples, the angled airflow opening 430 is configured to provide the airflow in a directed manner at the mobile device front surface 417.

Returning to FIG. 21, in some examples, the mobile device 414 and/or the associated peripheral 418 may include a protruding mechanical body 419, extending outward in a direction of the rear surface 416 of the mobile device 414. Such an associated peripheral may be one or more of a portion of a case for the mobile device 414, a grip device, a detachable device, an attachment, a case for other peripherals, among other things. In such examples and as illustrated in FIG. 21, the first airflow channel cavity 435 may be configured to mechanically receiver the mechanical body 419 and such receipt of the mechanical body 419, at least in part, aligns the transmitter antenna 21 of the power transmitter 20 with the receiver antenna 31 of the power receiver 30, for the purposes of wireless power transfer.

Referring now to all of FIGS. 19-22, as illustrated, the housing 400A includes and/or defines a housing stand structure 440 and a housing base structure 450. The housing stand structure includes the forward surface 402A and the back surface 404A and extends, at least in part, about the first thickness 403A. The housing base structure includes a top surface 452 and a bottom surface 454, wherein the top surface 452 and the bottom surface 454 are separated by a housing base structure thickness 456. The housing stand structure 440 and the housing base structure 450 are respectively positioned such that a stand angle 458 is formed, at least in part by a portion of back surface 404A and a portion of the top surface 452. The angle 458 is greater than about 0 degrees and less than about 180 degrees. In some examples, the angle 458 is configured such that, when the mobile device 414 is placed adjacent to the forward surface 402A, the mobile device front surface 416 is in a proper viewing angle, with respect to a user of the mobile device.

While not illustrated in the exemplary drawings, it is certainly contemplated that any electrical components of the power transmitter 20 may additionally be housed within the housing 400, such as, but not limited to, components of the control and communications system 26, components of the power conditioning system 40, components of the sensing system 50, and/or any other components of or associated with the power transmitter 20.

Figure 23A:
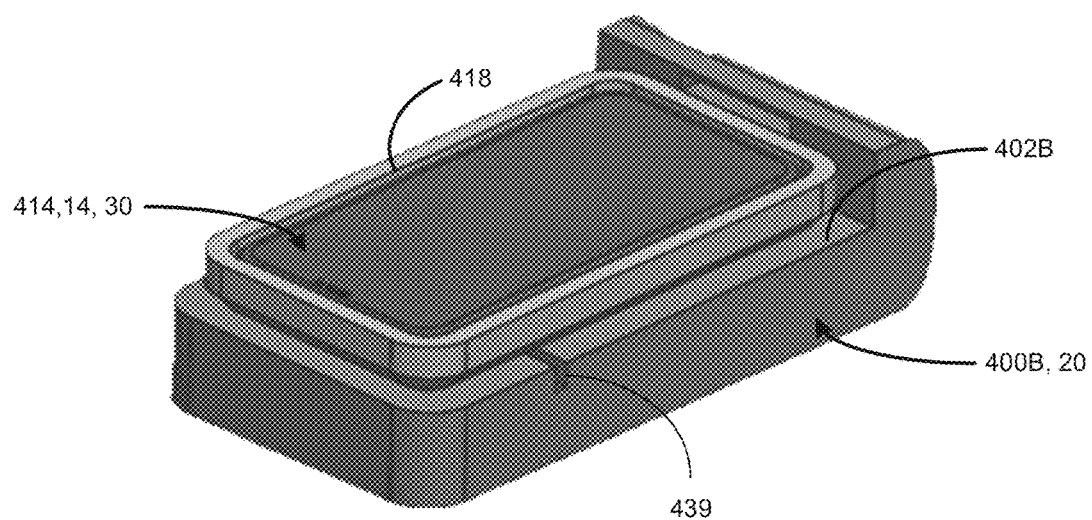
FIG. 23A is a perspective view of another exemplary housing of the systems, methods, and apparatus of FIGS. 1-7, 9-16 and/or operatively associated with the systems, methods, and apparatus of FIGS. 1-7, 9-16, and a mobile device powered and/or charged by the systems, methods, and apparatus of FIGS. 1-7, 9-16, the housing including similar features to the housing of FIGS. 19-22, in accordance with FIGS. 1-7, 9-16, 18-22, and the present disclosure.
Figure 23B:
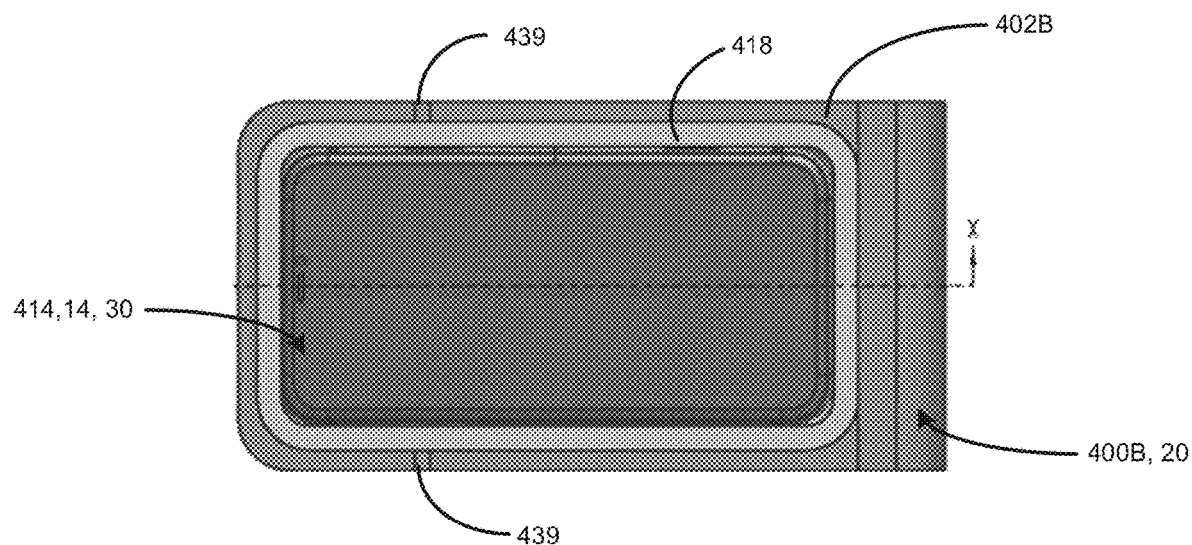
FIG. 23B is a top view of the housing and mobile device of FIG. 23A, in accordance with FIGS. 1-7, 9-16, 18-23A, and the present disclosure.

Turning now to FIGS. 23A and 23B, another exemplary housing 400B is illustrated. The power transmitter 20 is housed within the housing 400B and the mobile device 414 is shown, which may be configured to receive wireless power from the power transmitter 20. Thus, the power receiver 30 may be part of or operatively associated with the mobile device and the mobile device 414 may be the electronic device 14 operatively associated with the power receiver 30. FIG. 23A illustrates a perspective view of the housing 400B and the mobile device 414, while FIG. 23B illustrates the housing 400B and mobile device 414 in a top view, when the mobile device 414 is positioned, relative to the housing 400B, such that the power receiver 30 can receive wireless power signals from the power transmitter 20. As with the examples of FIGS. 19-22, the mobile device 414 may have the peripheral 418 associated therewith. One or more of the mobile device 414, the peripheral 418, or components thereof may be similar and/or equivalent elements that were included and described with reference to the housing 400A of FIGS. 19-22.

As illustrated in one or more of FIGS. 23A, 23B and/or the cross-sectional views of FIGS. 24A and 24B, the exemplary housing 400B includes many similar and/or equivalent elements that were included and described with reference to the housing of FIG. 400A of FIGS. 19-22. Such elements may include, but may not be limited to including, the fan 410, the airflow opening 430, the first airflow channel 431, the first airflow channel cavity 435, the first airflow channel opening 437, the one or more vent 439, the protrusion 408, the protrusion top face 409, the second airflow channel 432, and the second airflow channel opening 438. Accordingly, such elements in FIGS. 23-24 include the same reference numbers as their associated analogues of FIGS. 19-22 and share the written description, above.

In contrast to the housing 400A, the housing 400B does not include separate base and stand structures, but rather is primarily defined as a pad or flat-lying body, save for the protrusion 408, upon which the mobile device 414 may rest when the system 10 performs wireless power transfer. To that end, the housing 400B defines a top surface 402B, upon which the mobile device is placed for wireless power transfer and a bottom surface 404B. A housing thickness 403B, which is defined as a thickness between the top surface 402B and the bottom surface 404B. To that end, the first airflow channel cavity 435 extends, at least in part, along the housing thickness 403B.

Figure 24A:
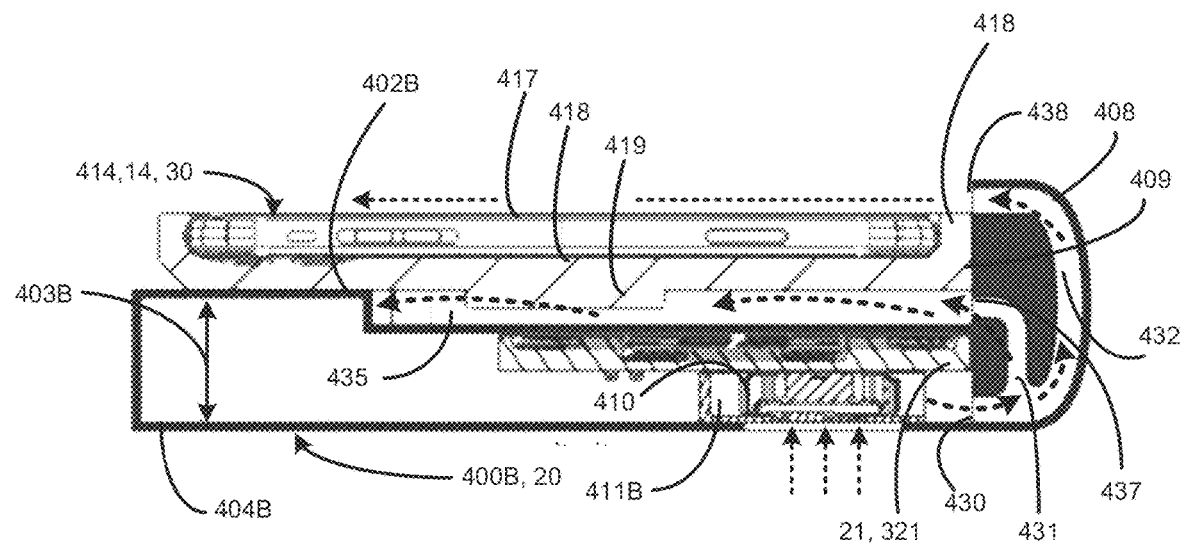
FIG. 24A is a side, cross-sectional view of the housing and mobile device of FIG. 23, in accordance with FIGS. 1-7, 9-16, 18-23, and the present disclosure.

As best illustrated in FIG. 24A, the housing 400B may include a fan cavity 411B, when the fan 410 is included in the power transmitter 20. The fan cavity 411B is in fluid communication with the airflow opening 430 and provides airflow to and/or from the airflow opening 430 and/or downstream/upstream fluidly communicable elements of the housing 400, the power transmitter 20, and/or the mobile device 414.

Figure 24B:
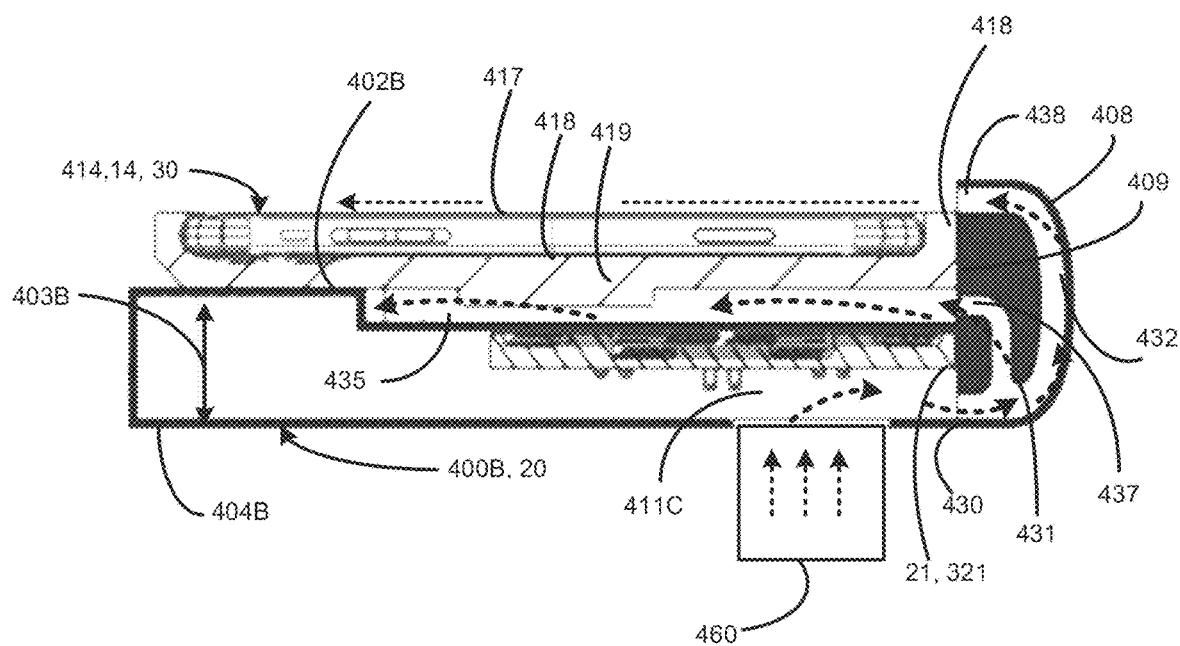
FIG. 24B is a side, cross-sectional view of the housing and mobile device of FIGS. 23 and 24A, with an external airflow source, in accordance with FIGS. 1-7, 9-16, 18-24A, and the present disclosure.

Alternatively, as illustrated in FIG. 24B, the fan cavity 411B may be replaced with an external airflow source input cavity 411C. The external airflow source input cavity 411C is in fluid communication with the airflow opening 430 and provides fluid communication between the airflow opening 430 and an external airflow source 460. Thus, the external airflow source input cavity 411C may enable fluid communication between the airflow opening 430 and the external airflow source 460, wherein the external airflow source provides at least some of the airflow to the airflow opening 430. To that end, the external airflow source 460 may be any external airflow source, such as, but not limited to, an external fan, an external ventilation system, an external air conditioning unit, an external suction device, and/or any other external device and/or source configured for providing airflow to and/or from the airflow opening 430. In some examples wherein the input power source 12 to the power transmitter 20B is a vehicular power source (e.g., the examples of FIGS. 6-10), the external airflow source 460 may be an airflow source of or operatively associated with the vehicle 15.

The housings 400 disclosed herein may provide for greater cooling of the mobile device 414 and/or the power transmitter 20 during wireless power transfer, when compared to legacy thermal solutions for wireless power transfer and/or legacy power transmitter designs. Such enhanced cooling may be enabled by the inclusion of multiple airflow channels, such as the first airflow channel 431 and the second airflow channel 432, which are configured for providing airflow to multiple faces of a mobile device 414, simultaneously. Such enhanced cooling of one or both of the power transmitter 20 or the mobile device 414 may enable greater heat mitigation that allows the power transmitter 20 to safely provide greater power levels to a power receiver 30, in comparison to legacy wireless power transmitters. Further, the housings 400, disclosed herein, may provide proper wireless power transmission, without thermal issues, in environments with elevated ambient temperatures, such as when the housing 400 is in direct sun light, when the housing 400 is located within a vehicle, when the housing 400 is proximate to machinery and/or electronics that cause elevated heat, among other environments. Additionally or alternatively, such enhanced cooling of one or both of the power transmitter 20 or the mobile device 414 and/or the extended power levels and/or profiled enabled by said cooling may allow for greater Z-distances and/or separation gaps between the power transmitter 20 and the power receiver 30, in comparison to legacy wireless power transfer systems.

As is discussed above, the transmitter coils 21, power transmitters 20, and/or base stations 11, disclosed herein, may achieve great advancements in Z-distance and/or gap 17 height, when compared to legacy, low-frequency (e.g., in a range of about 87 kHz to about 205 kHz) transmission coils, power transmitters, and/or base stations. To that end, an extended Z-distance not only expands a linear distance, within which a receiver may be placed and properly coupled with a transmitter, but an extended Z-distance expands a three-dimensional charging and/or operational volume ("charge volume"), within which a receiver may receive wireless power signals from a transmitter. For the following example, the discussion fixes lateral spatial freedom (X and Y distances) for the receiver coil, positioned relative to the transmitter coil, as a control variable. Accordingly, for discussion purposes only, one assumes that the X and Y distances for the base stations 11, power transmitters 20, and/or transmitter coils 21 are substantially similar to the X and Y distances for the legacy system(s). However, it is certainly contemplated that the inventions disclosed herein may increase one or both of the X-distance and Y-distance. Furthermore, while the instant example uses the exemplary range of 8-10 mm for the Z-distance of the base stations 11, power transmitters 20, and/or transmitter coils 21, it is certainly contemplated and experimental results have shown that the base stations 11, power transmitters 20, and/or transmitter coils 21 are certainly capable of achieving Z-distances having a greater length than about 10 mm, such as, but not limited to, up to 15 mm and/or up to 30 mm. Accordingly, the following table is merely exemplary and for illustration that the expanded Z-distances, achieved by the base stations 11, power transmitters 20, and/or transmitter coils 21, have noticeable, useful, and beneficial impact on a charge volume associated with one or more of the base stations 11, power transmitters 20, and/or transmitter coils 21.

| Spatial Freedom Comparison | | | | | |
|---|---|---|---|---|---|
| | X-dist | Y-dist | Z-dist (min) | Z-dist (max) | Charge Vol. (min) | Charge Vol. (max) |
| Legacy | 5 mm | 5 mm | 3 mm | 5 mm | 75 mm$^3$ | 125 mm$^3$ |
| 11, 20, 21 (8-10 mm. ver.) | 5 mm | 5 mm | 8 mm | 10 mm | 200 mm$^3$ | 250 mm$^3$ |
| 11, 20, 21 (15 mm. ver.) | 5 mm | 5 mm | 10 mm | 15 mm | 250 mm$^3$ | 375 mm$^3$ |
| 11, 20, 21 (30 mm. ver.) | 5 mm | 5 mm | 15 mm | 30 mm | 375 mm$^3$ | 750 mm$^3$ |

Thus, by utilizing the base stations 11, power transmitters 20, and/or transmitter coils 21, the effective charge volume may increase by more than 100 percent, when compared to legacy, low-frequency wireless power transmitters. Accordingly, the base stations 11, power transmitters 20, and/or transmitter coils 21 may achieve large Z-distances, gap heights, and/or charge volumes that were not possible with legacy low frequency, but thought only possible in lower power, high frequency (e.g., above about 2 Mhz) wireless power transfer systems.

FIG. 25 is an example block diagram for a method 1200 for designing the power transmitter 20. The method 1200 includes designing one or both of the housing 400 and/or cooling structures associated therewith, as illustrated in block 1205. The method 1200 further includes designing and/or selecting the transmitter coil 21 for the power transmitter 20, as illustrated in block 1210. The method 1200 includes tuning the power transmitter 20, as illustrated in block 1220. Such tuning may be utilized for, but not limited to being utilized for, impedance matching.

The method 1200 further includes designing the power conditioning system 40 for the power transmitter 20, as illustrated in block 1230. The power conditioning system 40 may be designed with any of a plurality of power output characteristic considerations, such as, but not limited to, power transfer efficiency, maximizing a transmission gap (e.g., the gap 17), increasing output voltage to a receiver, mitigating power losses during wireless power transfer, increasing power output without degrading fidelity for data communications, optimizing power output for multiple coils receiving power from a common circuit and/or amplifier, among other contemplated power output characteristic considerations. Further, at block 1240, the method 1200 may determine and optimize a connection, and any associated connection components, to configure and/or optimize a connection between the input power source 12 and the power conditioning system 40 of block 1230. Such determining, configuring, and/or optimizing may include selecting and implementing protection mechanisms and/or apparatus, selecting and/or implementing voltage protection mechanisms, among other things.

The method 1200 further includes designing and/or programing the control and communications system 26 of the power transmitter 20, as illustrated in block 1250. Components of such designs include, but are not limited to including, the sensing system 50, the driver 41, the transmission controller 28, the memory 27, the communications system 29, the thermal sensing system 52, the object sensing system 54, the receiver sensing system 56, the electrical sensor(s) 57, the other sensor(s) 58, in whole or in part and, optionally, including any components thereof.

FIG. 26 is an example block diagram for a method 2200 for manufacturing the power transmitter 20. The method 2200 includes forming, manufacturing, or otherwise constructing one or both of the housing 400 and/or cooling structures associated therewith, as illustrated in block 2205. The method 2200 further includes manufacturing and/or selecting the transmitter coil 21 for the power transmitter 20, as illustrated in block 2210. The method 2200 includes tuning the power transmitter 20, as illustrated in block 2220. Such tuning may be utilized for, but not limited to being utilized for, impedance matching.

The method 2200 further includes manufacturing the power conditioning system 40 for the power transmitter 20, as illustrated in block 2230. The power conditioning system 40 may be designed and/or manufactured with any of a plurality of power output characteristic considerations, such as, but not limited to, power transfer efficiency, maximizing a transmission gap (e.g., the gap 17), increasing output voltage to a receiver, mitigating power losses during wireless power transfer, increasing power output without degrading fidelity for data communications, optimizing power output for multiple coils receiving power from a common circuit and/or amplifier, among other contemplated power output characteristic considerations. Further, at block 2240, the method 2200 may include connecting and/or optimizing a connection, and any associated connection components, to configure and/or optimize a connection between the input power source 12 and the power conditioning system 40 of block 2230. Such determining, manufacturing, configuring, and/or optimizing may include selecting and implementing protection mechanisms and/or apparatus, selecting and/or implementing voltage protection mechanisms, among other things.

The method 2200 further includes designing and/or programing the control and communications system 26 of the power transmitter 20, as illustrated in block 2250. Components of such designs include, but are not limited to including, the sensing system 50, the driver 41, the transmission controller 28, the memory 27, the communications system 29, the thermal sensing system 52, the object sensing system 54, the receiver sensing system 56, the electrical sensor(s) 57, the other sensor(s) 58, in whole or in part and, optionally, including any components thereof.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A power transmitter for wireless power transfer to a mobile device having a power receiver couplable with the power transmitter, the mobile device defining, at least, a mobile device front surface and a mobile device rear surface, the power transmitter comprising:
    a control and communications unit;
    an inverter circuit configured to receive input power and convert the input power to a power signal;
    a transmitter antenna including:
        at least one coil structure configured to transmit the power signal to the power receiver, the at least one coil structure comprising at least one layer of Litz wire, wherein the at least one coil structure has a top surface, a bottom surface, and a side surface, and
        a shielding structure comprising a ferrite material and having a cavity, the cavity configured such that the ferrite material substantially surrounds at least a portion of the bottom surface of the at least one coil structure and at least a portion of the side surface of the at least one coil structure; and
    a housing configured for housing, at least, the transmitter antenna, the housing defining
        a forward surface, configured for placement of the mobile device for wireless power transfer,
        an airflow opening configured to provide an airflow,
        a first airflow channel configured to provide at least some of the airflow, via fluid communication with the airflow opening, proximate to one or more of the forward surface or the mobile device rear surface,
        a protrusion extending outward, at least in part, from the forward surface, the protrusion having a protrusion top face, the protrusion top face forming an angle with the forward surface, the angle being less than about 180 degrees and greater than about 0 degrees, and
        a second airflow channel configured to provide at least some of the airflow, via fluid communication with the airflow opening, proximate to one or more of the protrusion top face, the mobile device front surface, or any combinations thereof
    wherein the forward surface of the housing defines a first plane and the first airflow channel defines a second plane, the first and second planes staggered such that the first and second planes are offset from one another, the first plane having a first height relative to the top surface of the at least one coil structure and the second plane having a second height relative to the top surface of the at least one coil structure, wherein the first height is greater than the second height by a gap distance in a range of 8 millimeters (mm) to 10 mm, wherein the at least one coil structure is positioned below the first and second planes, and wherein the housing is configured such that, when the mobile device is placed on the forward surface, the mobile device sits above the second plane such that the power receiver is separated from the at least one coil structure by a separation distance that is no less than the gap distance between the first height and the second height and the power transmitter is capable of delivering wireless power signals to the power receiver.

2. The power transmitter of claim 1, further comprising a fan configured to provide at least some of the airflow to the airflow opening, and wherein the housing further defines a fan cavity configured to house, at least, the fan and the fan cavity is in fluid communication with, at least, the airflow opening, to provide the at least some of the airflow to the airflow opening.

3. The power transmitter of claim 1, wherein the housing further defines a back surface, wherein a thickness for the housing is defined between the forward surface and the back surface, and wherein the first airflow channel includes a first airflow channel cavity, the first airflow channel cavity being a cavity extending, at least in part, about the thickness.

4. The power transmitter of claim 3, wherein the first airflow channel further includes a first channel opening, the first channel opening in fluid communication with, at least, the airflow opening, the first channel opening configured to provide at least some of the airflow from the airflow opening to one or more of the first airflow channel cavity or the mobile device rear surface.

5. The power transmitter of claim 4, wherein the first channel opening is defined as a first protrusion opening in the protrusion top face, the first protrusion opening in fluid communication with, at least, the airflow opening.

6. The power transmitter of claim 3, wherein the first airflow channel further includes at least one vent in fluid communication with the first airflow channel cavity, the at least one vent configured to mitigate heat from the mobile device rear surface.

7. The power transmitter of claim 6, wherein the at least one vent opens to an environment external to the housing and is configured to facilitate one or more of entry or exit, for an external airflow, to the housing.

8. The power transmitter of claim 3, wherein the first airflow channel cavity is configured to mechanically receive a mechanical body associated with the mobile device, wherein receipt of the mechanical body, at least in part, aligns the transmitter antenna with a receiver antenna of the mobile device, for the purposes of wireless power transfer, and wherein the mechanical body is one or more of a mechanical feature of the mobile device, a peripheral associated with the mobile device, a removable feature associated with the mobile device, or any combinations thereof.

9. The power transmitter of claim 1, wherein the second airflow channel includes a second channel opening, the second channel opening in fluid communication with, at least, the airflow opening, the second channel opening configured to provide at least some of the airflow from the airflow opening to the mobile device front surface.

10. The power transmitter of claim 1, wherein the housing further defines a housing base structure and a housing stand structure, wherein the housing stand structure includes the forward surface and a back surface, the forward surface and back surface being separated by a housing stand structure thickness, wherein the housing base structure includes a top surface and a bottom surface, the top surface and the bottom surface being separated by a housing base structure thickness, wherein the housing stand structure and the housing base structure are respectively positioned such that an angle is formed, at least in part, by a first portion of the back surface and a second portion of the top surface, and wherein the angle is greater than about 0 degrees and less than about 180 degrees.

11. The power transmitter of claim 10, wherein the angle is configured such that, when the mobile device is placed adjacent to the forward surface, the mobile device front surface is in a proper viewing angle with respect to a user of the mobile device.

12. A power transmitter for wireless power transfer to a mobile device having a power receiver couplable with the power transmitter, the mobile device defining, at least, a mobile device front surface and a mobile device rear surface, the power transmitter comprising:

a control and communications unit;

an inverter circuit configured to receive input power and convert the input power to a power signal;

a transmitter antenna including:
at least one coil structure configured to transmit the power signal to the power receiver, the at least one coil structure comprising at least one layer of Litz wire, wherein the at least one coil structure has a top surface, a bottom surface, and a side surface, and a shielding structure comprising a ferrite material and having a cavity, the cavity configured such that the ferrite material substantially surrounds at least a portion of the bottom surface of the at least one coil structure and at least a portion of the side surface of the at least one coil structure; and a housing configured for housing, at least, the transmitter antenna, the housing defining:
a top surface, upon which the mobile device is placed for wireless power transfer, a bottom surface, wherein a housing thickness is, at least in part, defined between the top surface and the bottom surface, an airflow opening, a first airflow channel configured to provide airflow, via the airflow opening, proximate to one or more of the top surface of the housing, the mobile device rear surface, or combinations thereof, a protrusion extending outward, at least in part, from the top surface, the protrusion having a protrusion side face the protrusion side face forming an angle with the top surface of the housing, the angle being less than about 180 degrees and greater than about 0 degrees, and a second airflow channel configured to provide the airflow, via the airflow opening, proximate to one or more of the protrusion side face, the mobile device top surface, or any combinations thereof, wherein the top surface of the housing defines a first plane and the first airflow channel defines a second plane, the first and second planes staggered such that the first and second planes are offset from one another, the first plane having a first height relative to the top surface of the at least one coil structure and the second plane having a second height relative to the top surface of the at least one coil structure, wherein the first height is greater than the second height by a gap distance in a range of 8 millimeters (mm) to 10 mm, wherein the at least one coil structure is positioned below the first and second planes, and wherein the housing is configured such that, when the mobile device is placed on the top surface of the housing, the mobile device sits above the second plane such that the power receiver is separated from the at least one coil structure by a separation distance that is no less than the gap distance between the first height and the second height and the power transmitter is capable of delivering wireless power signals to the power receiver.

13. The power transmitter of claim 12, wherein the airflow opening is configured for fluid communication with an external airflow source, the external airflow source providing at least some of the airflow to the airflow opening.

14. The power transmitter of claim 13, wherein the external airflow source is an airflow source operatively associated with a vehicle.

15. The power transmitter of claim 12, further comprising a fan configured for providing at least some of the airflow to the airflow opening, and wherein the housing is further defining a fan cavity for housing, at least, the fan and the fan cavity is in fluid communication with, at least, the airflow opening, for providing the at least some of the airflow to the airflow opening.

16. The power transmitter of claim 12, wherein the first airflow channel includes a first airflow channel cavity, the first airflow cavity being a cavity extending, at least in part, along the housing thickness, from the top surface and towards the bottom surface.

17. The power transmitter of claim 15, wherein the first airflow channel further includes a first channel opening, the first channel opening in fluid communication with, at least, the airflow opening, the first channel opening providing at least some of the airflow from the airflow opening to one or more of the first airflow channel cavity, the mobile device rear surface, or combinations thereof.

18. The power transmitter of claim 16, wherein the first channel opening is defined as a first protrusion opening in the protrusion side face, the first protrusion opening in fluid communication with, at least, the airflow opening.

19. A power transmitter for wireless power transfer to a mobile device having a power receiver couplable with the power transmitter, the mobile device defining, at least, a mobile device front surface and a mobile device rear surface, the power transmitter comprising:

a control and communications unit;
an inverter circuit configured to receive input power and convert the input power to a power signal;
a transmitter antenna including
a transmitter coil array structure including a top surface and two or more transmitter coils, the transmitter coil array structure configured to transmit the power signal to the power receiver, each of the two or more transmitter coils comprising at least one layer of Litz wire, wherein the transmitter coil array structure has the top surface, a bottom surface, and a side surface, and
a shielding structure comprising a ferrite material and having a cavity, the cavity configured such that the ferrite material substantially surrounds at least a portion of the bottom surface of the transmitter coil array structure and at least a portion of the side surface of the transmitter coil array structure; and
a housing configured for housing, at least, the transmitter antenna, the housing defining
a top surface, upon which the mobile device is placed for wireless power transfer,
a bottom surface, wherein a housing thickness is, at least in part, defined between the top surface and the bottom surface,
an airflow opening,
a first airflow channel configured to provide airflow, via the airflow opening, proximate to one or more of the top surface of the housing, the mobile device rear surface, or combinations thereof,
a protrusion extending outward, at least in part, from the top surface, the protrusion having a protrusion side face the protrusion side face forming an angle with the top surface of the housing, the angle being less than about 180 degrees and greater than about 0 degrees, and
a second airflow channel configured to provide the airflow, via the airflow opening, proximate to one or more of the protrusion side face, the mobile device top surface, or any combinations thereof,
wherein the top surface of the housing defines a first plane and the first airflow channel defines a second plane, the first and second planes staggered such that the first and second planes are offset from one another, the first plane having a first height relative to the top surface of the transmitter coil array structure and the second plane having a second height relative to the top surface of the transmitter coil array structure, wherein the first height is greater than the second height by a gap distance in a range of 8 millimeters (mm) to 10 mm,
wherein the transmitter coil array structure is positioned below the first and second planes, and
wherein the housing is configured such that, when the mobile device is placed on the top surface of the housing, the mobile device sits above the second plane such that the power receiver is separated from the transmitter coil array structure by a separation distance that is no less than the gap distance between the first height and the second height and the power transmitter is capable of delivering wireless power signals to the power receiver.

20. The power transmitter of claim 19, wherein the ferrite material includes an exterior wall for surrounding the exterior diameters of each of the two or more transmitter coils and one or more ferrite inner cores occupying space in between Litz wire of the two or more coils within one or more interior diameters of each of the two or more transmitter coils.

* * * * *